(12) United States Patent
Greene et al.

(10) Patent No.: US 7,659,157 B2
(45) Date of Patent: Feb. 9, 2010

(54) DUAL METAL GATE FINFETS WITH SINGLE OR DUAL HIGH-K GATE DIELECTRIC

(75) Inventors: Brian J. Greene, Wappingers Falls, NY (US); Mahender Kumar, Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 3 days.

(21) Appl. No.: 11/860,840

(22) Filed: Sep. 25, 2007

(65) Prior Publication Data
US 2009/0078997 A1    Mar. 26, 2009

(51) Int. Cl.
*H01L 21/8238* (2006.01)
*H01L 21/8222* (2006.01)

(52) U.S. Cl. .......... 438/199; 438/157; 438/213; 438/283; 438/313; 438/322; 438/592; 257/E21.242; 257/E21.63; 257/E21.631; 257/E21.632; 257/E21.703

(58) Field of Classification Search .......... 438/199, 438/157, 313, 322, 213, 592; 257/283, E21.242, 257/E21.703, E21.63, E21.631, E21.632
See application file for complete search history.

(56) References Cited
U.S. PATENT DOCUMENTS

2007/0128858 A1*  6/2007  Haukka et al. .......... 438/656
2009/0065870 A1*  3/2009  Li et al. .......... 257/368

* cited by examiner

*Primary Examiner*—Long K Tran
(74) *Attorney, Agent, or Firm*—Scully, Scott, Murphy & Presser, P.C.; H. Daniel Schnumann

(57) ABSTRACT

A first high-k gate dielectric layer and a first metal gate layer are formed on first and second semiconductor fins. A first metal gate ring is formed on the first semiconductor fin. In one embodiment, the first high-k gate dielectric layer remains on the second semiconductor fin. A second metal gate layer and a silicon containing layer are deposited and patterned to form gate electrodes. In another embodiment, a second high-k dielectric layer replaces the first high-k dielectric layer over the second semiconductor fin, followed by formation of a second metal gate layer. A first electrode comprising a first gate dielectric and a first metal gate is formed on the first semiconductor fin, while a second electrode comprising a second gate dielectric and a second metal gate is formed on the second semiconductor fin. Absence of high-k gate dielectric materials on a gate wiring prevents increase in parasitic resistance.

12 Claims, 54 Drawing Sheets

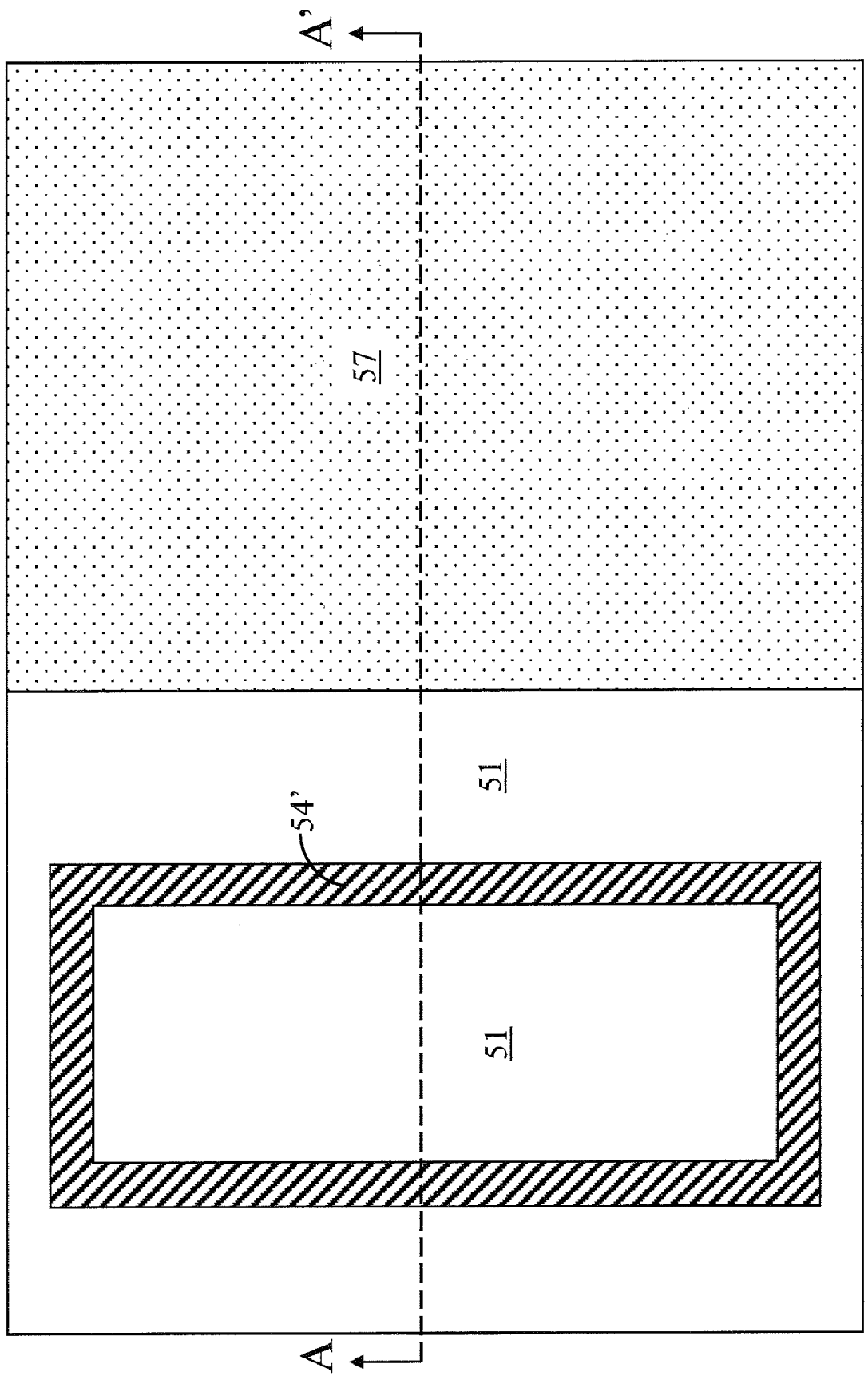

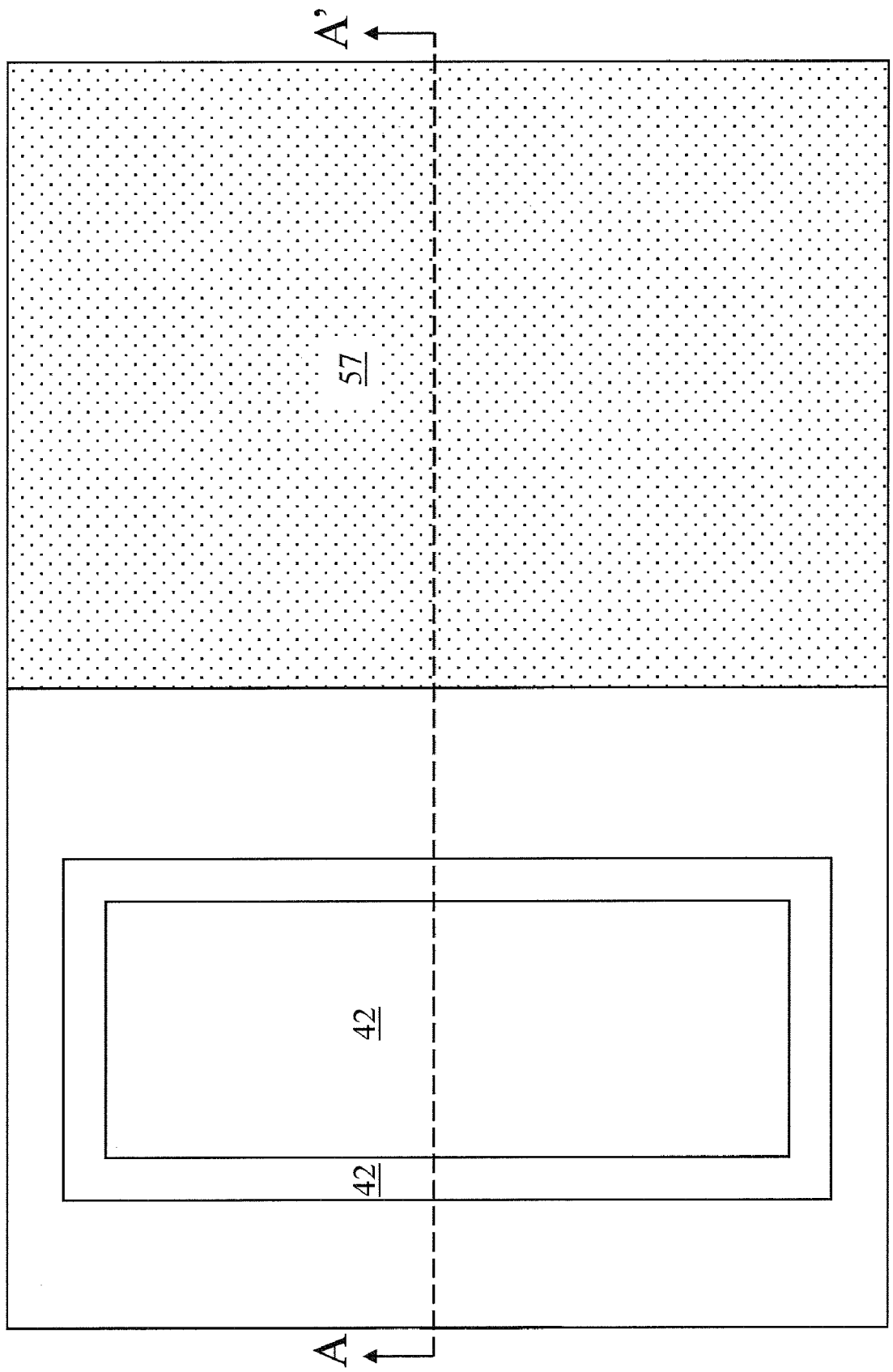

DUAL METAL GATE FINFETS WITH SINGLE OR DUAL HIGH-K GATE DIELECTRIC

FIELD OF THE INVENTION

The present invention relates to semiconductor structures, and particularly to complementary metal-oxide-semiconductor (CMOS) devices comprising finFETs having dual metal gates, and methods of manufacturing the same.

BACKGROUND OF THE INVENTION

FinFET technology is an emerging technology which provides solutions to MOSFET scaling problems at, and below, the 45 nm node. A fin field effect transistor (finFET) is a metal-oxide-semiconductor field effect transistor (MOSFET) formed on a semiconductor fin. A finFET comprises at least one narrow (preferably <10 nm wide) semiconductor fin gated on at least two opposing sides of each of the at least one semiconductor fin. FinFET structures are preferably formed on a semiconductor-on-insulator (SOI) substrate, because of the precise control of fin height which is determined by the substrate silicon thickness and ease of electrical isolation by shallow trench isolation structures.

A gate electrode is placed on at least two sides of a channel or is wrapped around the channel of the finFET. A gate dielectric separates the gate electrode and the channel of the finFET. A double gate finFET employs a double gate configuration in which the gate electrode is placed on two opposite sides of the channel. In a triple gate finFET, the gate electrode is placed on one more side of a typically rectangular channel of the transistor. In a quadruple gate finFET or a wrapped gate finFET, the gate electrode is placed on four sides of the channel.

In a typical finFET structure, at least one conducting channel on a vertical sidewall is provided within the semiconductor "fin" that is set sideways, or edgewise, upon a substrate. Typically, the fin comprises a single crystalline semiconductor material with a substantially rectangular cross-sectional area. Also typically, the height of the fin is greater than width of the fin to enable higher on-current per unit of semiconductor area used for the finFET structure.

A gate electrode located on at least two sides of the channel of the transistor is a common feature of finFETs known in the art. Increased number of sides on which the gate electrode controls the channel of the finFET enhances the controllability of the channel in a finFET compared to a planar MOSFET. Improved control of the channel allows smaller device dimensions with less short channel effects as well as larger electrical current that can be switched at high speeds. A finFET device has equivalent or higher current density, and much improved short channel control than the mainstream complementary metal-oxide-semiconductor (CMOS) technology utilizing similar critical dimensions.

Another area of advancing technology which provides enhanced performance for MOSFET scaling problems is development of high-k gate dielectric materials. High gate leakage current of nitrided silicon dioxide and depletion effect of polysilicon gate electrodes limits the performance of conventional silicon oxide based gate electrodes. High performance devices for an equivalent oxide thickness (EOT) less than 1 nm require high-k gate dielectric materials and metal gate electrodes to limit the gate leakage current and provide high on-currents. The high-k gate dielectric materials refer to dielectric metal oxides or dielectric metal silicates having a dielectric constant that is greater than the dielectric constant of silicon oxide of 3.9.

In general, complementary metal oxide semiconductor (CMOS) integration requires two gate materials, one having a work function near the valence band edge of the semiconductor material in the channel and the other having a work function near the conduction band edge of the same semiconductor material. In CMOS devices having a silicon channel, a conductive material having a work function of about 4.0 eV is necessary for n-type metal oxide semiconductor field effect transistors (NMOSFETs) and another conductive material having a work function of about 5.0 eV is necessary for p-type metal oxide semiconductor field effect transistors (PMOSFETs). In conventional CMOS devices employing polysilicon gate materials, a heavily p-doped polysilicon gate and a heavily n-doped polysilicon gate are employed to address these needs. In CMOS devices employing high-k gate dielectric materials, two metal gate materials satisfying the work function requirements are typically employed.

Thus, integration of high-k gate dielectric materials into finFET devices faces unique challenges. One of the challenges is the complexity and a large number of processing steps needed to form gate electrodes comprising a high-k gate dielectric material and dual metal gates.

In view of the above, there exists a need to provide a semiconductor structure comprising complementary finFET devices having a high-k gate dielectric material and dual metal gates and requiring a relatively small number of processing steps for manufacturing.

Another challenge in the integration of the high-k gate dielectric materials into finFET devices is an increase in parasitic capacitance between a gate wiring and adjacent conductive structures due to the high-k gate dielectric material. The high-k dielectric material, while advantageously providing a low EOT and enabling scaling of gate dielectric, is also known to act as a significant oxygen diffusion path from the isolation to the FET channel, often resulting in interfacial silicon oxide growth in the FET gate dielectric—resulting in increased EOT and thus diminishing the effectiveness of the high-k gate dielectric. Specifically, the high-k gate dielectric material is needed only on the gate electrode for scaling down of the gate dielectric, but is not desired outside the gate electrode including the gate wiring due to this interfacial oxide growth that occurs when a substantial amount of the high-k dielectric is retained over the device isolation region. Further, a set of dual high-k gate dielectric materials is preferred to a single high-k gate dielectric material for enhanced CMOS performance, complicating the integration of high-k gate dielectric materials into finFET devices.

Therefore, there exists a need for a semiconductor structure comprising complementary finFET devices having dual high-k gate dielectric materials and dual metal gates, wherein the amount of the dual high-k gate dielectric materials is minimized on a gate wiring, and method of manufacturing the same.

SUMMARY OF THE INVENTION

The present invention addresses the needs described above by providing CMOS devices comprising finFETs containing a high-k gate dielectric and dual metal gates, and requiring a relatively small number of processing steps for manufacturing, and by providing CMOS devices comprising finFETs containing dual high-k gate dielectric materials and dual metal gates, wherein the dual high-k gate dielectric materials are removed from underneath gate wiring to minimize parasitic resistance.

According to the present invention, a first semiconductor fin and a second semiconductor fin having opposite types of doping are provided on an insulator layer. A first high-k gate dielectric layer and a first metal gate layer are formed on the first and second semiconductor fins. Optionally, a first fin spacer may be formed on the sidewalls of the first metal gate layer to act as a protective masking layer during subsequent etching of the first metal gate layer. By a combination of a first blanket anisotropic reactive ion etch followed by a first masked substantially isotropic etch in which the first semiconductor fin is protected, a first metal gate ring is formed on the first semiconductor fin, with an optional first fin spacer on the first metal gate. The inclusion of the aforementioned optional first fin spacer enables the replacement of the first blanket anisotropic reactive ion etch with an dry or wet isotropic etch.

In one embodiment, the first high-k gate dielectric layer is used as an etch stop, and is present on the second semiconductor fin. A second metal gate layer and a silicon containing layer are deposited and patterned. The silicon containing layer is doped such that the first high-k gate dielectric, the first metal gate, the second metal gate layer, and the doped silicon containing layer comprise a first electrode for the first semiconductor fin, while the first high-k gate dielectric layer, the second metal gate layer, and the doped silicon containing layer comprise a second electrode for the second semiconductor fin. CMOS structures comprising two opposite types of finFETs that employ a single high-k gate dielectric layer and dual metal gates and requiring a small number of processing steps are provided.

In another embodiment, the first high-k gate dielectric layer is removed over the second semiconductor fin, and an anisotropic reactive ion etch is employed to form a first high-k gate dielectric ring on the first semiconductor fin. The high-k gate dielectric ring is present only on sidewalls of the first semiconductor fin, or as an L-shaped first high-k gate dielectric with a short "foot" on the insulator layer. A second high-k gate dielectric layer and a second metal gate layer are formed on the first and second semiconductor fins. By a combination of a second anisotropic blanket reactive ion etch and a second masked substantially isotropic etch in which the second semiconductor fin is protected, a second high-k gate dielectric ring and a second metal gate ring are formed on the second semiconductor fine. Alternately, second fin spacers may be formed on the sidewalls of the second metal gate layer on the first and second semiconductor fins. A masked etch may be employed to remove the second fin spacer on the first semiconductor fin, while protecting the second fin spacer on the second semiconductor fin. A substantially isotropic blanket etch may be employed to remove exposed portions of the second metal layer and the second high-k gate dielectric layer to form a second high-k gate dielectric ring and a second metal gate ring are formed on the second semiconductor fin. Upon formation of the second metal gate ring, a silicon containing layer is deposited and patterned to form gate electrodes and a gate wiring. Since high-k dielectric materials are not present beneath the gate wiring i.e., between the gate wiring and the insulator layer, the pathway for oxygen ingress into the gate dielectric stack has been eliminated.

According to an aspect of the present invention, a method of forming a semiconductor structure is provided, which comprises:

providing a first semiconductor fin and a second semiconductor fin on a substrate;

forming a first high-k gate dielectric layer surrounding and laterally abutting the first semiconductor fin;

forming a first metal gate ring surrounding and laterally abutting the first high-k gate dielectric ring;

forming a second metal gate layer the first semiconductor fin and the second semiconductor fin; and forming a silicon containing layer directly on the second metal gate layer.

In one embodiment, the method further comprises:

patterning the silicon containing layer so that a remaining portion of the silicon containing layer intersects the first and second semiconductor fins in a top-down view; and removing exposed portions of the second metal gate layer, the first high-k gate dielectric layer, and the first metal gate ring from outside the area covered by the remaining portion of the silicon containing layer.

In another embodiment, the method further comprises forming a first metal gate comprising two remaining disjoined portions of the first metal gate ring underneath the remaining portion of the silicon containing layer, wherein a portion of the patterned silicon containing layer, a portion of the second metal gate layer, and the first metal gate collectively constitute a first gate electrode controlling a current flow in the first semiconductor fin, and wherein another portion of the patterned silicon containing layer and another portion of the second metal gate layer collectively constitute a second gate electrode controlling a current flow in the second semiconductor fin.

In yet another embodiment, the method further comprises:

forming a first high-k gate dielectric ring surrounding and laterally abutting the first semiconductor fin and another first high-k gate dielectric ring surrounding and laterally abutting the second semiconductor fin;

forming another first metal gate ring surrounding and laterally abutting the another first high-k gate dielectric ring; and removing the another first high-k gate ring and the another first metal gate ring, while protecting the first high-k gate dielectric ring and the first metal gate ring with a block mask.

In still another embodiment, the method further comprises forming a second high-k gate dielectric layer directly on the second semiconductor fin and directly on the first metal gate prior to the forming of the second metal gate layer, wherein the second metal gate layer is formed directly on the second high-k gate dielectric layer.

In a further embodiment, the method further comprises:

forming a first metal gate layer directly on the first high-k gate dielectric layer; and etching the first high-k gate dielectric layer and forming a first high-k gate dielectric ring.

According to another aspect of the present invention, a semiconductor structure is provided, which comprises:

a substrate containing an insulator layer;

a first semiconductor fin and a second semiconductor fin vertically abutting the insulator layer;

a pair of disjoined first gate dielectric comprising a first high-k dielectric material, laterally abutting a sidewall of the first semiconductor fin, vertically abutting the insulator layer, and having an L-shaped vertical cross-sectional area;

a pair of disjoined second gate dielectric comprising a second high-k dielectric material, laterally abutting a sidewall of the second semiconductor fin, vertically abutting the insulator layer, and having another L-shaped vertical cross-sectional area;

a pair of disjoined first metal gate comprising a first metal or a first metal alloy, each of which laterally abutting an outer sidewall of one of the pair of disjoined first gate dielectric and vertically abutting a top surface of a protruding portion of one of the pair of disjoined first gate dielectric; and a pair of disjoined second metal gate comprising a second metal or a second metal alloy, each of which laterally abutting an outer sidewall of one of the pair of disjoined second gate dielectric and vertically abutting a top surface of a protruding portion of one of the pair of disjoined second gate dielectric.

In one embodiment, the semiconductor structure further comprises:

a first portion of a silicon containing alloy electrically connecting the pair of the disjoined first metal gate and controlling a current flow in the first semiconductor fin;

a second portion of the silicon containing alloy electrically connecting the pair of the disjoined second metal gate and controlling a current flow in the second semiconductor fin; and a third portion of the silicon containing alloy vertically abutting the insulator layer.

According to yet another aspect of the present invention, another semiconductor structure is provided, which comprises:

a substrate containing an insulator layer;

a first semiconductor fin and a second semiconductor fin vertically abutting the insulator layer;

a contiguous gate dielectric layer comprising a high-k dielectric material, laterally abutting two sidewalls of the first semiconductor fin and two sidewalls of the second semiconductor fin and vertically abutting the insulator layer;

a pair of disjoined first metal gate comprising a first metal or a first metal alloy, each of which abutting the contiguous gate dielectric layer; and a contiguous second metal gate layer comprising a second metal or a second metal alloy and abutting the pair of disjoined first metal gate over the first semiconductor fin and abutting the contiguous gate dielectric layer over the second semiconductor fin.

In one embodiment, the semiconductor structure further comprises:

a first portion of a silicon containing alloy controlling a current flow in the first semiconductor fin;

a second portion of the silicon containing alloy controlling a current flow in the second semiconductor fin; and a vertical stack of a third portion of the silicon containing alloy, a portion of the contiguous second metal gate layer, a portion of the contiguous gate dielectric layer, and a portion the insulator layer, wherein the stack is adjoined to the first portion and the second portion.

DETAILED DESCRIPTION OF THE INVENTION

Figure 1A:
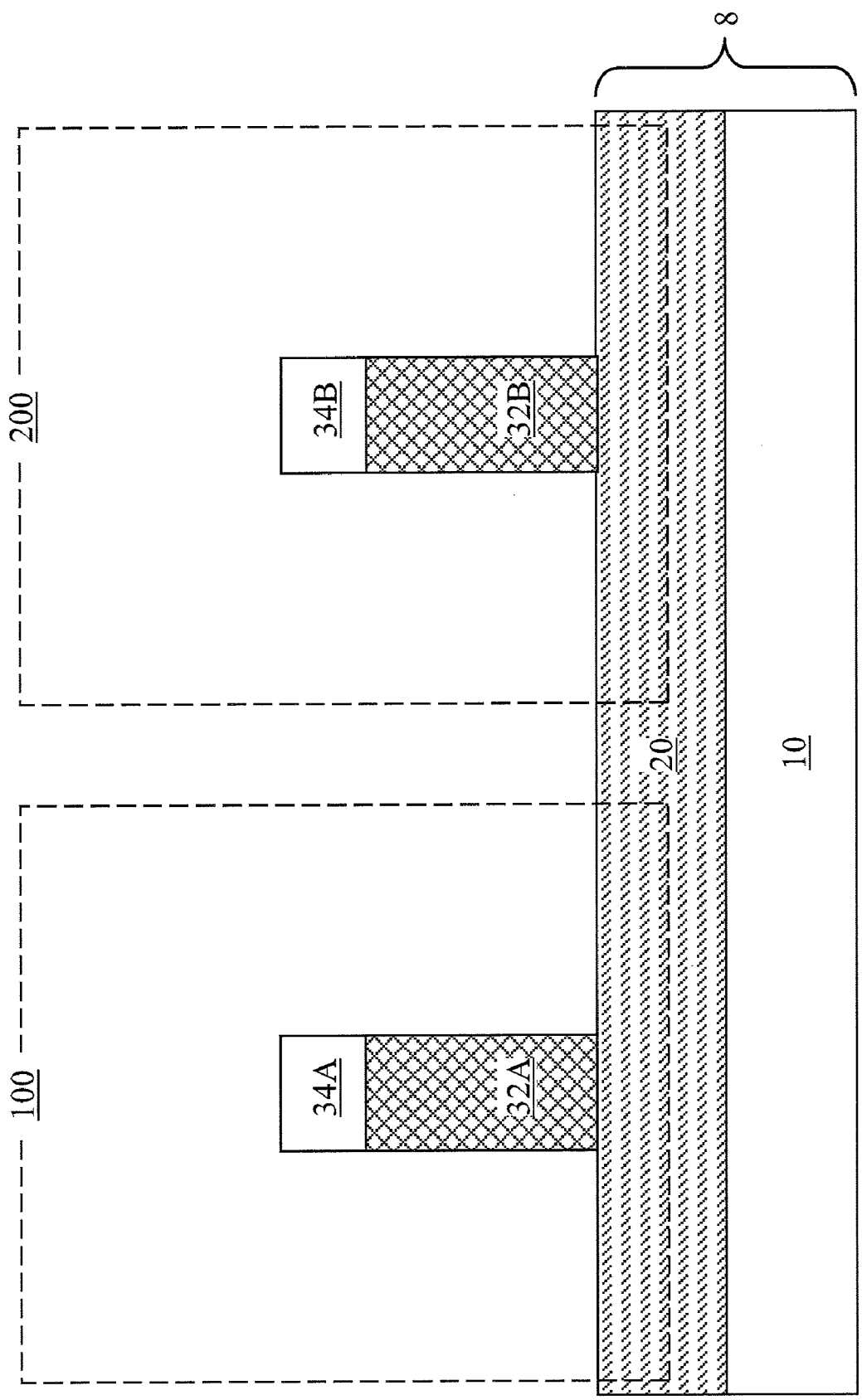
FIGS. 1A-9B are sequential views of a first exemplary semiconductor structure according to a first embodiment of the present invention. Figures with the same numeric label correspond to the same stage of manufacturing. Figures with the suffix "A" are vertical cross-sectional views along the plane A-A' of the corresponding figure with the same numeric label and the suffix "B." Figures with the suffix "B" are top-down views.

As stated above, the present invention relates to complementary metal-oxide-semiconductor (CMOS) devices comprising finFETs having dual metal gates and methods of manufacturing the same, which are now described in detail with accompanying figures. It is noted that like and corresponding elements are referred to by like reference numerals.

Figure 1B:
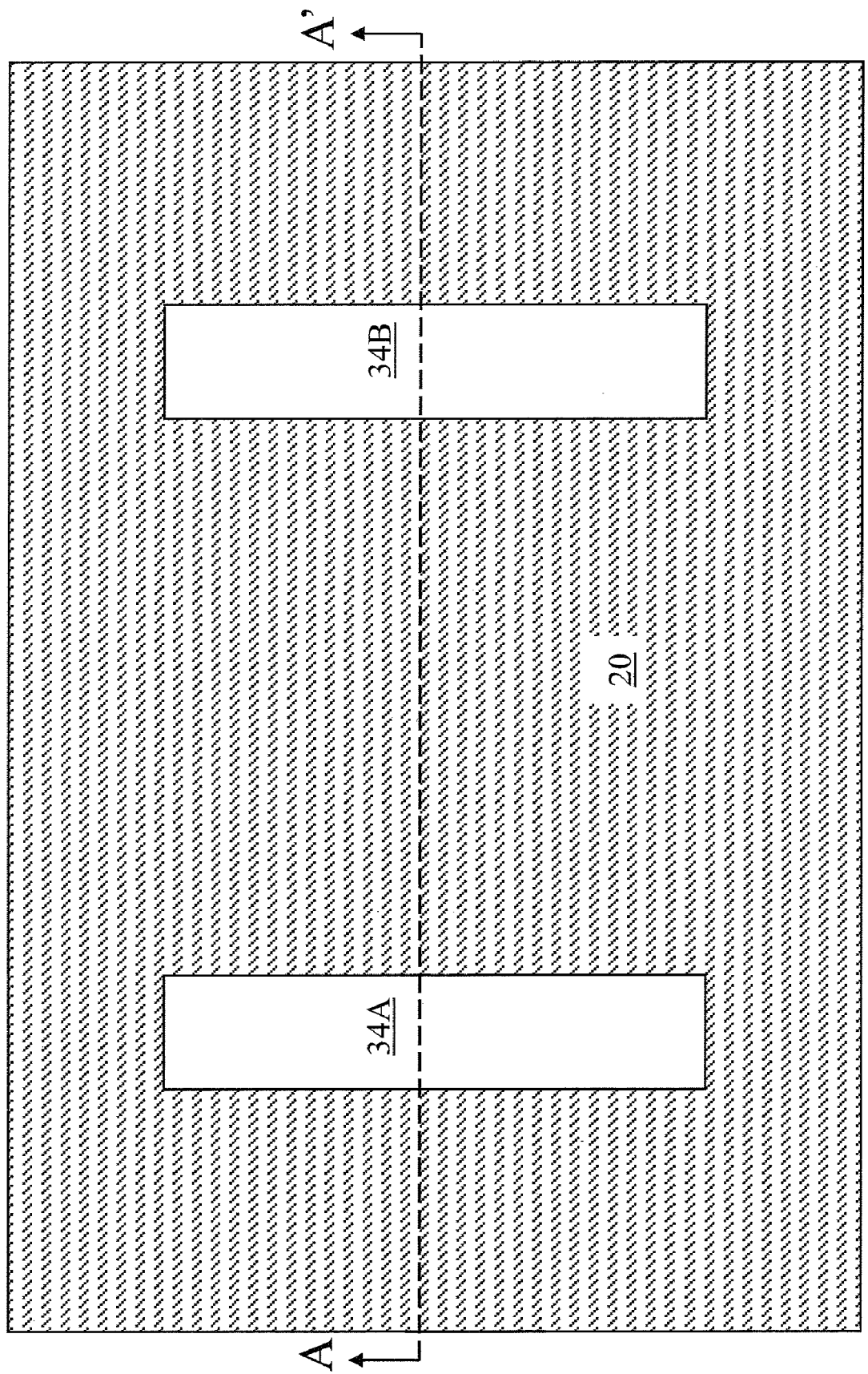

Referring to FIGS. 1A and 1B, a first exemplary structure according to a first embodiment of the present invention comprises a semiconductor substrate 8 containing a handle substrate 10 and an insulator layer 20. A first fin cap 34A and a second fin cap 34B are present on top surfaces of the first semiconductor fin 32A and the second semiconductor fin 32B, respectively. A first semiconductor fin 32A and a second semiconductor fin 32B are formed on the insulator layer 20 in a first device region 100 and in a second device region 200, respectively, by methods known in the art. For example, a semiconductor-on-insulator (SOI) substrate containing the handle substrate 10, a buried insulator layer which is the insulator layer 20, and a semiconductor containing layer (not shown) having the same thickness as the height of the first and second semiconductor fins (32A, 32B) may be employed. A dielectric layer (not shown) having the same composition as the first and second fin caps (34A, 34B) is formed on the SOI substrate, followed by patterning of the dielectric layer and the semiconductor containing layer to form the first and second semiconductor fins (32A, 32B) and the first and second fin caps (34A, 34B).

The first semiconductor fin 32A and the second semiconductor fin 32B comprise a semiconductor material such as silicon, germanium, a silicon germanium alloy, a silicon carbon alloy, a III-V compound semiconductor, or a II-VI compound semiconductor. The height of the first and second semiconductor fins (32A, 32B) may be from about 30 nm to about 300 nm, and typically from about 50 nm to about 200 nm, although lesser and greater heights are also contemplated herein. The first and second gate cap dielectric (34A, 34B) comprises a dielectric material such as a dielectric oxide or a dielectric nitride. For example, the first and second gate cap dielectric (34A, 3B) may comprise silicon nitride.

Figure 2A:
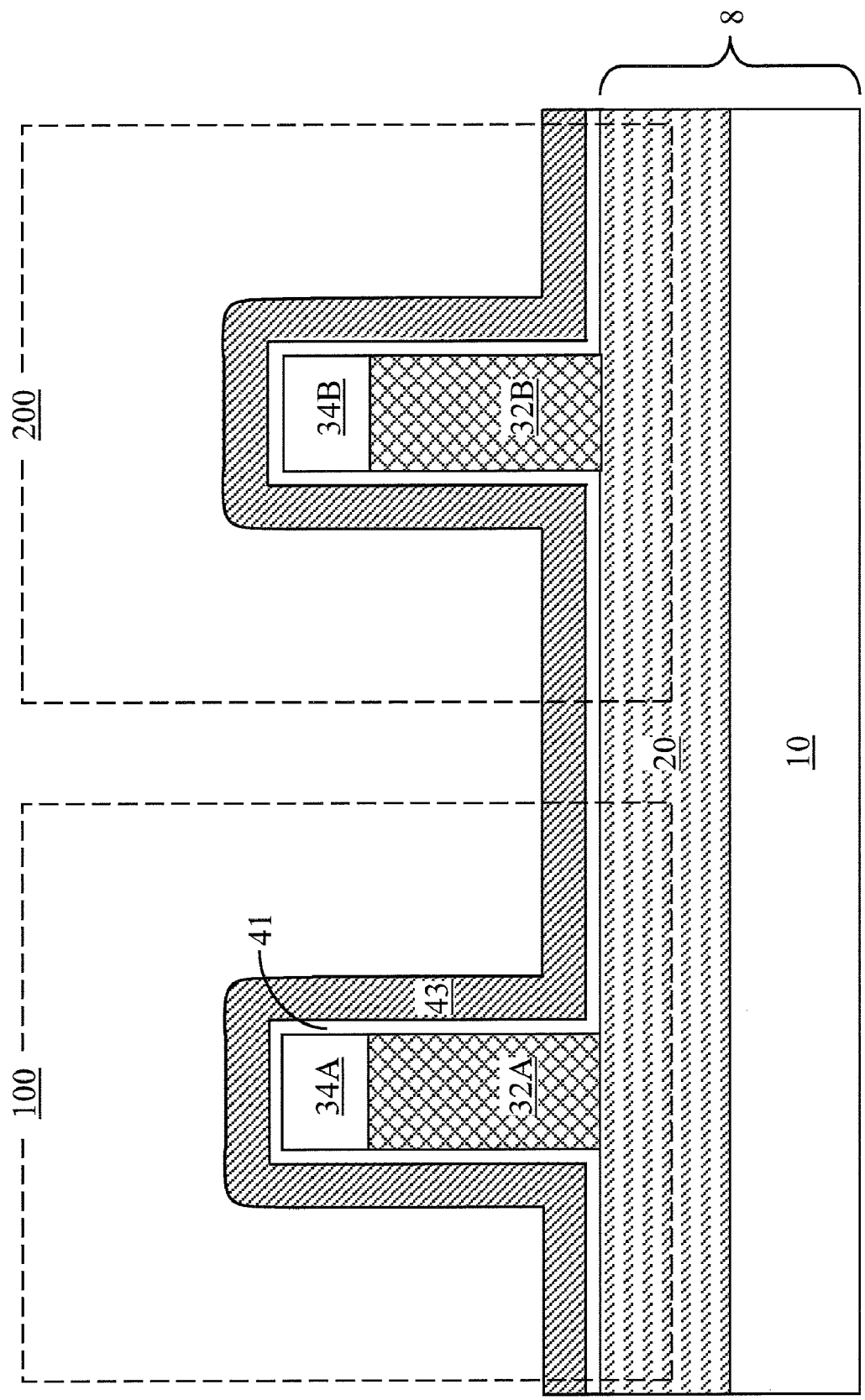
Figure 2B:
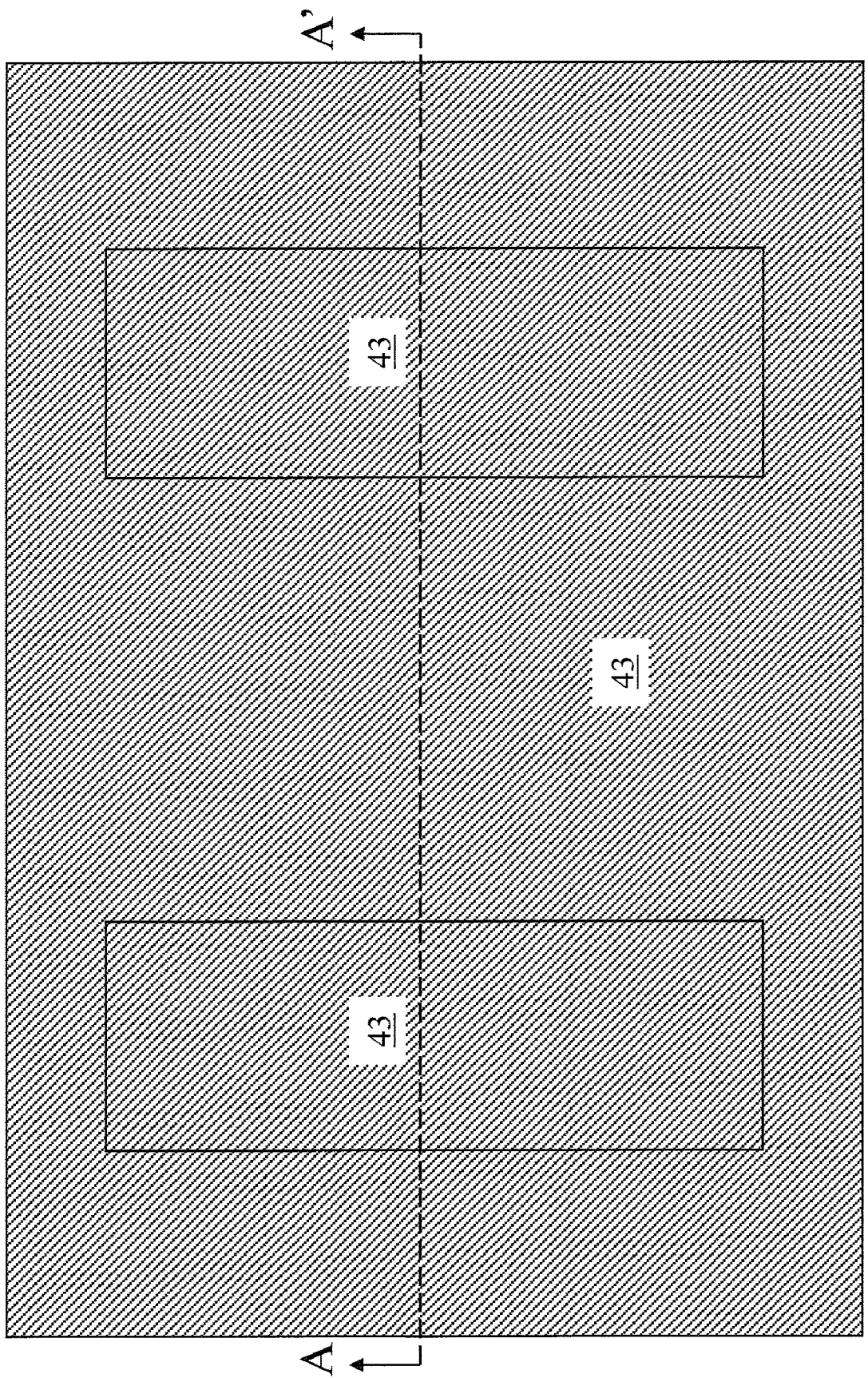

Referring to FIGS. 2A and 2B, a first high-k gate dielectric layer 41 and a first metal gate layer 43 are formed on the first and second semiconductor fins (32A, 32B) and on the insulator layer 20. The first high-k gate dielectric layer 41 comprises a first high-k dielectric material, which comprises a dielectric metal oxide having a dielectric constant that is greater than the dielectric constant of silicon oxide of 3.9. The dielectric metal oxide is a high-k material containing a metal and oxygen. For example, the first high-k dielectric material may comprise $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof. The high-k gate dielectric layer 41 is formed by methods well known in the art including, for example, a chemical vapor deposition (CVD), an atomic layer deposition (ALD), molecular beam epitaxy (MBE), pulsed laser deposition (PLD), liquid source misted chemical deposition (LSMCD), etc. The thickness of the first high-k gate dielectric layer 41 may be from about 1.2 nm to about 6 nm, and may have an effective oxide thickness on the order of or less than 1 nm.

The first metal gate layer 43 is formed directly on the first high-k gate dielectric layer 41, for example, by chemical vapor deposition (CVD), physical vapor deposition (PVD), atomic layer deposition (ALD), etc. The first metal gate layer 43 comprises a first conductive metallic material which may be a metal, a metal alloy, or a metal nitride. For example, the first metal gate layer 43 may comprise a material such as TaN, TiN, WN, TiAlN, TaCN, other conductive refractory metal nitride, or an alloy thereof. The thickness of the first metal gate layer 43 may be from about 5 nm to about 40 nm, and preferably from about 7 nm to about 20 nm, although lesser and greater thicknesses are also contemplated herein. The composition of the first metal gate layer 43 may be selected to optimize threshold voltages of a first finFET to be subsequently formed in the first device region 100.

Figure 3A:
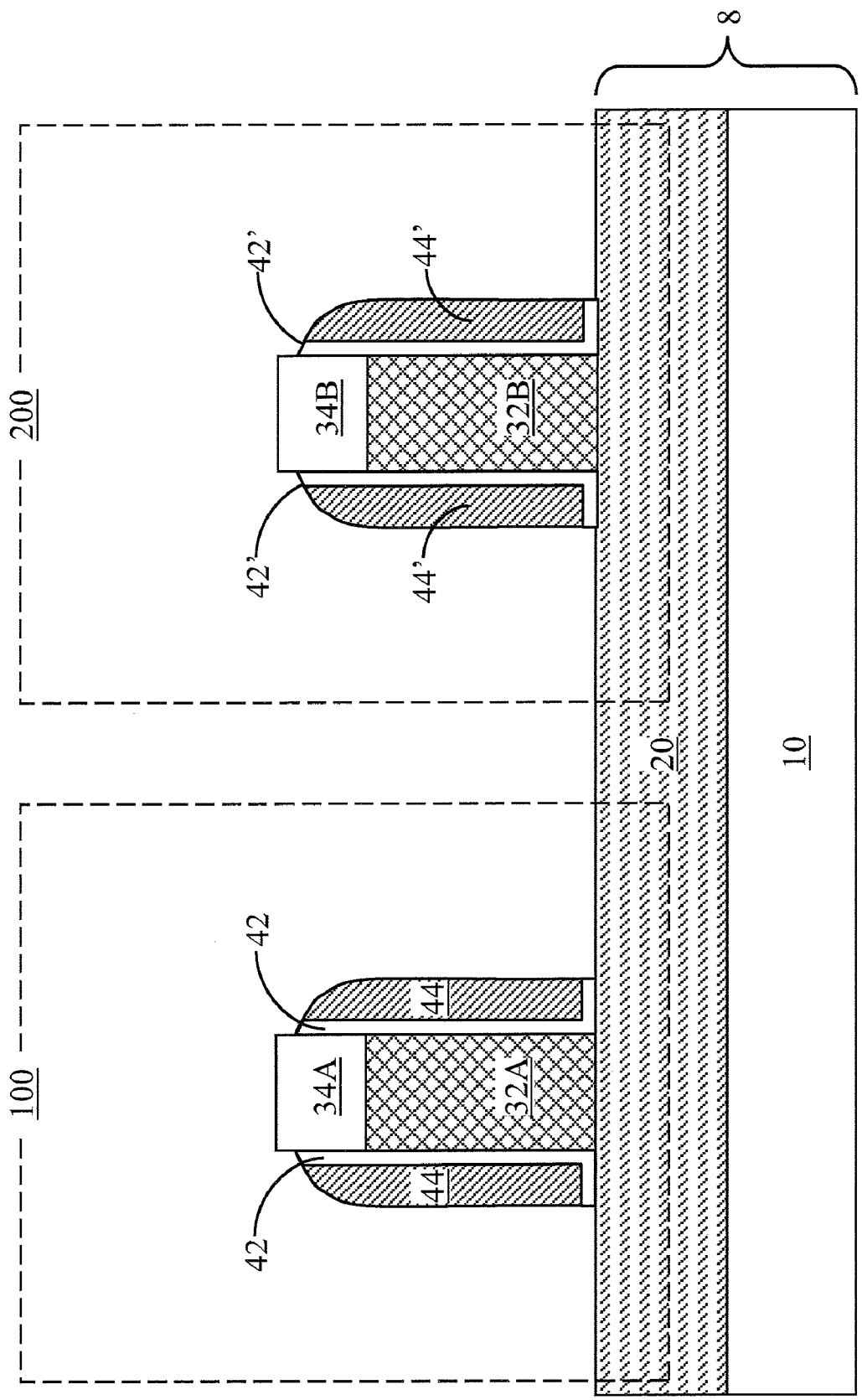
Figure 3B:
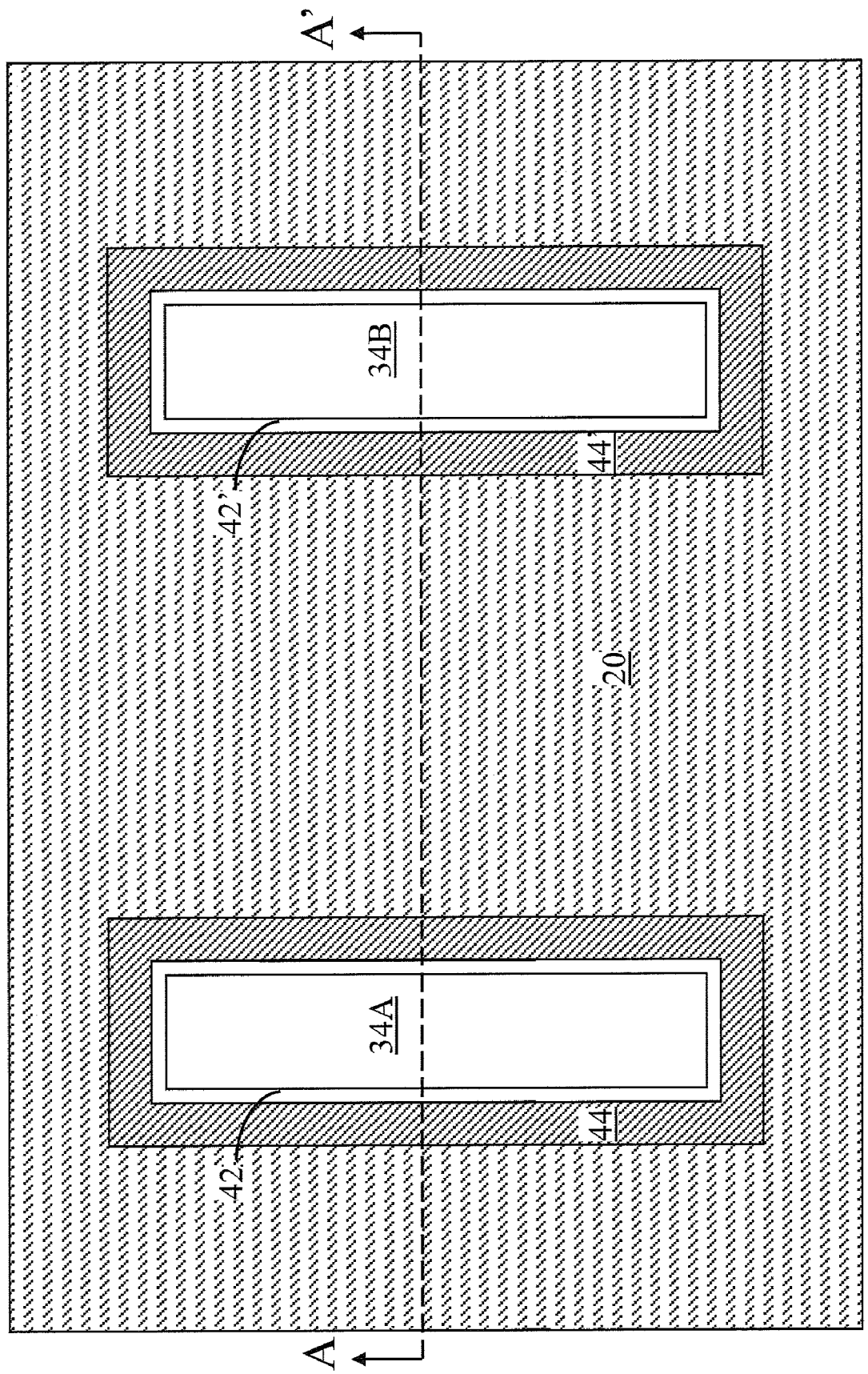

Referring to FIGS. 3A and 3B, an anisotropic reactive ion etch is performed on the first metal gate layer 43 to form a first metal gate ring 44 on the first semiconductor fin 32A in the first device region 100 and another first metal gate ring 44' on the second semiconductor fin 32B in the second device region 200. The anisotropic reactive ion etch may, or may not, be selective to the first high-k gate dielectric layer 43. The first metal gate rings (44, 44') surround and laterally abut the first high-k gate dielectric layer 41 (See FIG. 2A).

Exposed portions of the first high-k gate dielectric layer 41 are etched, for example, by a substantially isotropic dry etch or a wet etch. A first high-k gate dielectric ring 42 is formed from a remaining portion of the first high-k gate dielectric layer 41 in the first device region 100, while another first high-k gate dielectric ring 42' is formed from another remaining portion of the first high-k gate dielectric layer 41 in the second device region 200. Each of the first high-k gate dielectric rings (42, 42') laterally abuts sidewalls of the first or second semiconductor fin (32A or 32B) and sidewalls of the first or second fin caps (34A or 34B). Further, each of the first gate dielectric rings (42, 42') vertically abuts the insulator layer 20. In addition, each of the first gate dielectric rings (42, 42') has an L-shaped vertical cross-sectional area, and has a shape that is topologically homeomorphic to a torus, i.e., forms a ring that encircles one of the first semiconductor fin 32A and the second semiconductor fin 32B.

Each of the first metal gate rings (44, 44') laterally abuts outer sidewalls of one of the first high-k gate dielectric rings (42, 42'), vertically abuts a top surface of a laterally protruding bottom portion of one of the first high-k gate dielectric rings (42, 42'), and has a shape that is topologically homeomorphic to a torus, i.e., forms another ring that encircles one of the first semiconductor fin 32A and the second semiconductor fin 32B.

Figure 4A:
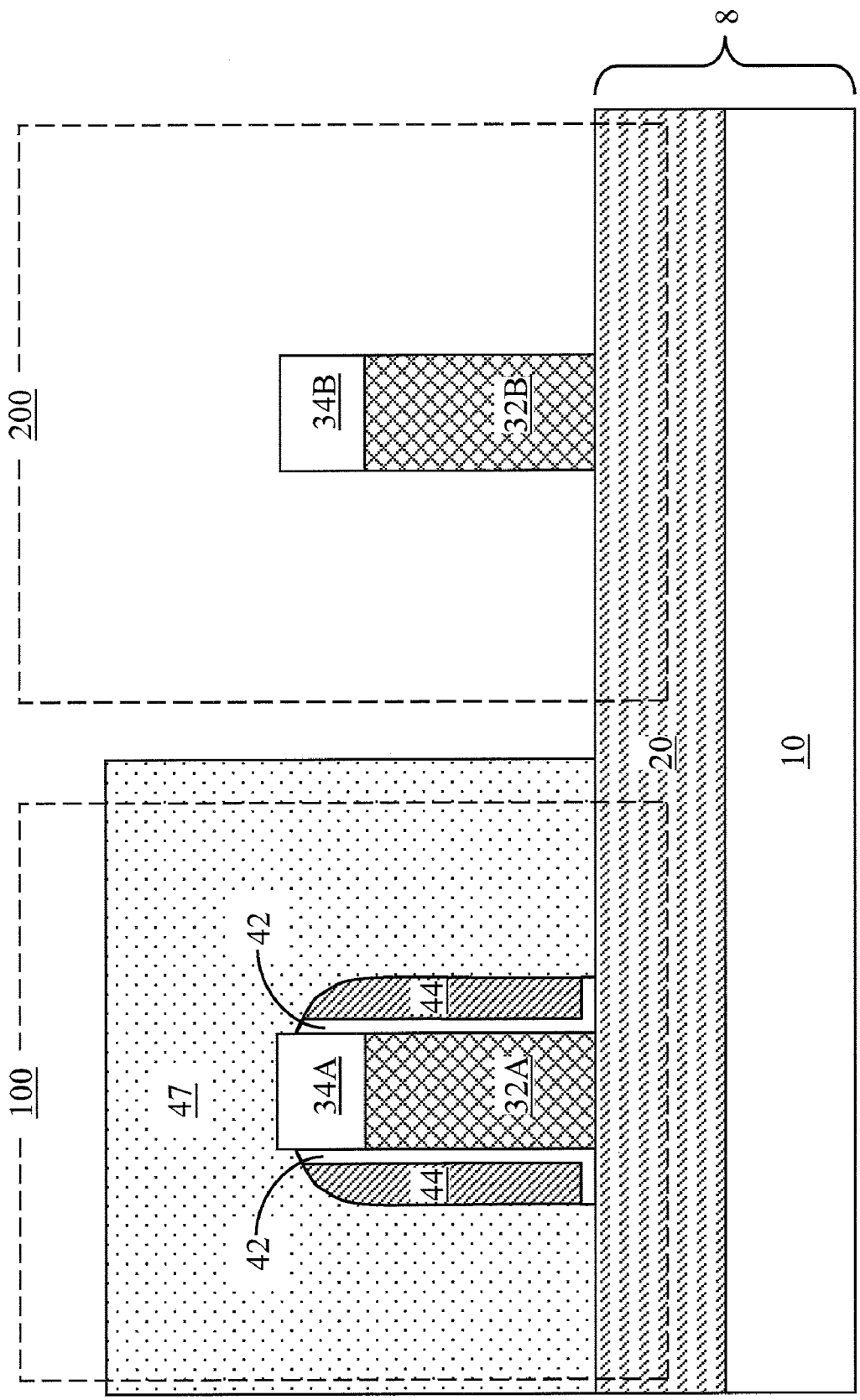
Figure 4B:
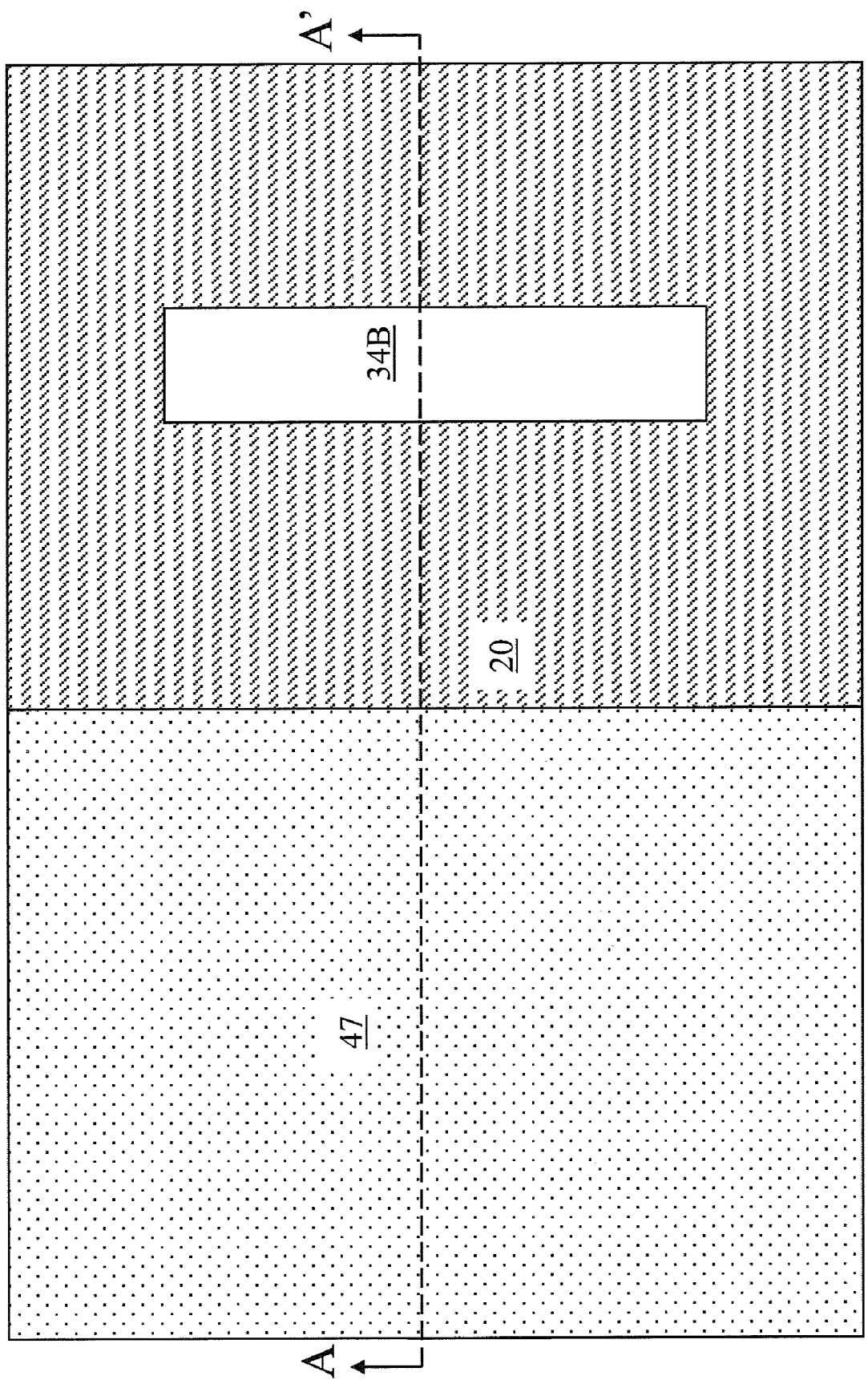

Referring to FIGS. 4A and 4B, a first photoresist 47 and a first block mask (not shown) are employed to mask the first device region 100, while exposing the second device region 200 using lithographic techniques known in the art. The another first metal gate ring 44' and the another first high-k gate dielectric ring 42' surrounding the second semiconductor fin 32B are removed by an etch, which may be a substantially isotropic dry etch, wet etch, or a combination of both. Use of an anisotropic etch is also contemplated herein. The first photoresist 47 is subsequently removed.

Figure 5A:
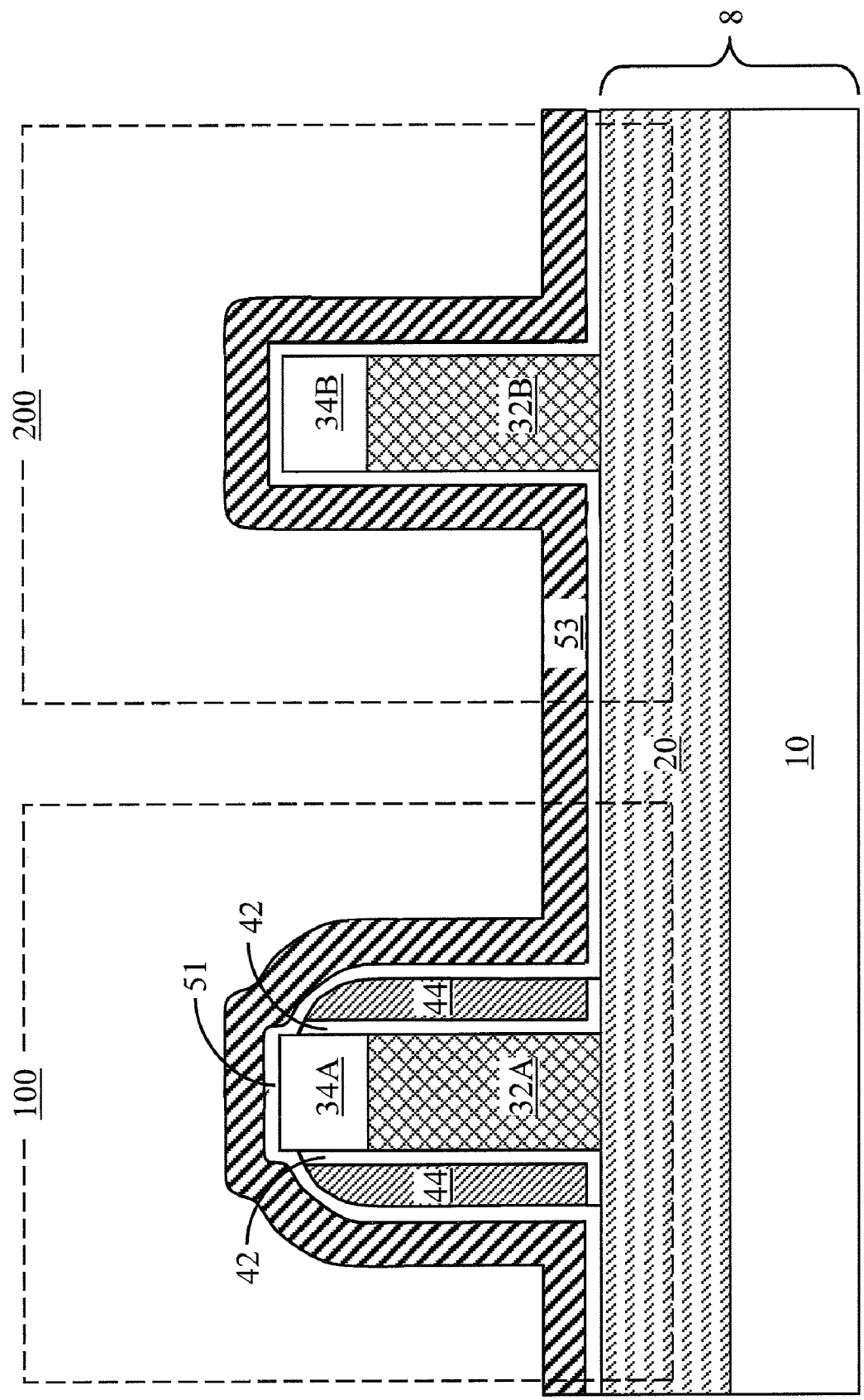
Figure 5B:
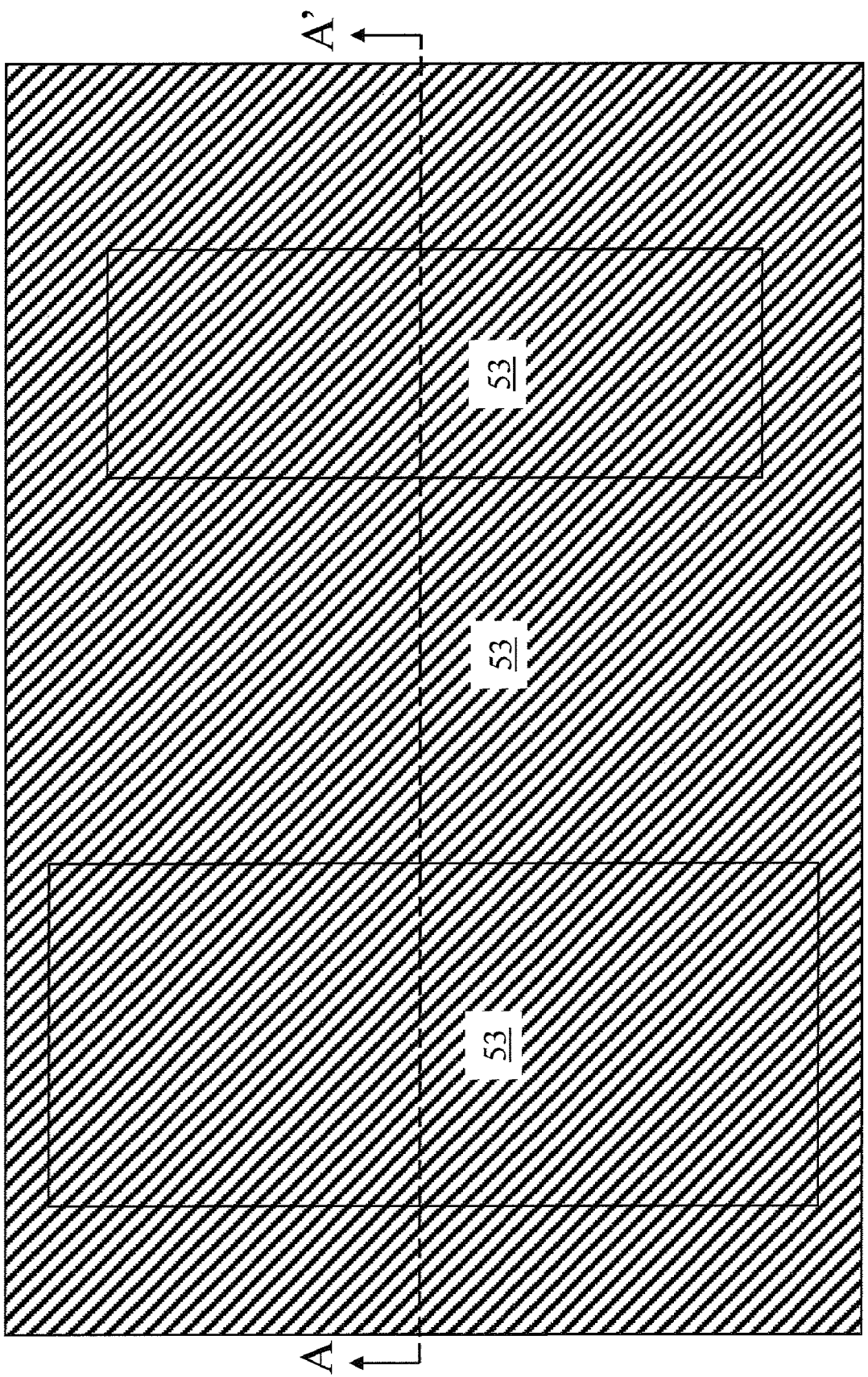

Referring to FIGS. 5A and 5B, a second high-k gate dielectric layer 51 and a second metal gate layer 53 are formed on the outer sidewalls of the first metal gate ring 44, exposed areas of the first high-k gate dielectric ring 42, a first fin cap 34A, a second fin cap 34B, sidewalls of the second semiconductor fin 32B, and the insulator layer 20. The second high-k gate dielectric layer 51 comprises a second high-k dielectric material, which has the same compositional and physical characteristics as the first high-k dielectric material. The second high-k dielectric material may be the same as, or different from, the first high-k dielectric material. Preferably, the first high-k dielectric material is optimized for one type of finFET, e.g., a p-type finFET or an n-type finFET, and the second high-k dielectric material is optimized for the opposite type of finFET. The thickness of the second high-k gate dielectric layer 51 is in the same range as the thickness of the first high-k gate dielectric layer 41.

The second metal gate layer 53 is formed directly on the second high-k gate dielectric layer 51. The second metal gate layer 53 comprises a second conductive metallic material, which has the same compositional and physical characteristics as the first conductive metallic material. The second conductive metallic material may be the same as, or different from, the first conductive metallic material. The composition of the second metal gate layer 43 may be selected to optimize threshold voltages of a second finFET to be subsequently formed in the second device region 200.

Figure 6A:
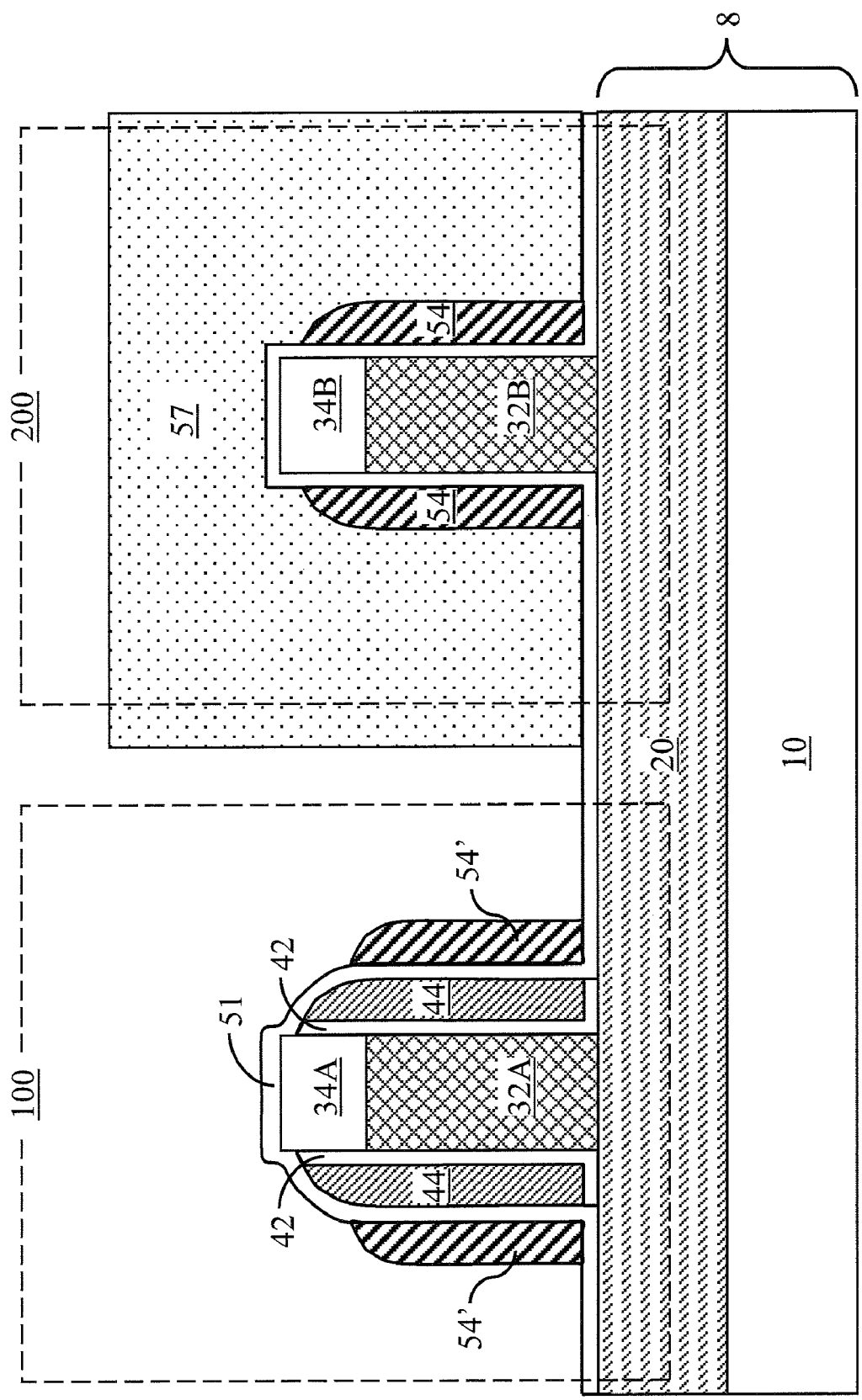

Referring FIGS. 6A and 6B, an anisotropic reactive ion etch is performed on the second metal gate layer 53 to form a second metal gate ring 54 on the second semiconductor fin 32B in the first device region 200 and another second metal gate ring 54' on the first semiconductor fin 32A in the first device region 100. The anisotropic reactive ion etch is selective to the second high-k gate dielectric layer 51. The second metal gate rings (54, 54') surround and laterally abut the second high-k gate dielectric layer 51.

Subsequently, a second photoresist 57 and a second block mask (not shown) are employed to mask the second device region 200, while exposing the first device region 100 using lithographic techniques known in the art.

Figure 7A:
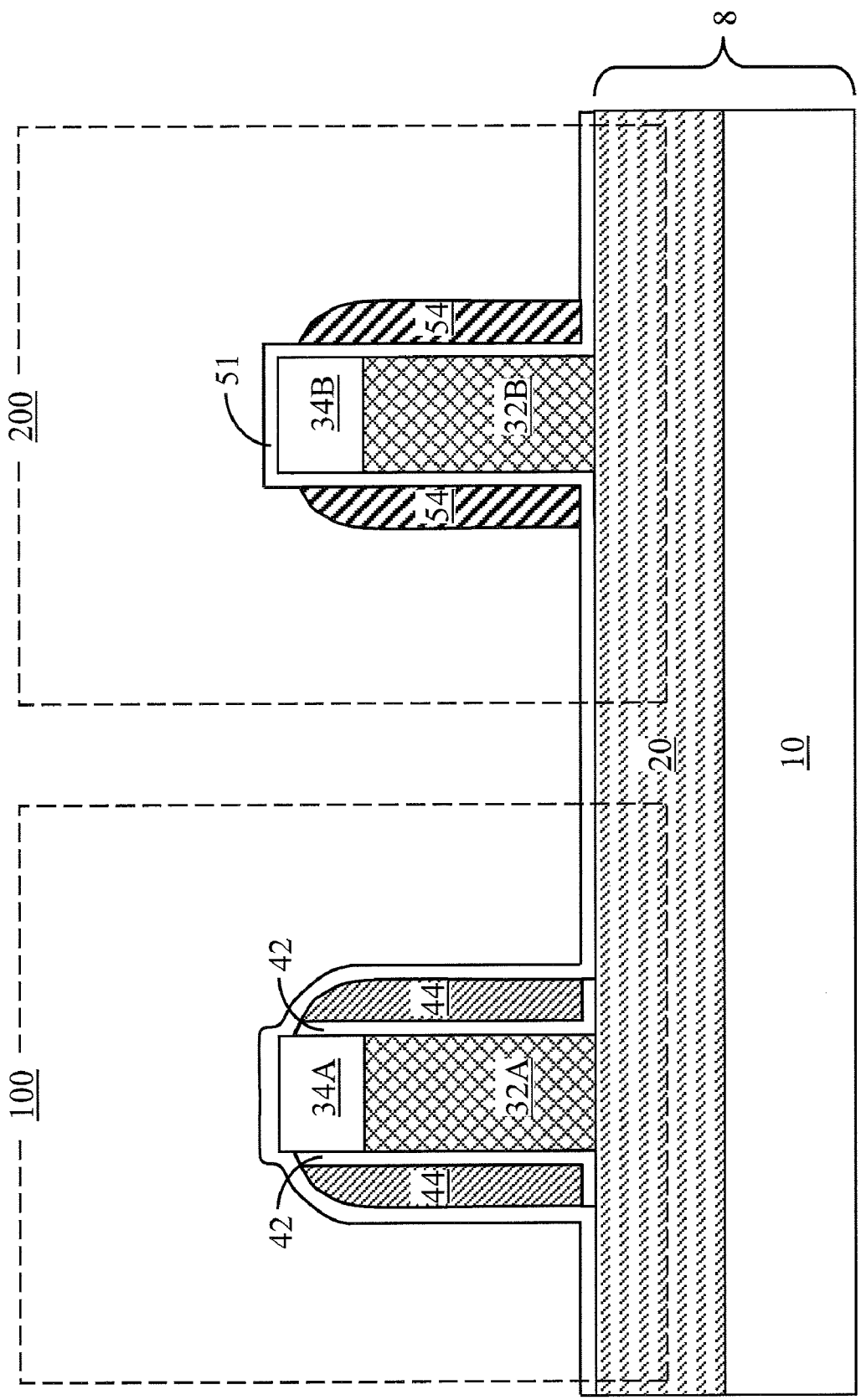
Figure 7B:
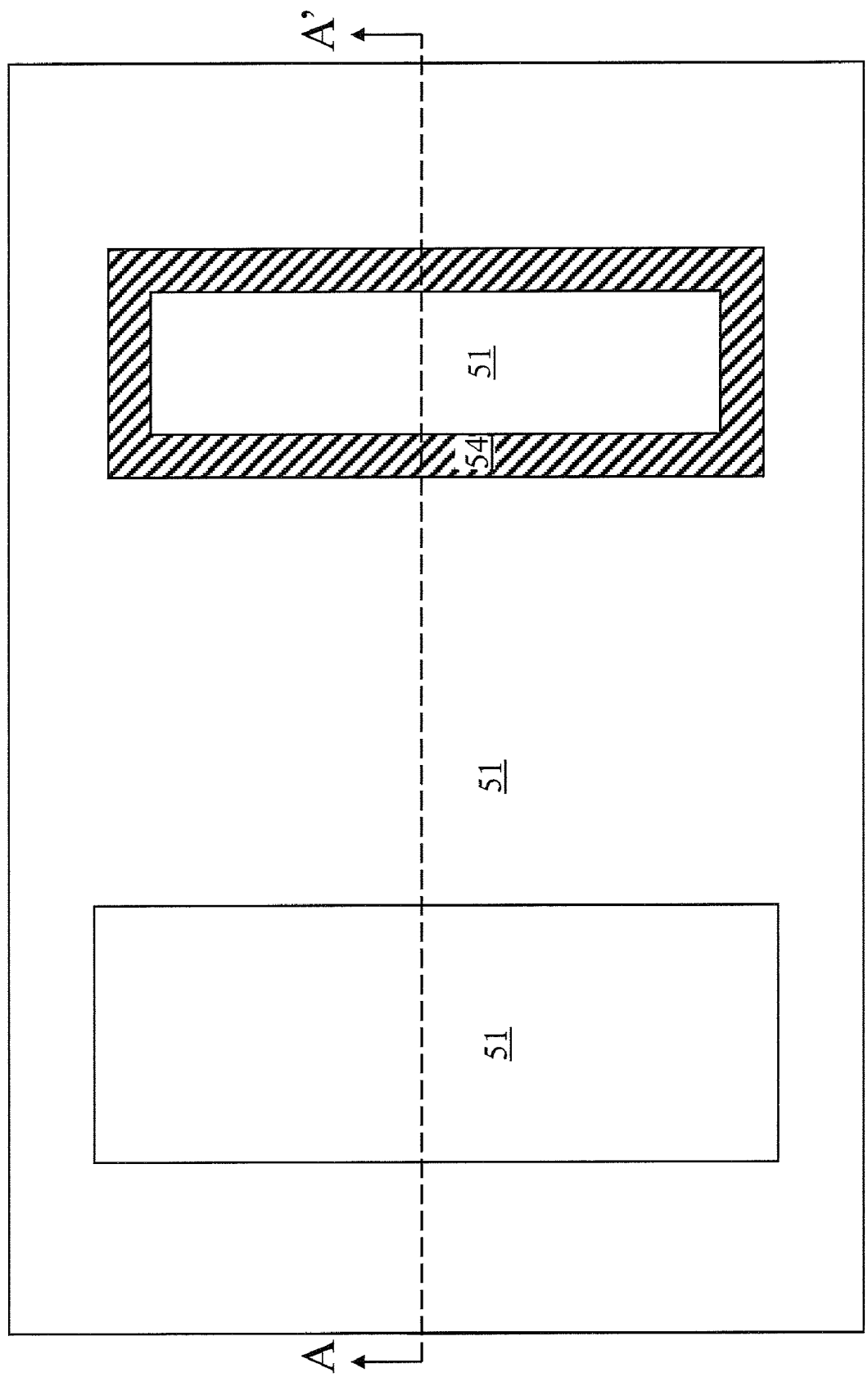

Referring to FIGS. 7A and 7B, the another second metal gate ring 54' surrounding the first semiconductor fin 32A is then removed by an etch, which may be a substantially isotropic dry etch, wet etch, or a combination of both. Use of an anisotropic etch is also contemplated herein. The second photoresist 57 is removed, for example, by ashing.

Figure 8A:
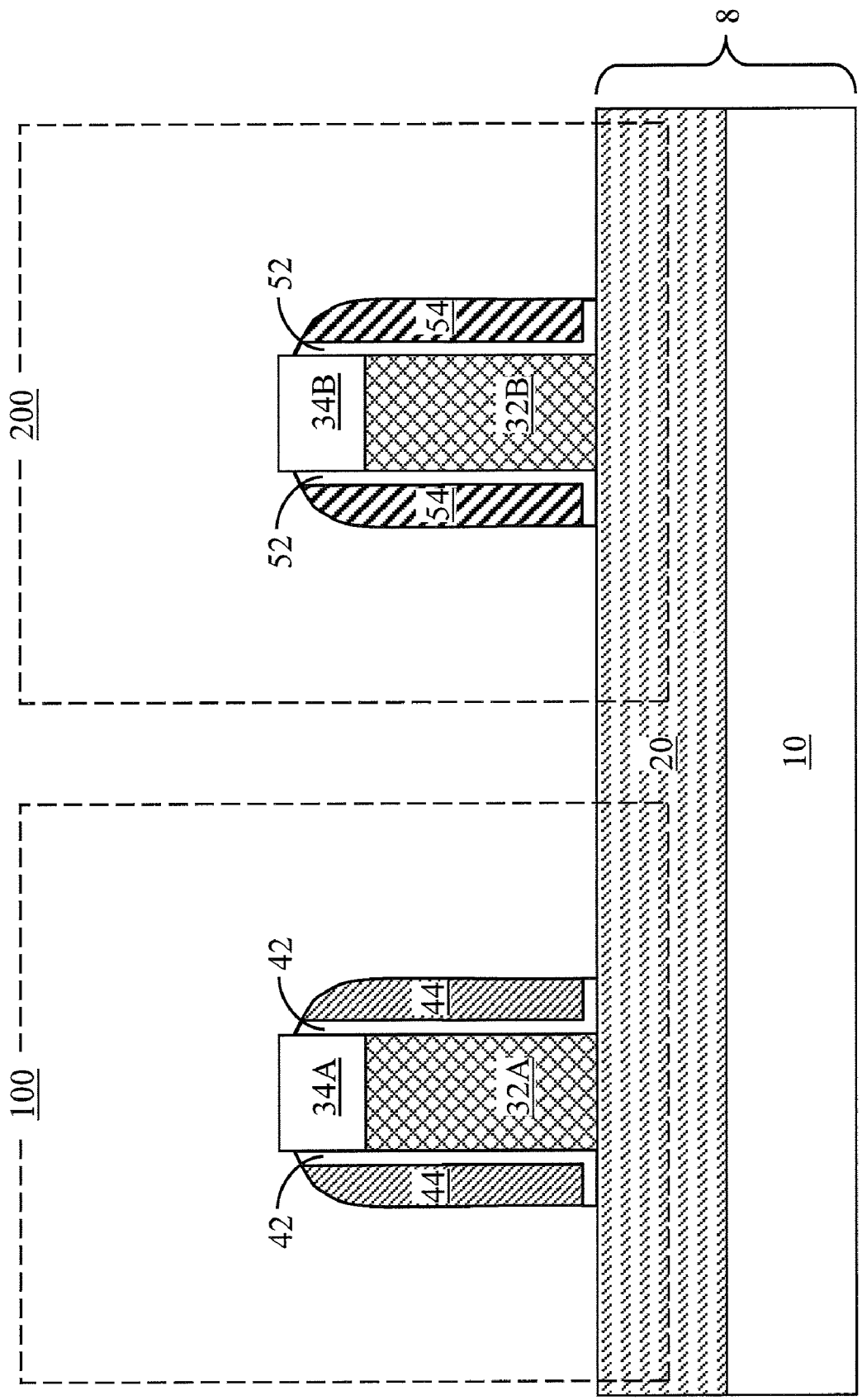
Figure 8B:
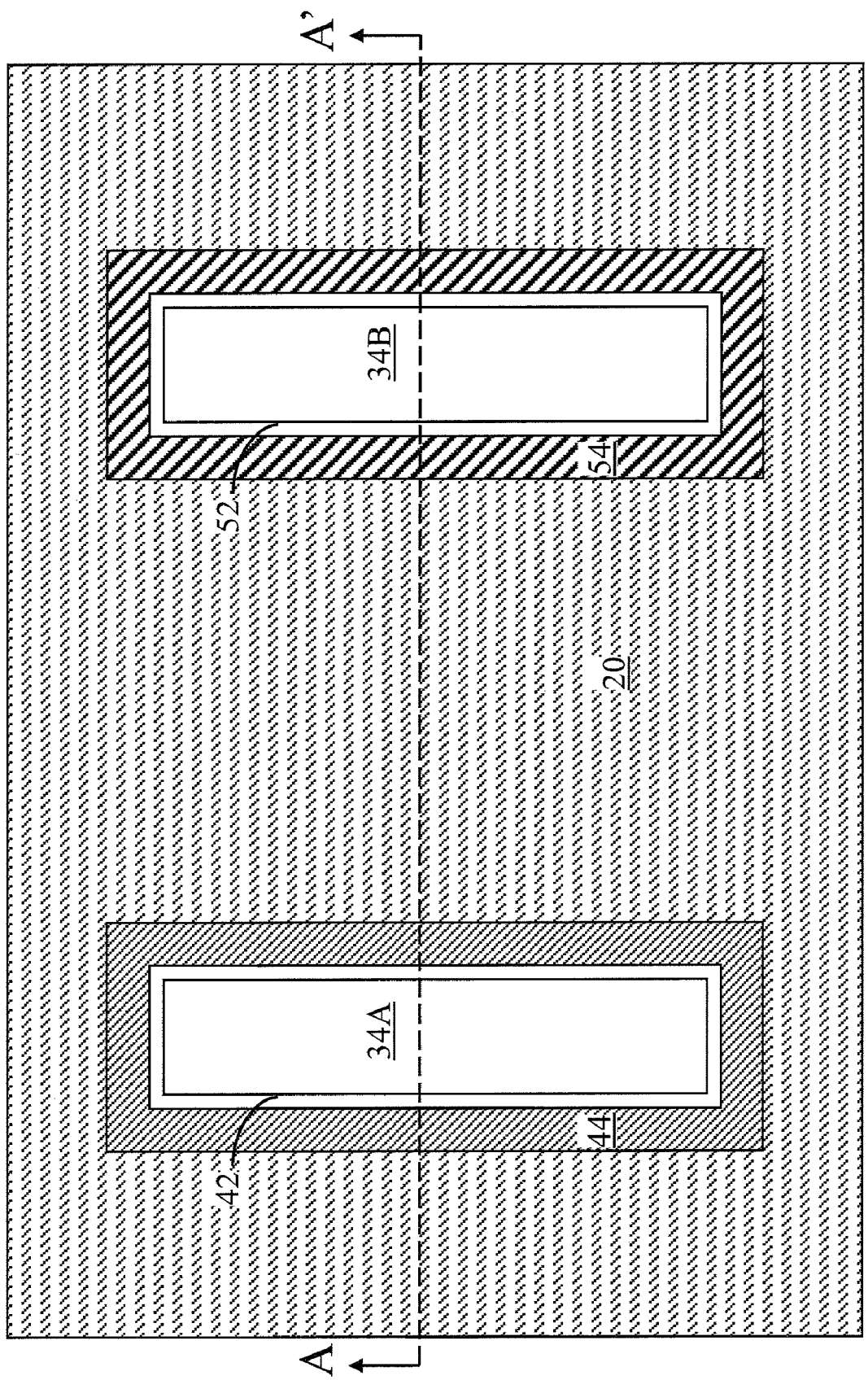

Referring to FIGS. 8A and 8B, exposed portions of the second high-k gate dielectric layer 51 are etched, for example, by a substantially isotropic dry etch or a wet etch, which is selective to the first metal gate ring 44 and the second metal gate ring 54. A second high-k gate dielectric ring 52 is formed from a remaining portion of the second high-k gate dielectric layer 51 in the second device region 200. The second high-k gate dielectric ring 52 in the second device region 200 laterally abuts sidewalls of the second semiconductor fin 32B and sidewalls of the second fin cap 34B. The second gate dielectric ring 52 has an L-shaped vertical cross-sectional area, and has a shape that is topologically homeomorphic to a torus, i.e., forms a ring that encircles the second semiconductor fin 32B. A suitable surface clean is performed as needed.

The second metal gate ring 54 in the second device region 200 laterally abuts outer sidewalls of the second high-k gate dielectric ring 54 in the second device region 200, vertically abuts a top surface of a laterally protruding bottom portion of the second high-k gate dielectric ring 54 in the second device region 200, and has a shape that is topologically homeomorphic to a torus, i.e., forms another ring that encircles the second semiconductor fin 32B.

Figure 9A:
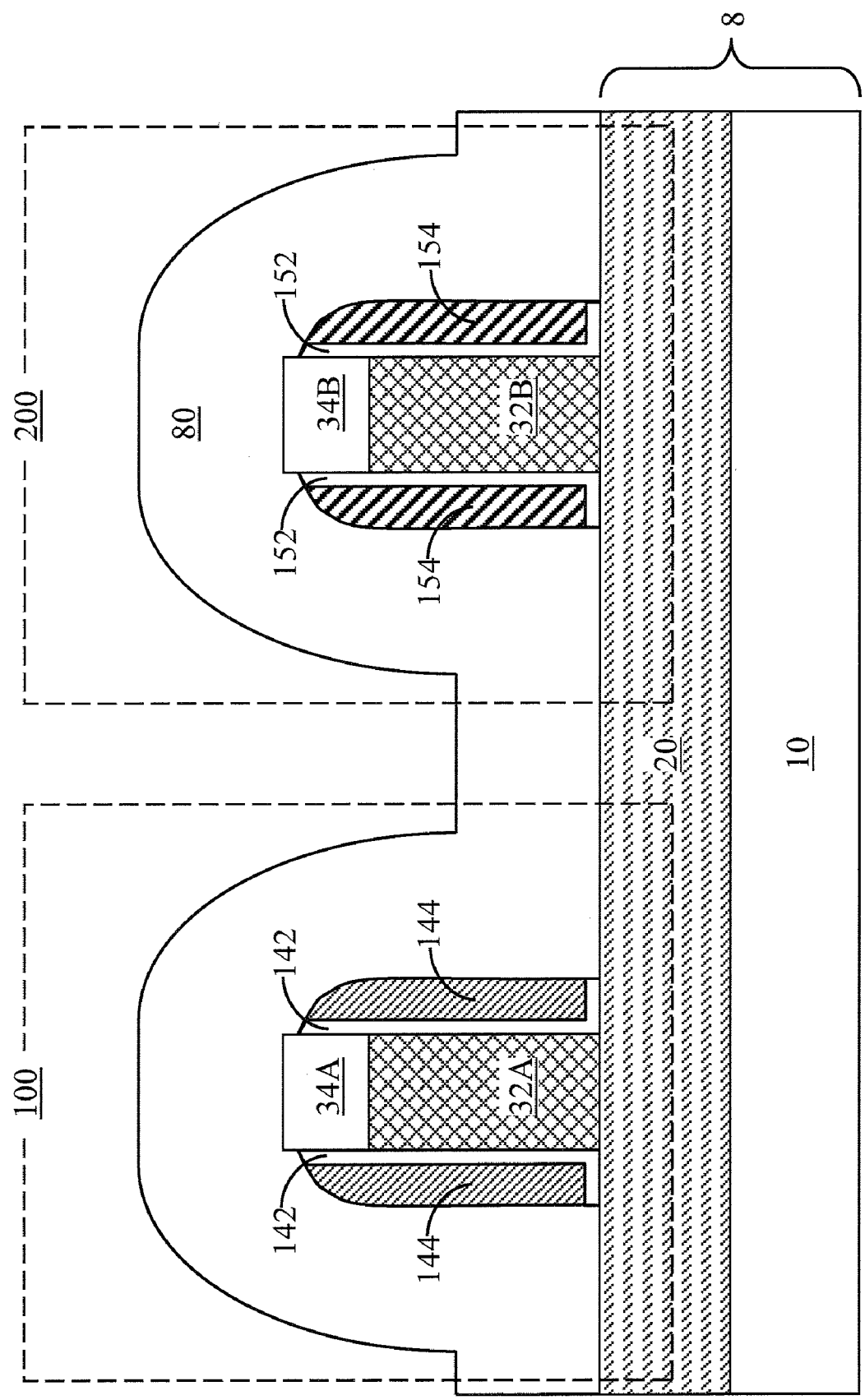
Figure 9B:
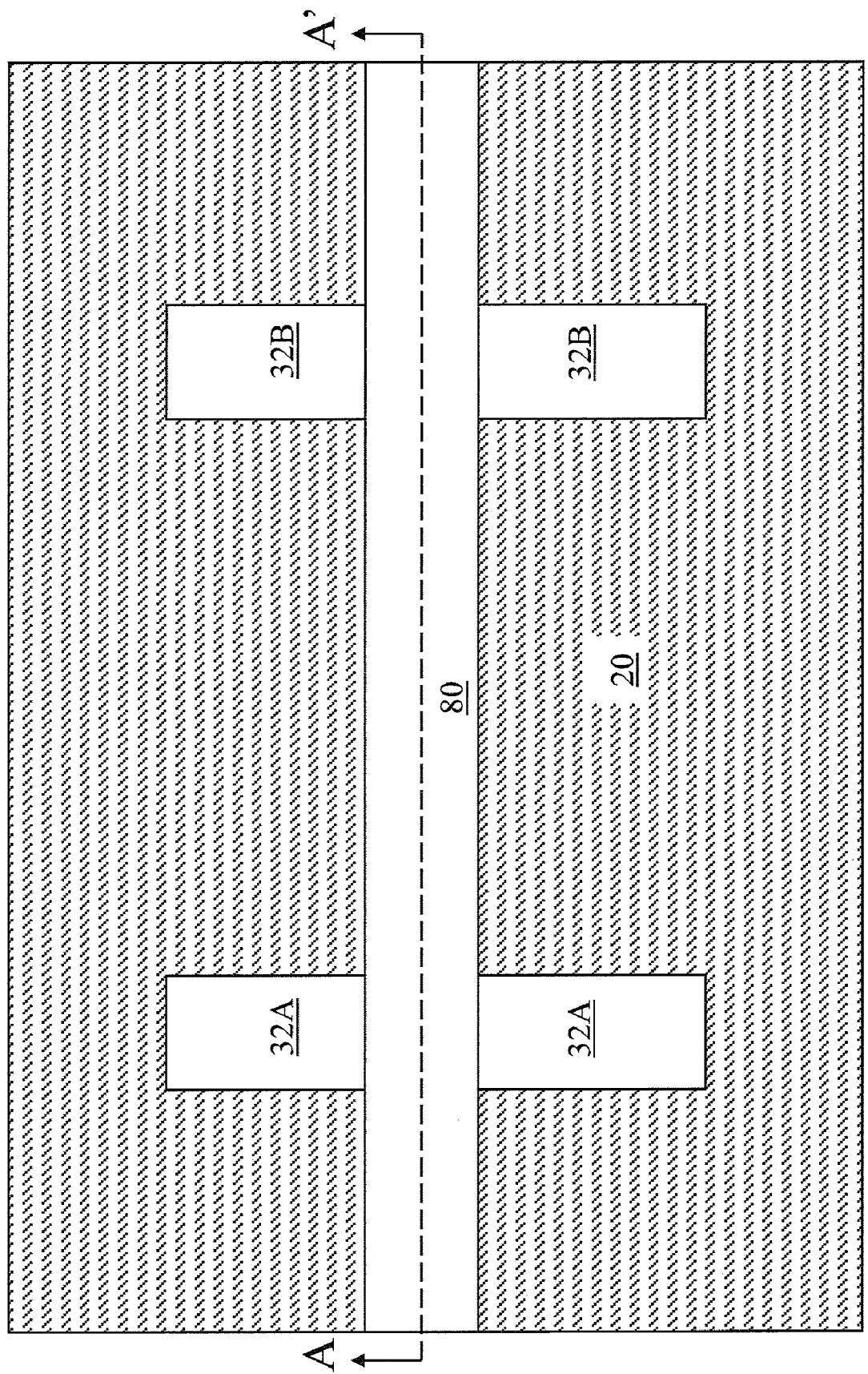

Referring to FIGS. 9A and 9B, a silicon containing layer (not shown) is deposited on the first metal gate ring 44 (See FIG. 8A), the second metal gate ring 54 (See FIG. 8A), the first fin cap 34A (See FIG. 8A), the second fin cap 34B (See FIG. 8A), and the insulator layer 20, for example, by chemical vapor deposition (CVD) such as low pressure chemical vapor deposition (LPCVD) or rapid thermal chemical vapor deposition (RTCVD). The silicon containing layer contains silicon, and may, or may not, comprise additional elements such as germanium and/or carbon. The silicon containing layer is preferably doped with dopants to enhance conductivity. Preferably, the doping of the silicon containing layer is locally optimized for performance of the first finFET to be formed in the first device region 100 and the second finFET to be formed in the second device region 200. For example, the silicon containing layer 80 may be doped with p-type dopants directly over a p-type finFET, and doped with n-type dopants directly over an n-type finFET.

The silicon containing gate line 80 is formed by lithographically pattering the silicon containing layer employing techniques known in the art. The silicon containing gate line 80 intersects the first and second semiconductor fins (32A, 32B) in a top-down view. Further, another etch, which may be a reactive ion etch, removes exposed portions of the first metal gate ring 44 (See FIG. 8A), second metal gate ring 54 (See FIG. 8A), the first high-k gate dielectric ring 42 (See FIG. 8A), and the first metal gate ring 44 (See FIG. 8A) from outside the area covered by the silicon containing gate line 80 in the top-down view.

Two remaining disjoined portions of the first metal gate ring 44 constitute a first metal gate 144. Two remaining disjoined portions of the second metal gate ring 54 constitute a second metal gate 154. A portion of the silicon containing gate line 80 in the first device region 100 and the first metal gate 144 collectively constitute a first gate electrode controlling a current flow in the first semiconductor fin 32A. Another portion of the silicon containing gate line 80 in the second device region 200 and the second metal gate 154 collectively constitute a second gate electrode controlling a current flow in the second semiconductor fin 32B.

Two remaining disjoined portions of the first high-k gate dielectric layer 42 comprise a first high-k gate dielectric 142 electrically separating a channel of the first semiconductor fin 32A from the first gate electrode. The channel of the of the first semiconductor fin 32A include the area of the first semiconductor fin 32A shown in FIG. 9A. Likewise, two remaining disjoined portions of the second high-k gate dielectric layer 52 comprise a second high-k gate dielectric 152 electrically separating a channel of the second semiconductor fin 32B from the second gate electrode. The channel of the of the second semiconductor fin 32B include the area of the second semiconductor fin 32B shown in FIG. 9A.

The exposed portions of the first and second semiconductor fins (32A, 32B) may be doped to form source and drain regions as known in the art. Formation of metal semiconductor alloys, such as metal silicides, may be performed, followed by deposition of middle-of-line dielectric material and formation of contacts to the various components in and on the first and second semiconductor fins (32A, 32B) to form a first finFET in the first device region 100 and a second finFET in the second device region 200. Preferably, the first finFET and the second finFET are of opposite conductivity types. The first high-k dielectric material and the second high-k dielectric material may be selected independent of each other. Likewise, the first conductive metallic material and the second conductive metallic material may be selected independent of etch other. The first exemplary further provides a gate wiring located between the first device region 100 and the second device region 200 and containing yet another portion of the silicon containing gate liner 80 which vertically abuts the insulator layer 20. High-k gate dielectric materials are not present in the gate wiring.

Figure 10A:
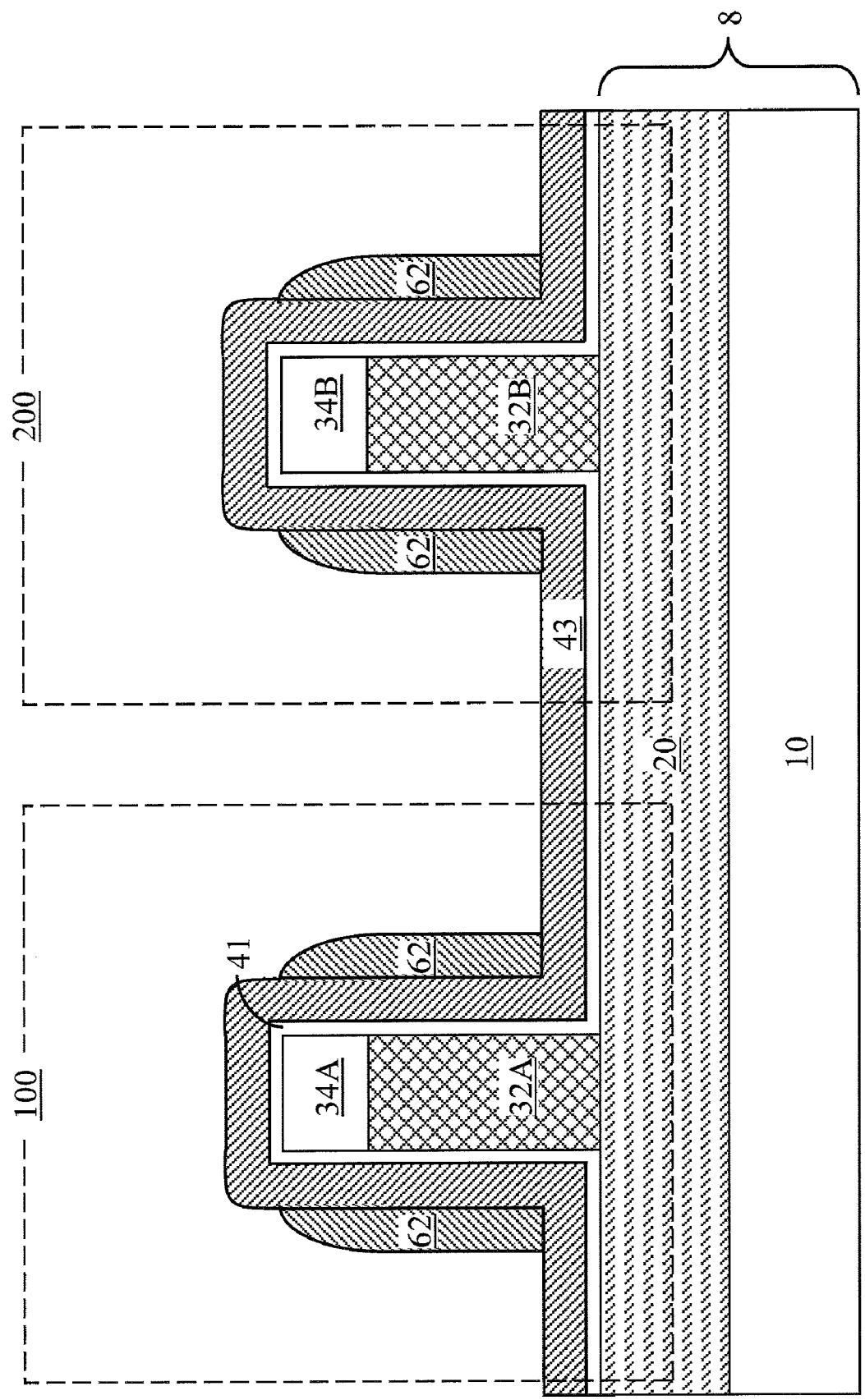
FIGS. 10A-15B are sequential views of a second exemplary semiconductor structure according to a second embodiment of the present invention. Figures with the same numeric label correspond to the same stage of manufacturing. Suffix conventions are the same as in FIGS. 1A-9B.
Figure 10B:
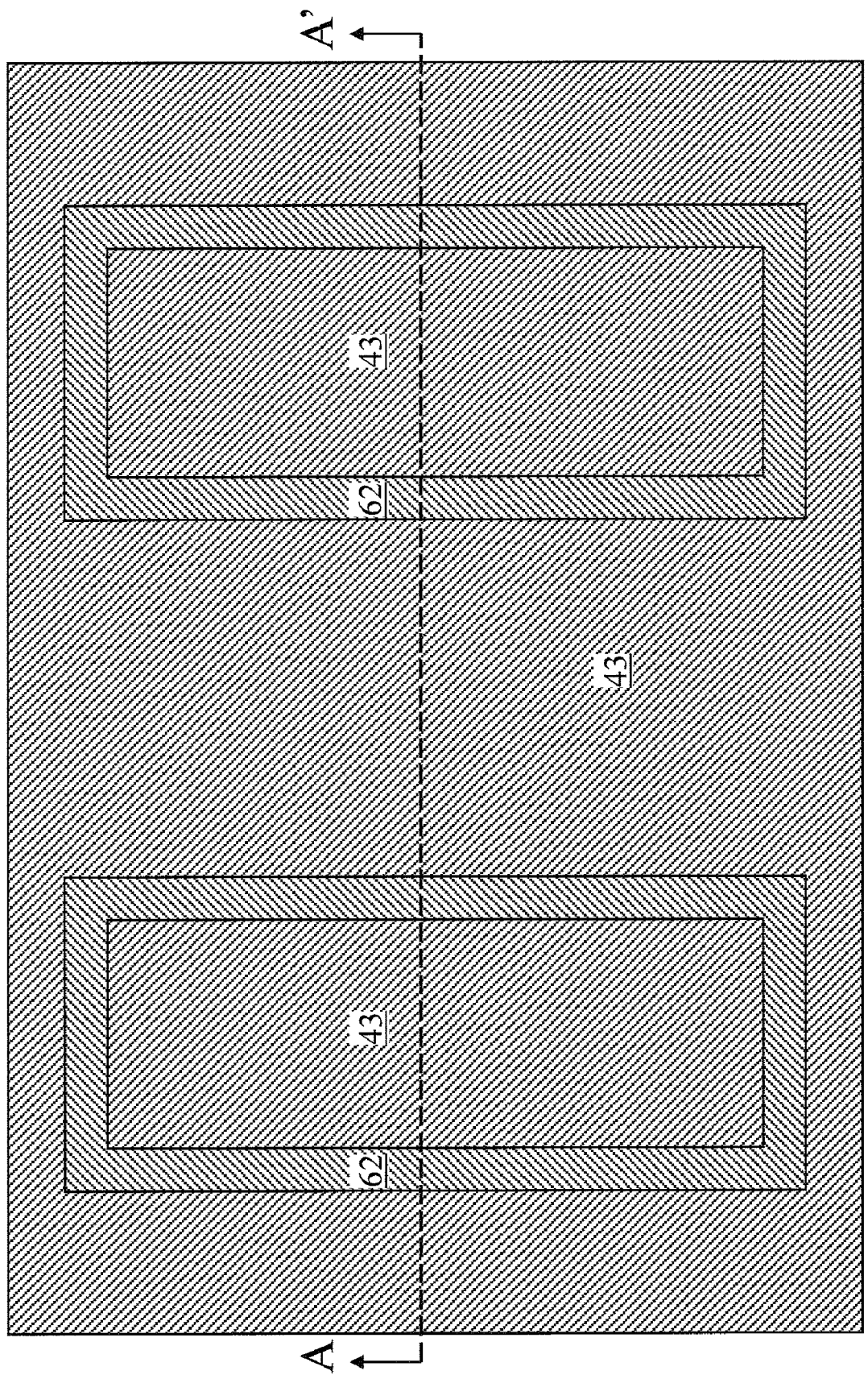

Referring to FIGS. 10A and 10B, a second exemplary semiconductor structure according to a second embodiment of the present invention is derived from the first exemplary semiconductor of FIGS. 2A and 2B by forming first fin spacers 62 on outer sidewalls of the first metal gate layer 43 in the first device region 100 and the second device region 200. The first fin spacers 62 are formed by a substantially conformal deposition of a layer followed by an anisotropic reactive ion etch. The first fin spacers 62 may comprise a conductive material, a semiconductor material, or a dielectric material. For example, the first fin spacers 62 may comprise polysilicon, silicon oxide, or silicon nitride. Each of the first fin spacers 62 has a shape that is topologically homeomorphic to a torus, i.e., forms a ring that encircles one of the first semiconductor fin 32A and the second semiconductor fin 32B.

Figure 11A:
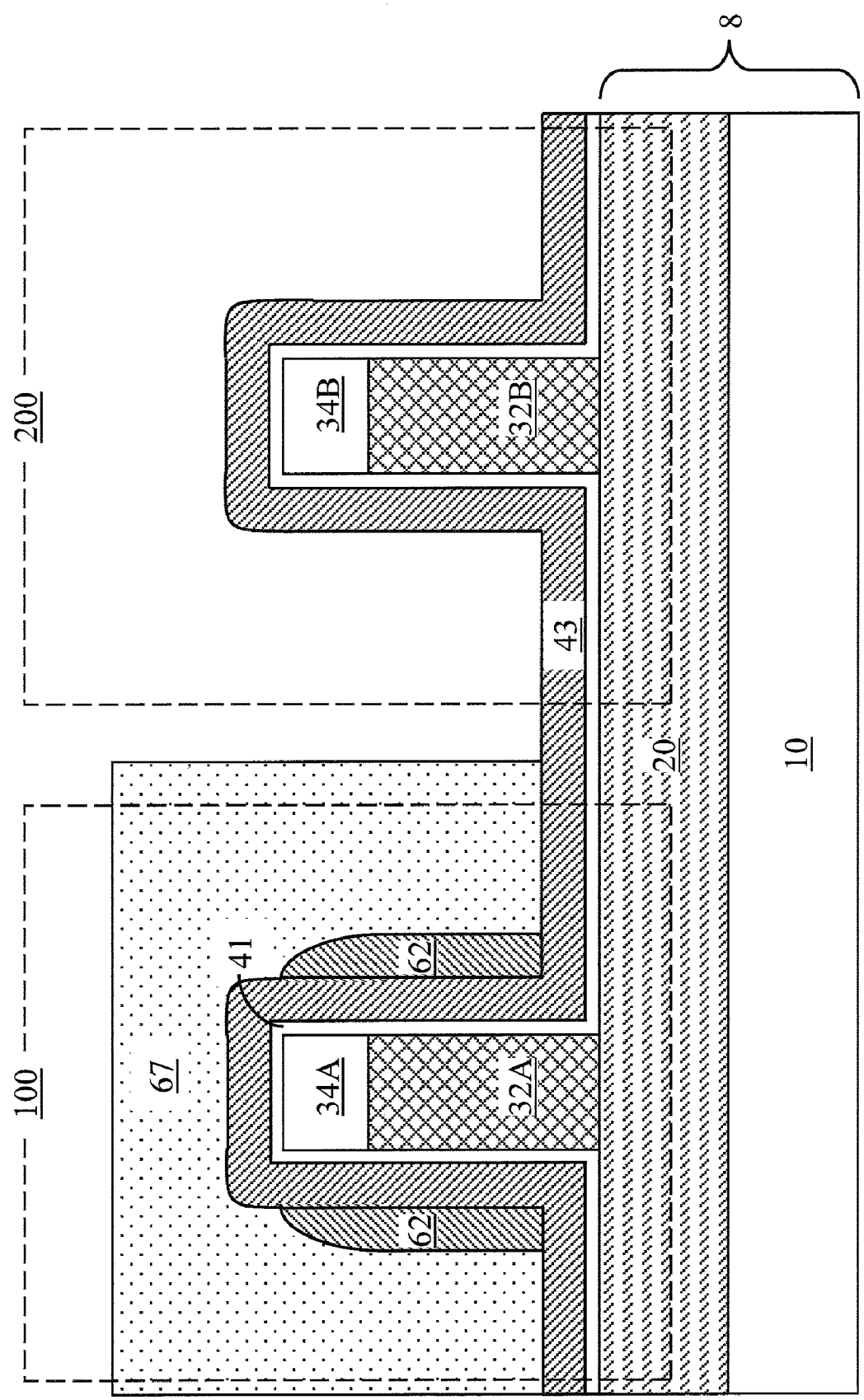
Figure 11B:
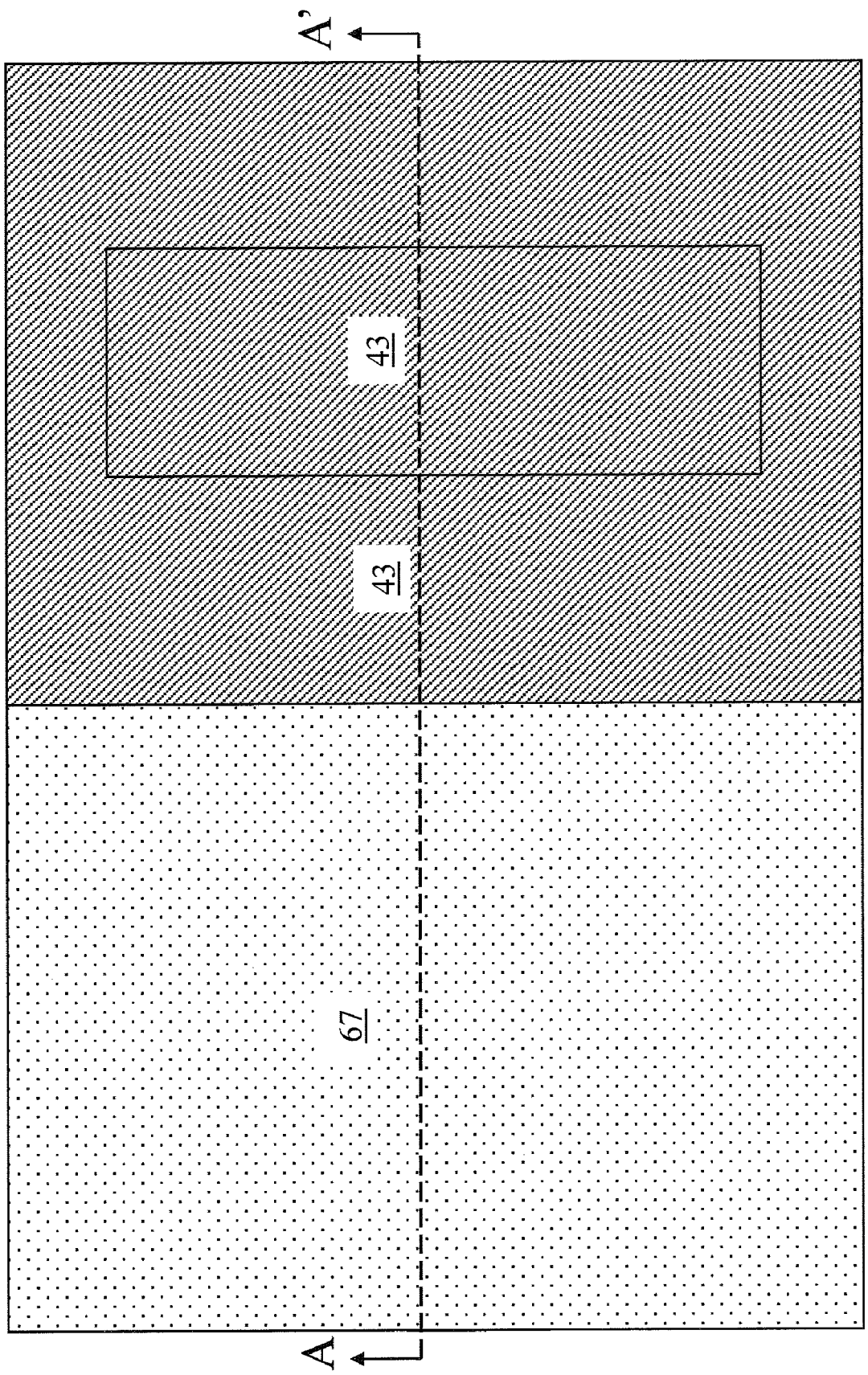

Referring to FIGS. 11A and 11B, a block level photoresist 67 is applied and patterned to mask the first device region 100, while exposing the second device region 200 using lithographic techniques known in the art. The exposed first fin spacer 62 located in the second device region 200 is removed by an etch, which may be a substantially isotropic dry etch, wet etch, or a combination of both. Use of an anisotropic etch is also contemplated herein.

Figure 12A:
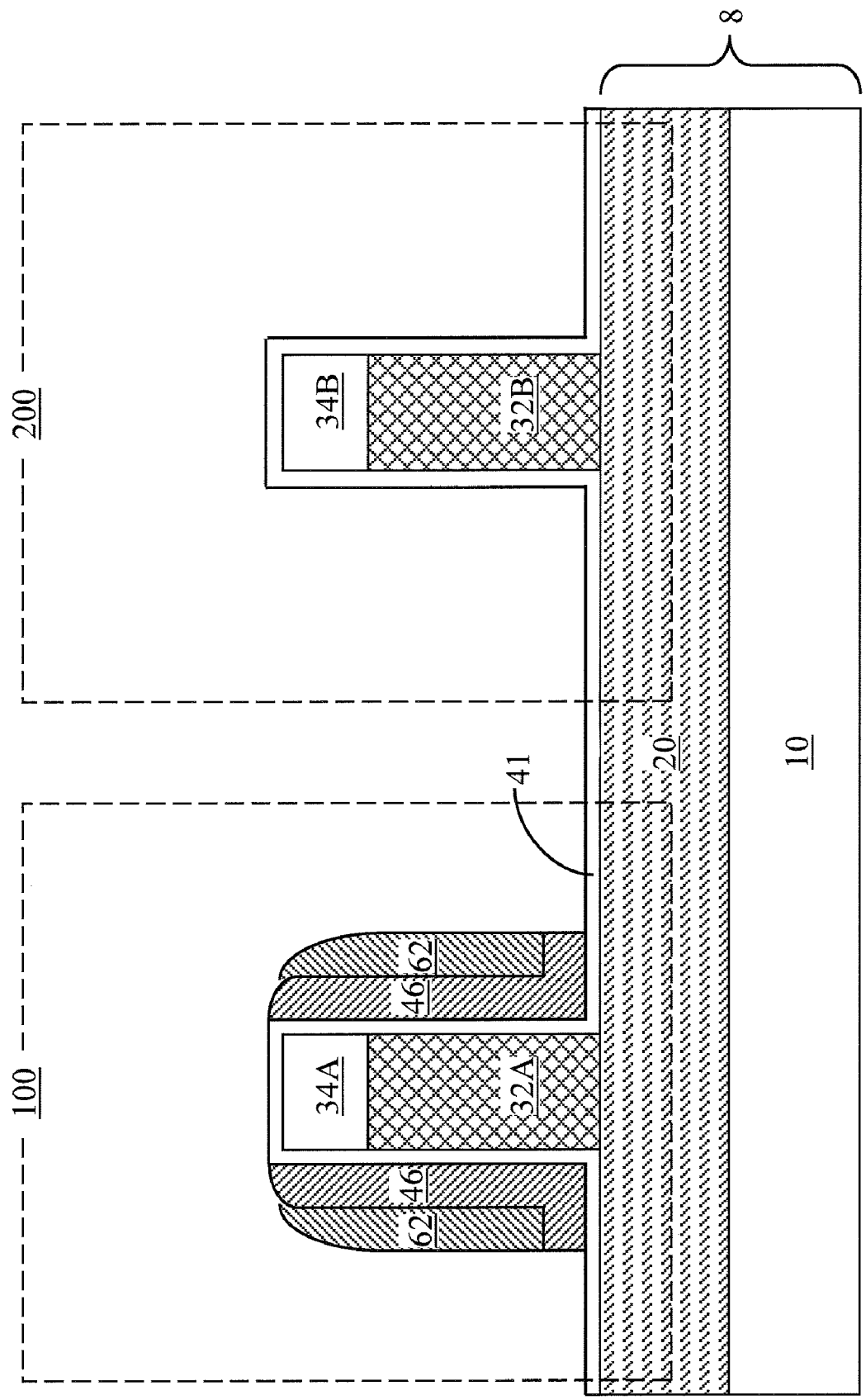
Figure 12B:
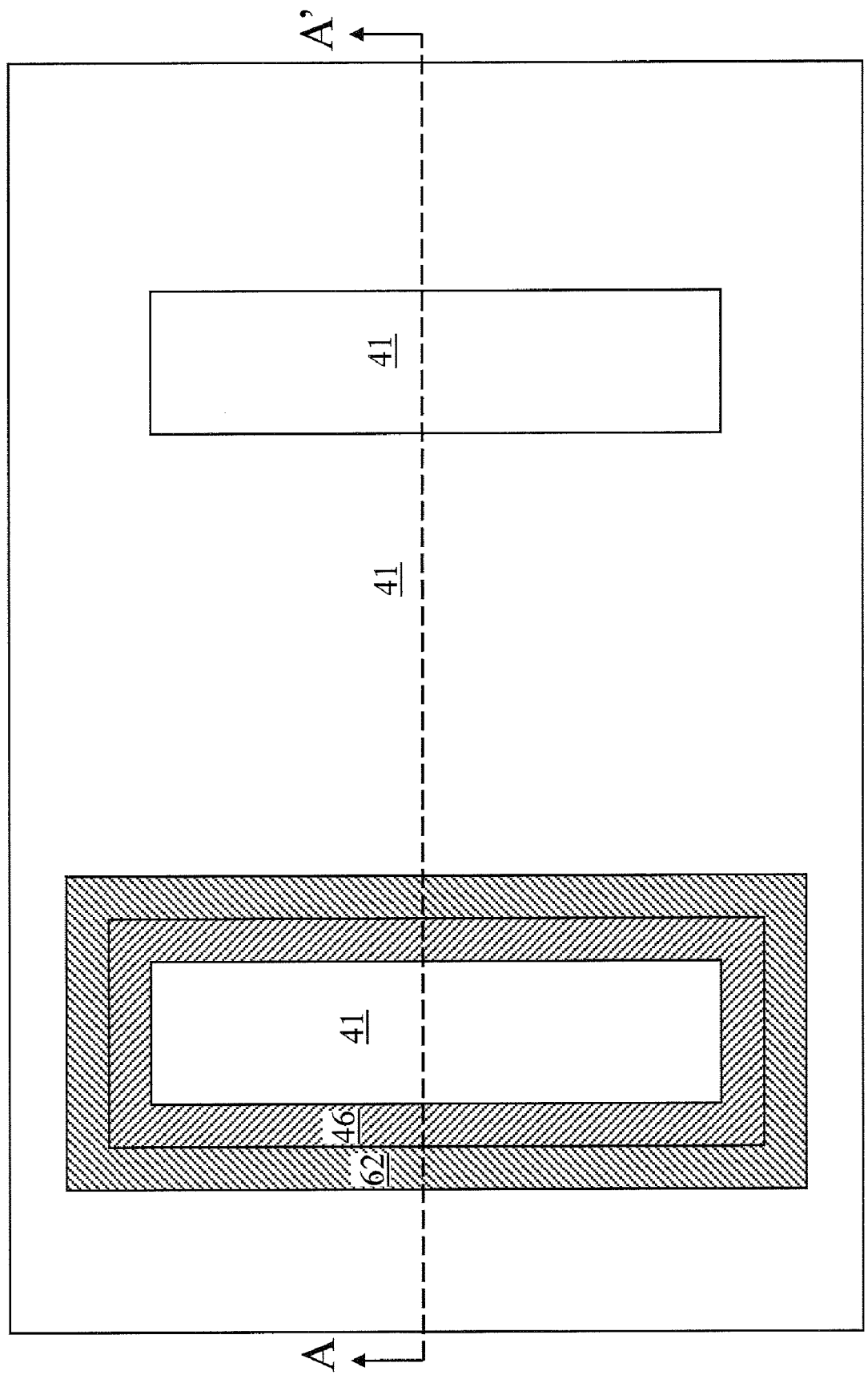

Referring to FIGS. 12A and 12B, exposed portions of the first metal gate layer 43 are removed by an etch. Preferably, the etch is a substantially isotropic etch such as a chemical dry etch or a wet etch. Use of an anisotropic etch is also contemplated herein. The etch is selective to the first high-k gate dielectric layer 41. The remaining portion of the first metal gate layer 42 constitutes a first metal gate ring 46. Due to the first fin spacer 62 on the first semiconductor fin 32A, a "foot," or a laterally protruding portion at a bottom, is formed on the first metal gate ring 46.

The first metal gate ring 46 laterally abuts outer sidewalls of the portion of the first high-k gate dielectric layer 41 on the first semiconductor fin 32A. Further, the first metal gate ring 46 has an L-shaped vertical cross-sectional area, and has a shape that is topologically homeomorphic to a torus, i.e., forms a ring that encircles the first semiconductor fin 32A.

Figure 13A:
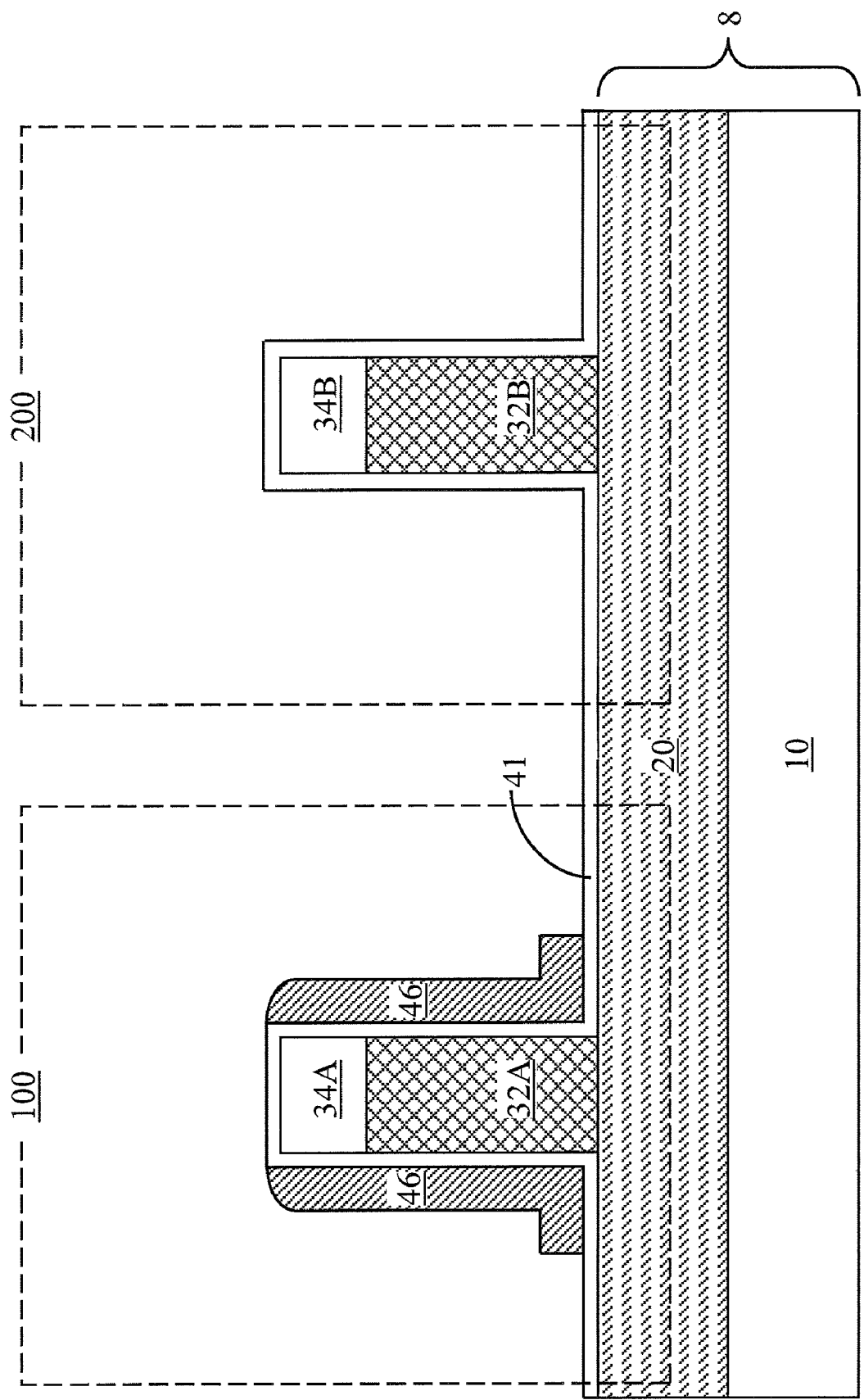
Figure 13B:
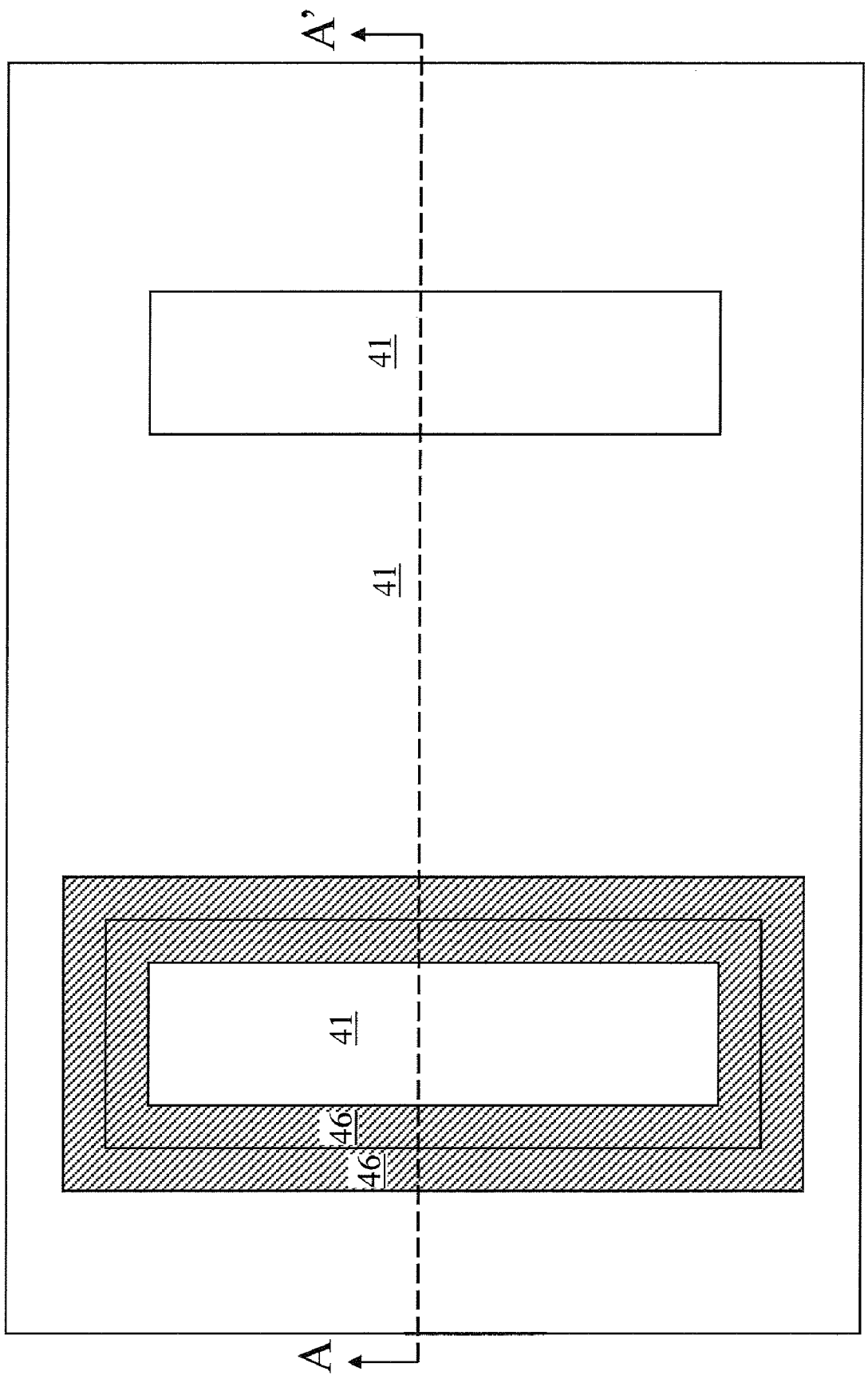

Referring to FIGS. 13A and 13B, the first fin spacer 62 is removed by an etch, which may be a substantially isotropic etch, that is selective to the first high-k gate dielectric layer 41 and the first metal gate ring 46. A suitable surface clean may be performed at this step.

Figure 14A:
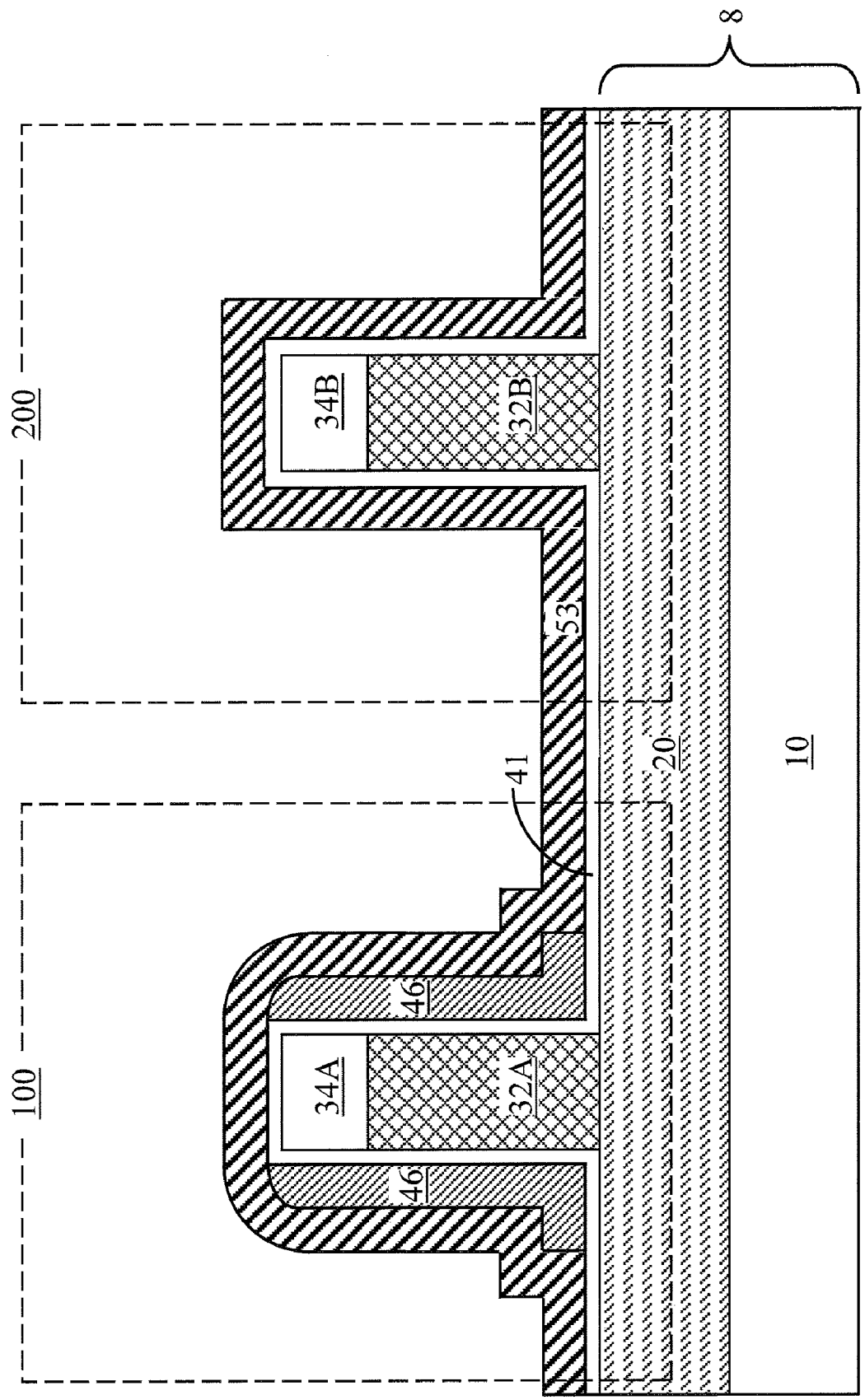
Figure 14B:
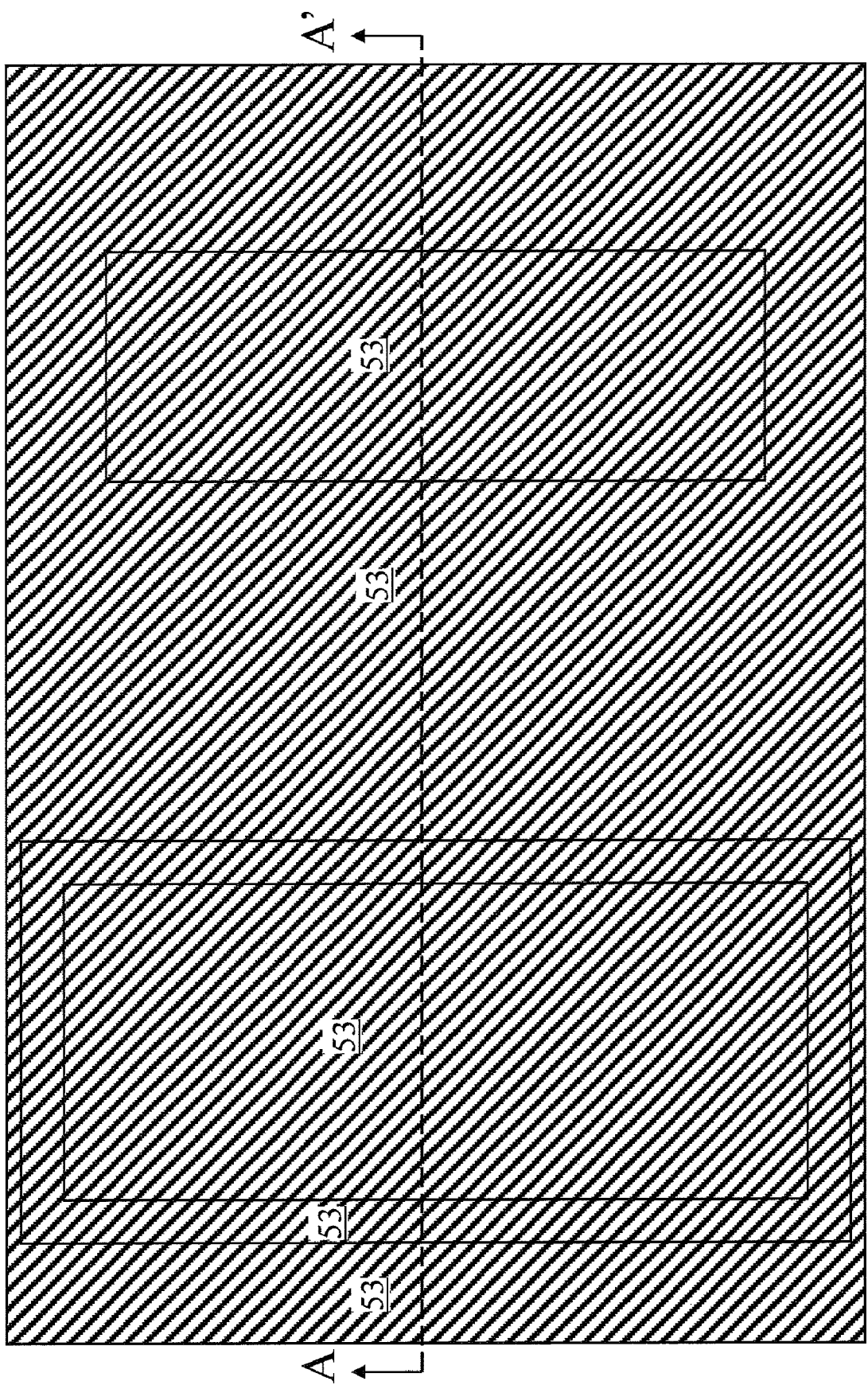

Referring to FIGS. 14A and 14B, a second metal gate layer 53 is formed on the first high-k gate dielectric layer 41 and the first metal gate ring 46. The composition and thickness of the second metal gate layer 53 may be the same as in the first embodiment.

Figure 15A:
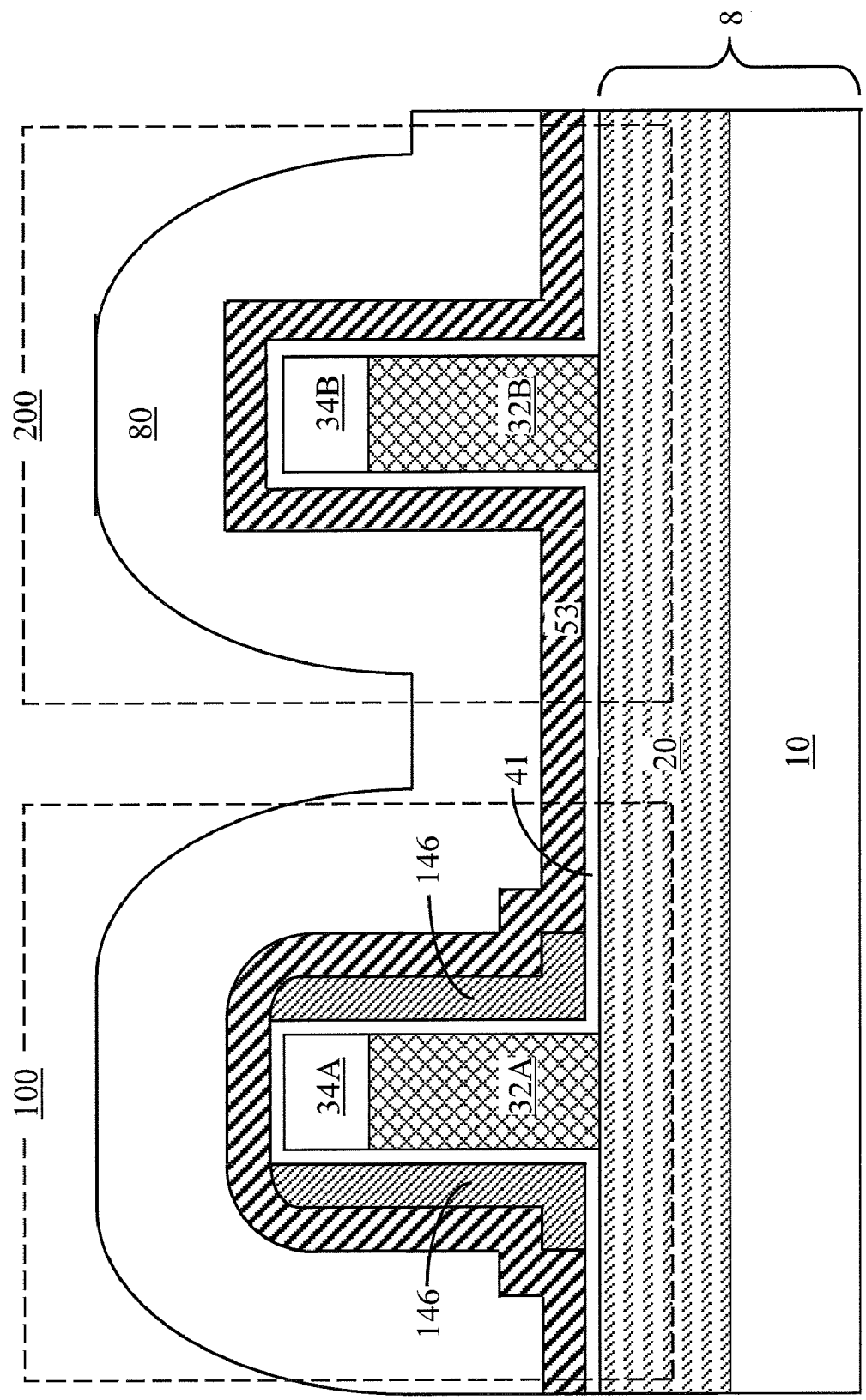
Figure 15B:
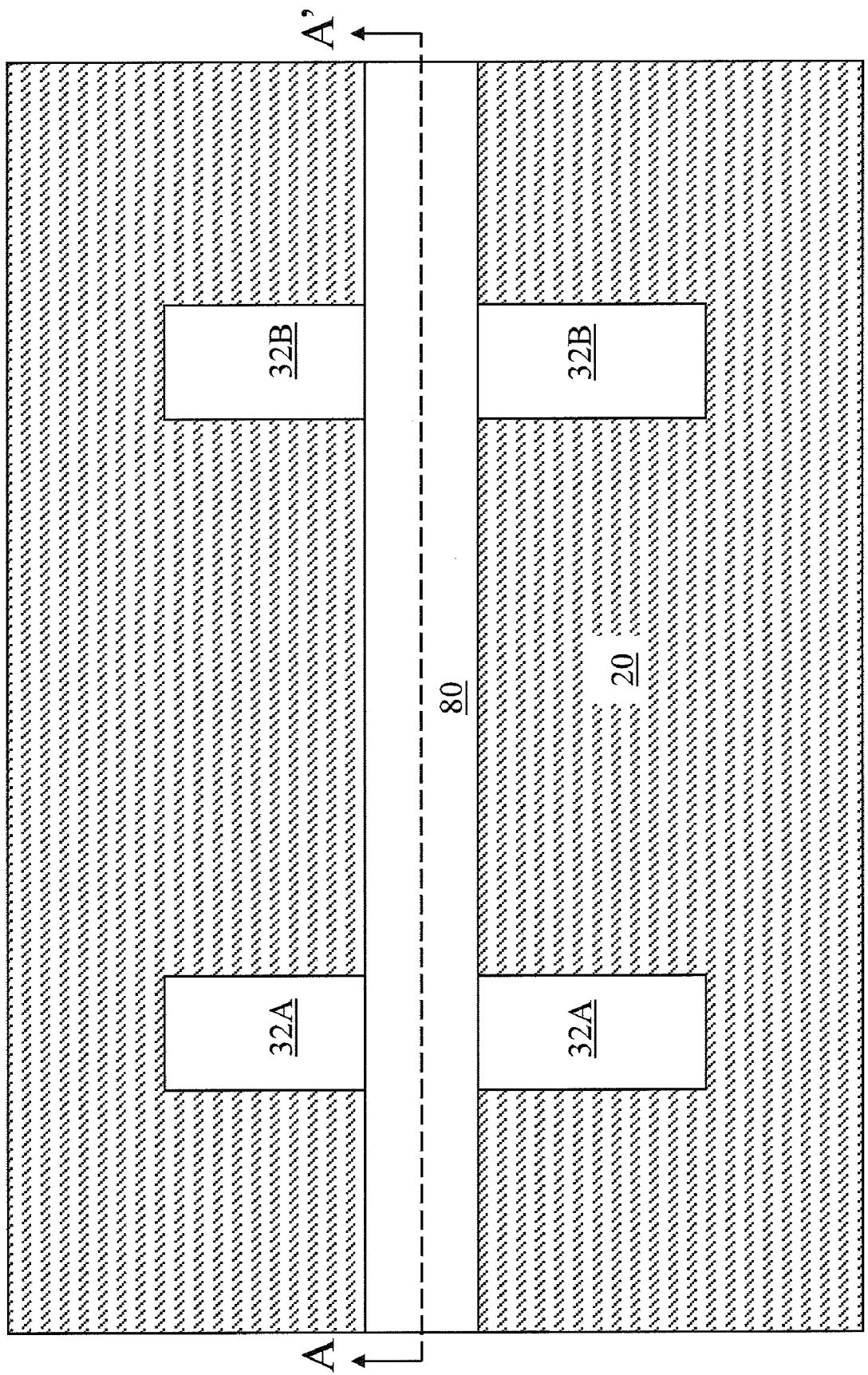

Referring to FIGS. 15A and 15B, a silicon containing layer (not shown) having the same composition as in the first embodiment is deposited on the second metal gate layer 53 (See FIG. 14A) employing the same methods as in the first embodiment.

The silicon containing gate line 80 is formed by lithographically pattering the silicon containing layer employing techniques known in the art. The silicon containing gate line 80 intersects the first and second semiconductor fins (32A, 32B) in a top-down view. Further, another etch, which may be a reactive ion etch, removes exposed portions of the second metal gate layer 53, the first metal gate ring 46 (See FIG. 14A), and the first high-k gate dielectric layer 41 (See FIG. 8A) from outside the area covered by the silicon containing gate line 80 in a top-down view.

Two remaining disjoined portions of the first metal gate ring 44 constitute a first metal gate 144. A portion of the silicon containing gate line 80 in the first device region 100, a portion of the second metal gate layer 53 in the first device region 100, and the first metal gate 144 collectively constitute a first gate electrode controlling a current flow in the first semiconductor fin 32A. Another portion of the silicon containing gate line 80 in the second device region 200 and another portion of the second metal gate layer 53 in the second device region 200 collectively constitute a second gate electrode controlling a current flow in the second semiconductor fin 32B.

The rest of the processing sequence for forming a first finFET in the first device region 100 and a second finFET in the second device region 200 is the same as in the first embodiment. Preferably, the first finFET and the second finFET are of opposite conductivity types. Only one high-k gate dielectric layer, i.e., the first high-k gate dielectric layer 41, is employed in the second exemplary semiconductor structure. The first conductive metallic material and the second conductive metallic material may be selected independent of etch other as in the first embodiment.

Figure 16A:
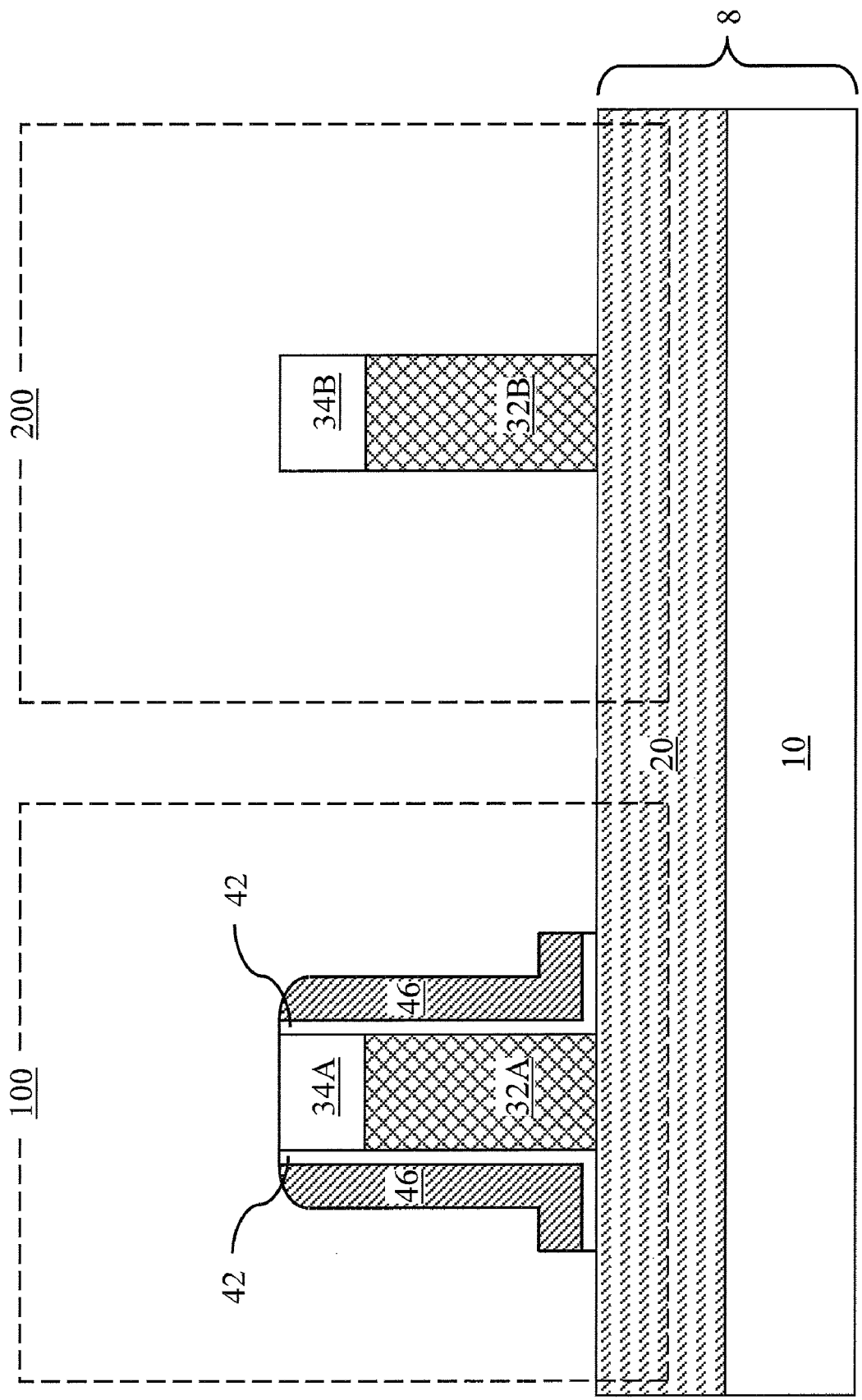
FIGS. 16A-21B are sequential views of a third exemplary semiconductor structure according to a third embodiment of the present invention. Figures with the same numeric label correspond to the same stage of manufacturing. Suffix conventions are the same as in FIGS. 1A-9B.
Figure 16B:
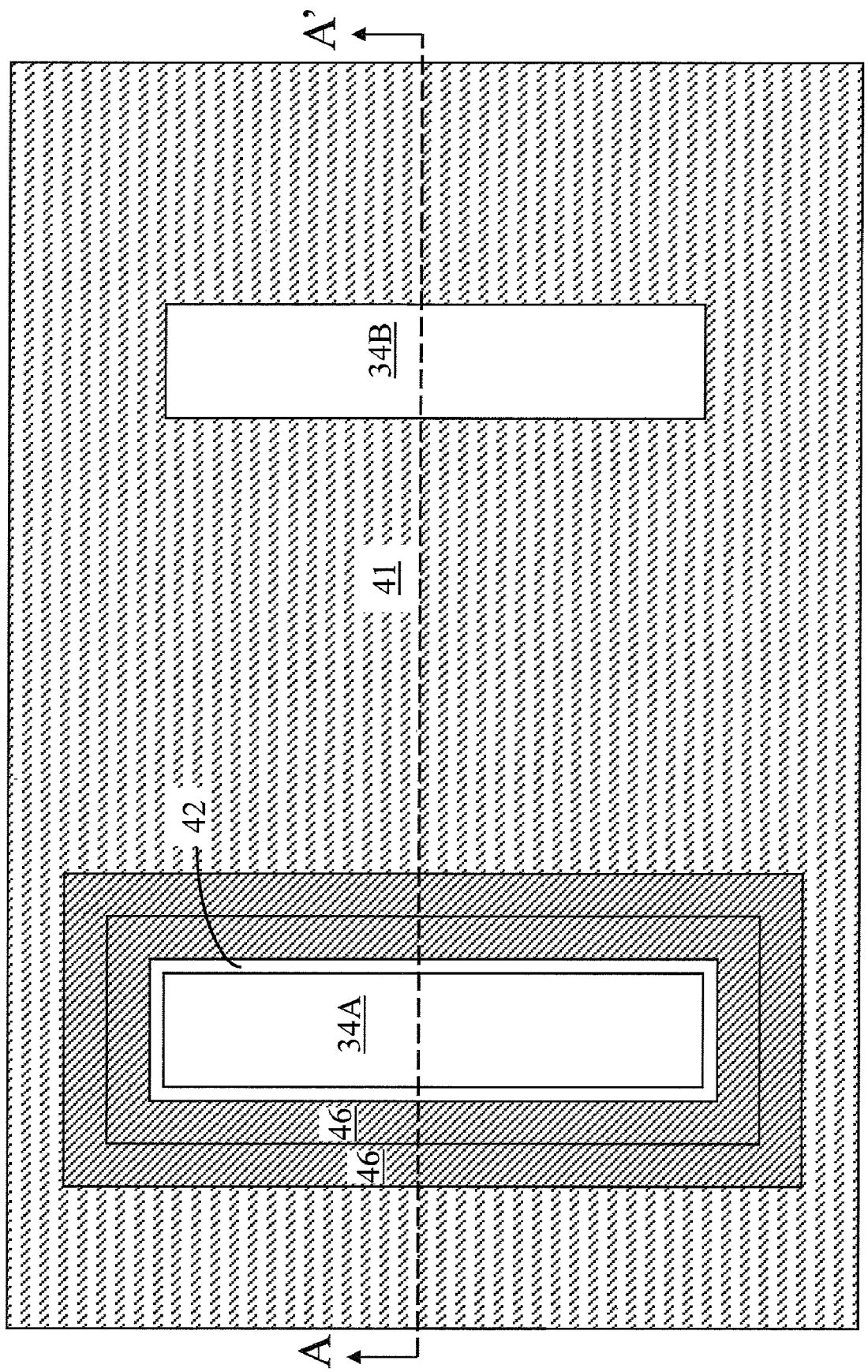

Referring to FIGS. 16A and 16B, a third exemplary semiconductor structure according to a third embodiment of the present invention is derived the second semiconductor structure of FIGS. 13A and 13B by removing exposed portions of the first high-k electric layer 41, for example, by a substantially isotropic etch. The substantially isotropic etch may be a chemical dry etch or a wet etch. Use of a reactive ion etch is also contemplated herein.

Figure 17A:
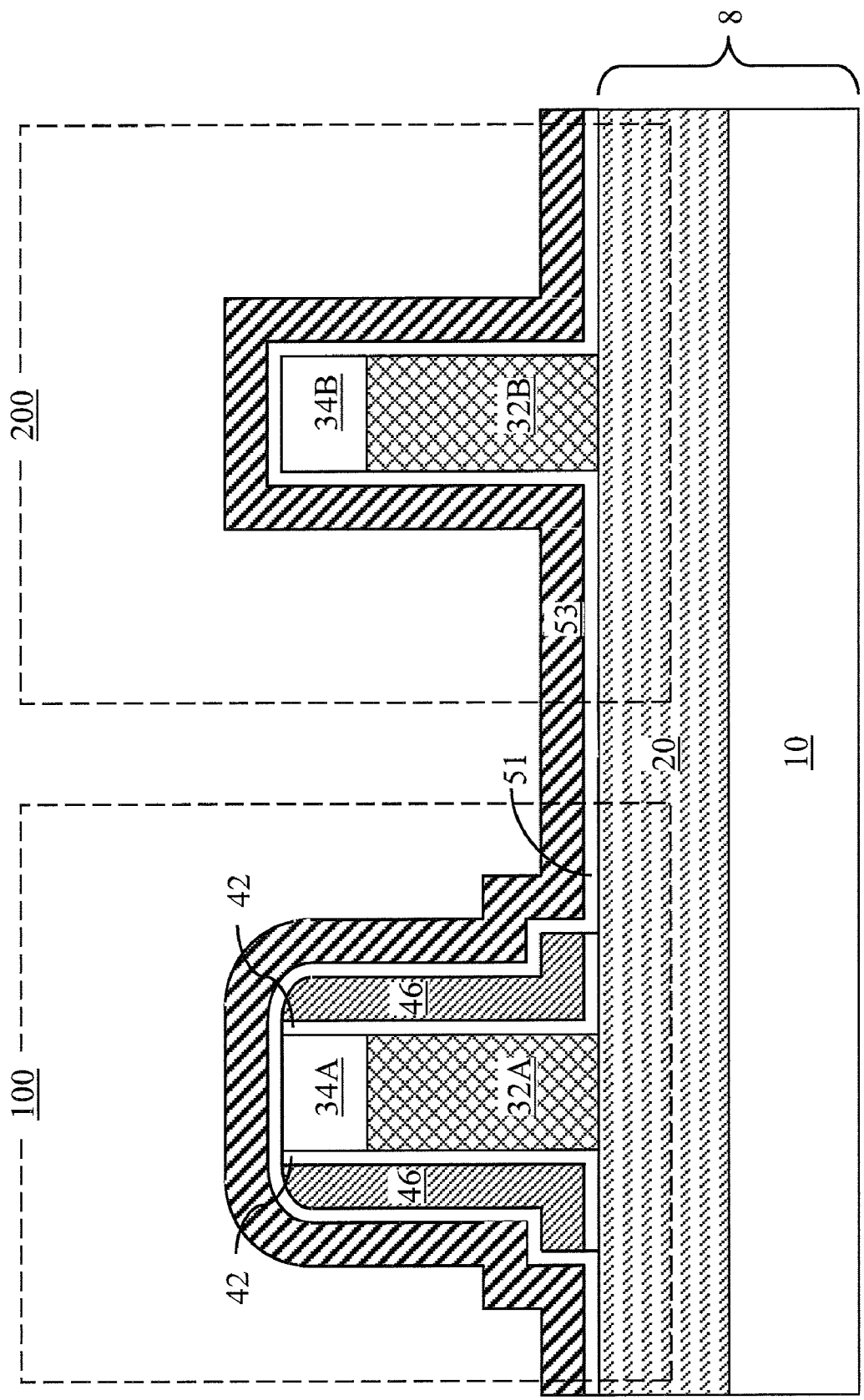
Figure 17B:
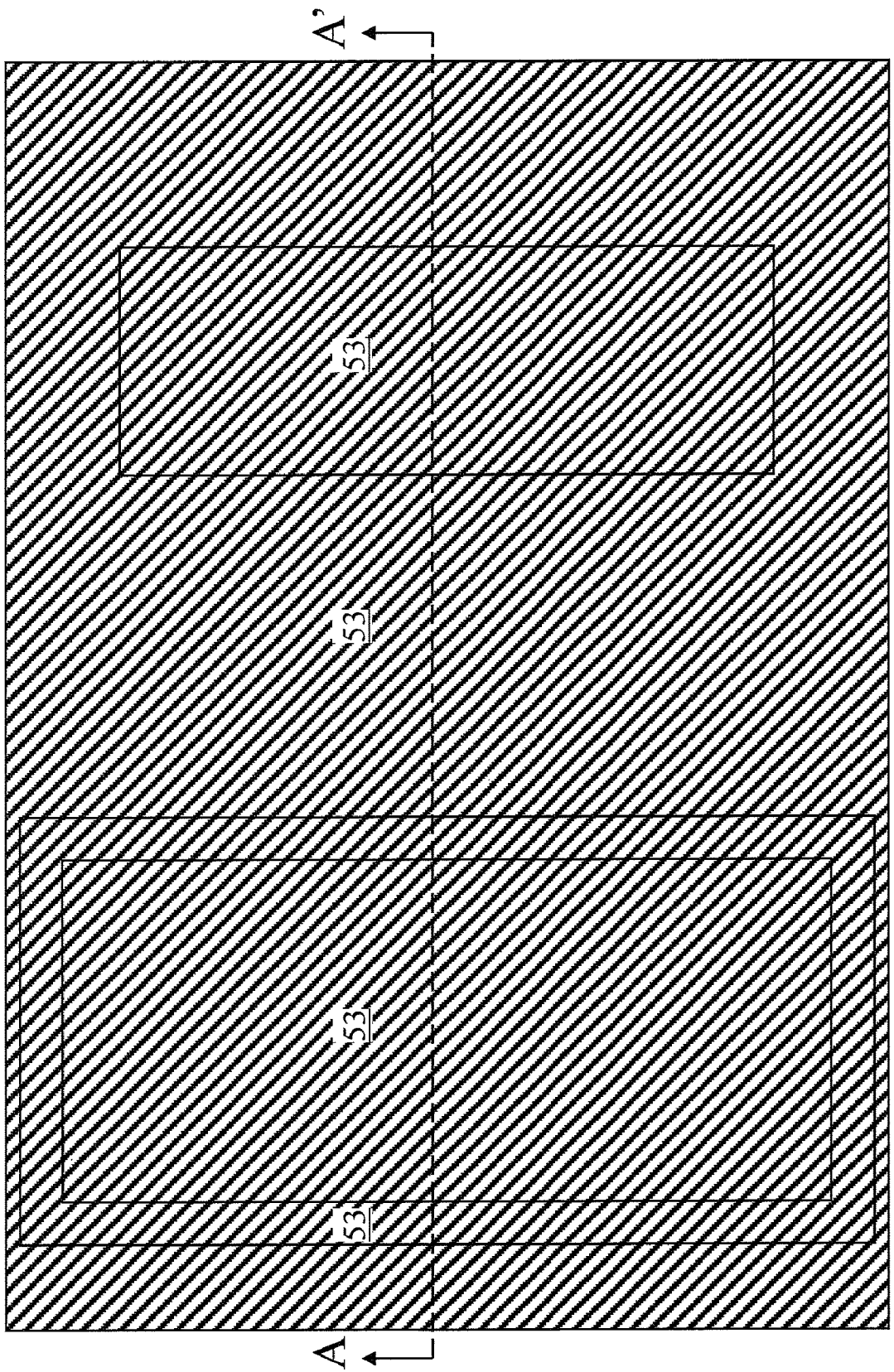

Referring to FIGS. 17A and 17B, a second high-k gate dielectric layer 51 is formed directly on sidewalls of the second semiconductor fin 32B, the second fin cap 34B, the first metal gate ring 46, a top surface of the first fin cap 34A, exposed portions of the first high-k gate dielectric ring 42, and the insulator layer 20. A second metal gate layer 53 is formed directly on the second high-k gate dielectric layer 51. The second high-k gate dielectric layer 51 and the second metal gate layer 53 have the same composition and thickness as in the first embodiment.

Figure 18A:
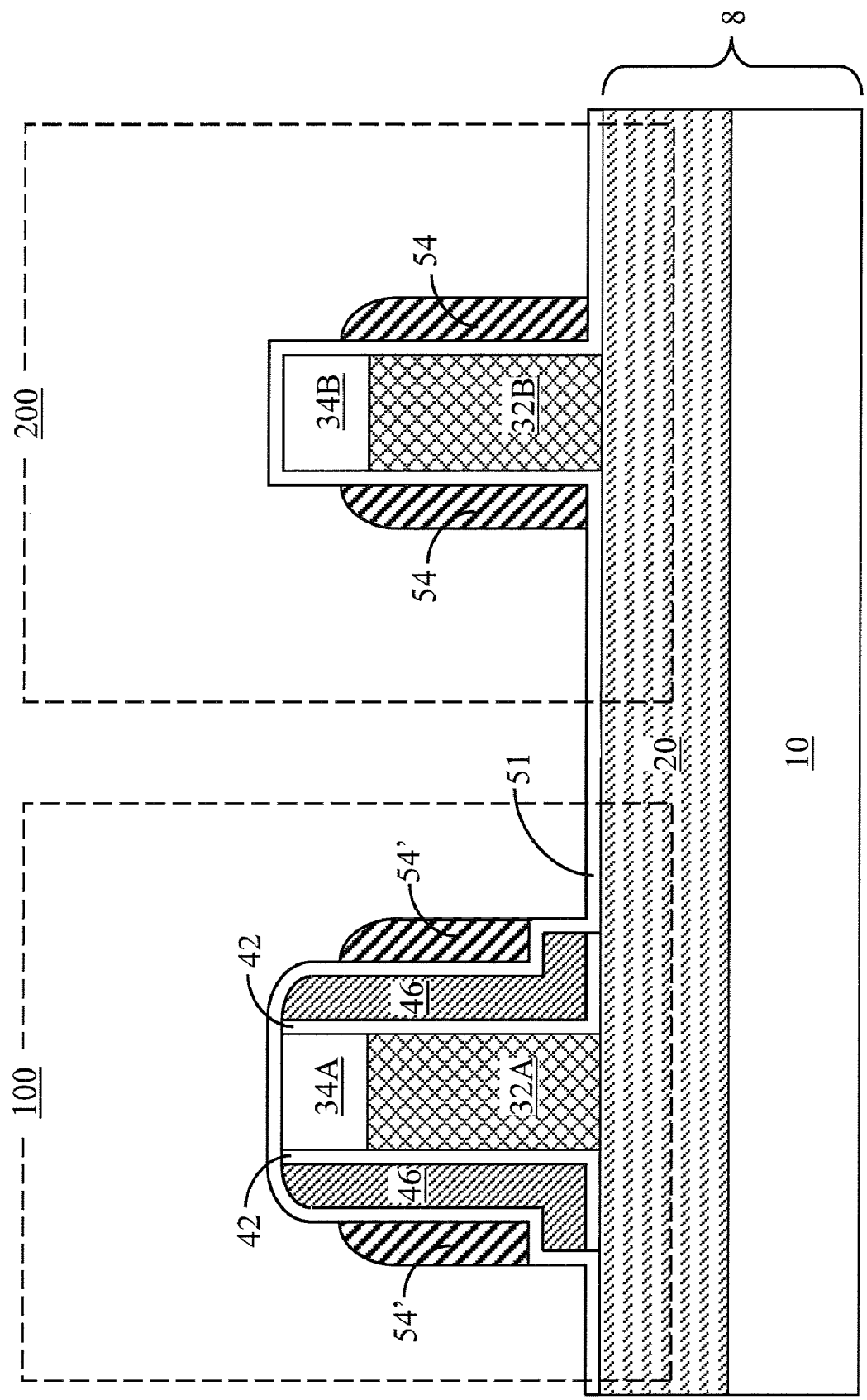
Figure 18B:
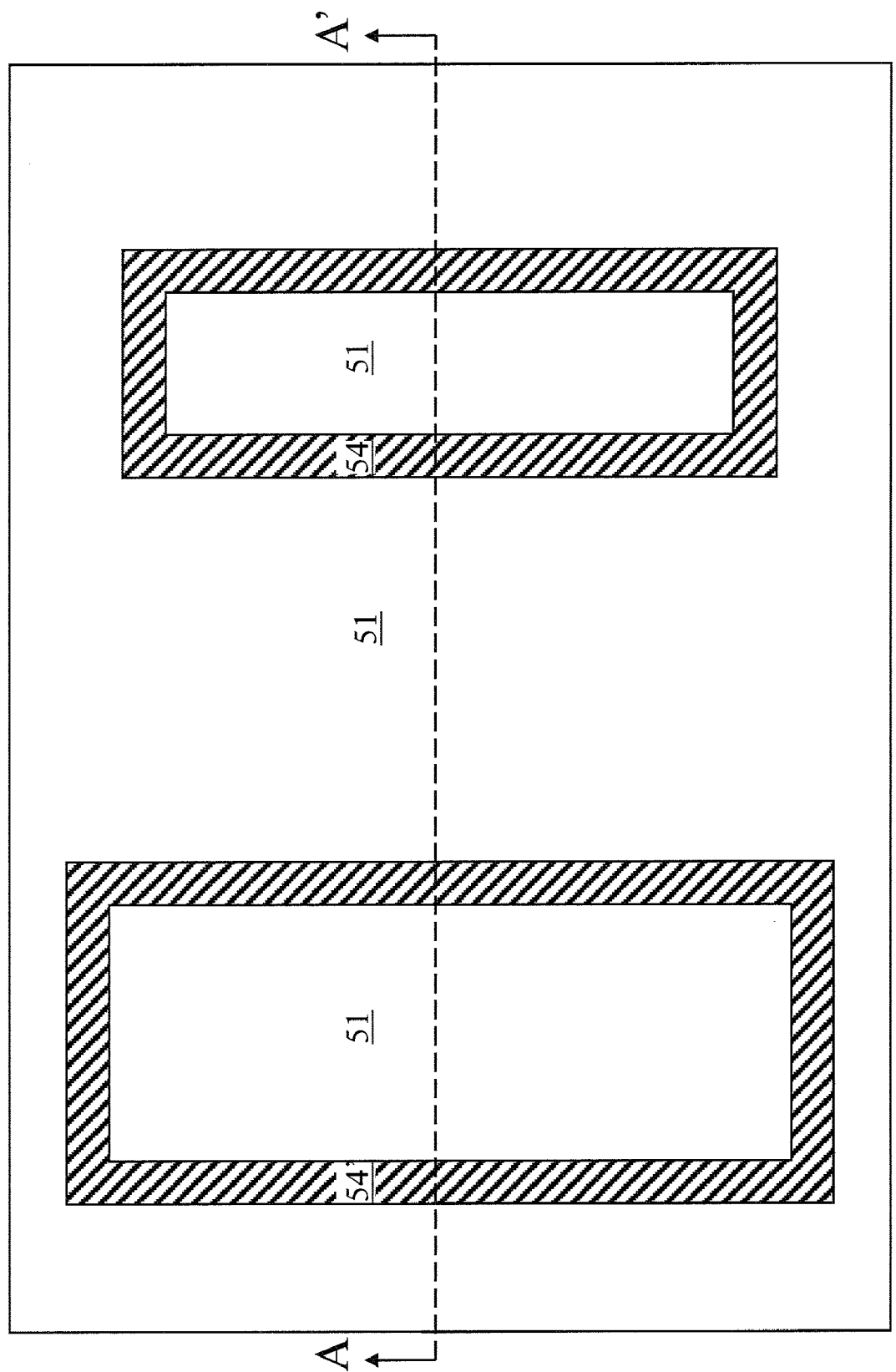

Referring to FIGS. 18A and 18B, an anisotropic reactive ion etch is performed on the second metal gate layer 53 to form a second metal gate ring 54 on the second semiconductor fin 32B in the first device region 200 and another second metal gate ring 54' on the first semiconductor fin 32A in the first device region 100. The anisotropic reactive ion etch may, or may not, be selective to the second high-k gate dielectric layer 51. The second metal gate rings (54, 54') surround and laterally abut the second high-k gate dielectric layer 51.

Figure 19A:
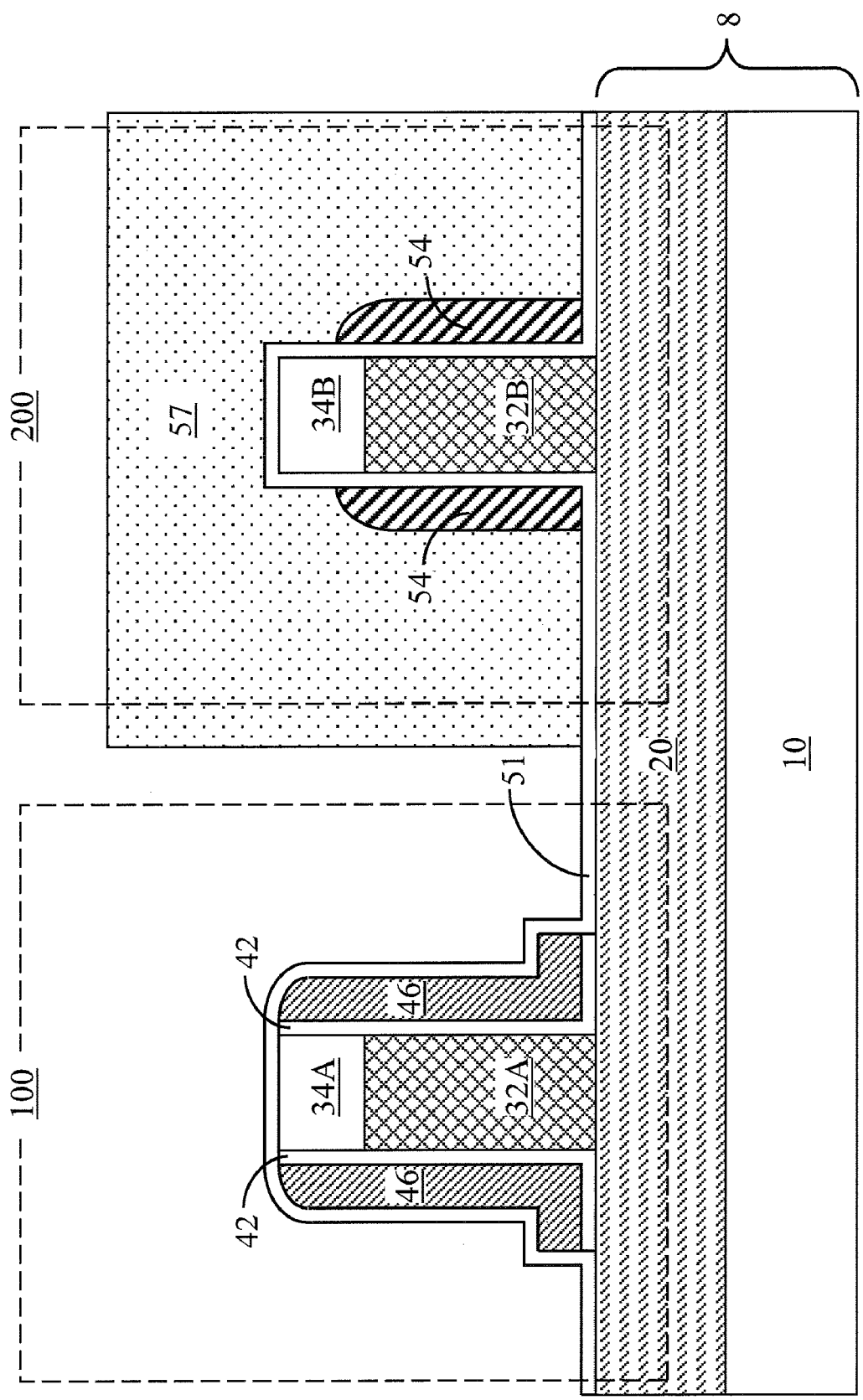

Referring to FIGS. 19A and 19B, a second photoresist 57 and a second block mask (not shown) are employed to mask the second device region 200, while exposing the first device region 100 using lithographic techniques known in the art. The another second metal gate ring 54' surrounding the first semiconductor fin 32A are removed by an etch, which may be a substantially isotropic dry etch, wet etch, or a combination of both. Use of an anisotropic etch is also contemplated herein. The etch may, or may not, be selective to the second high-k gate dielectric layer 51. The second photoresist 57 is subsequently removed. A suitable surface clean is performed as needed.

Figure 20A:
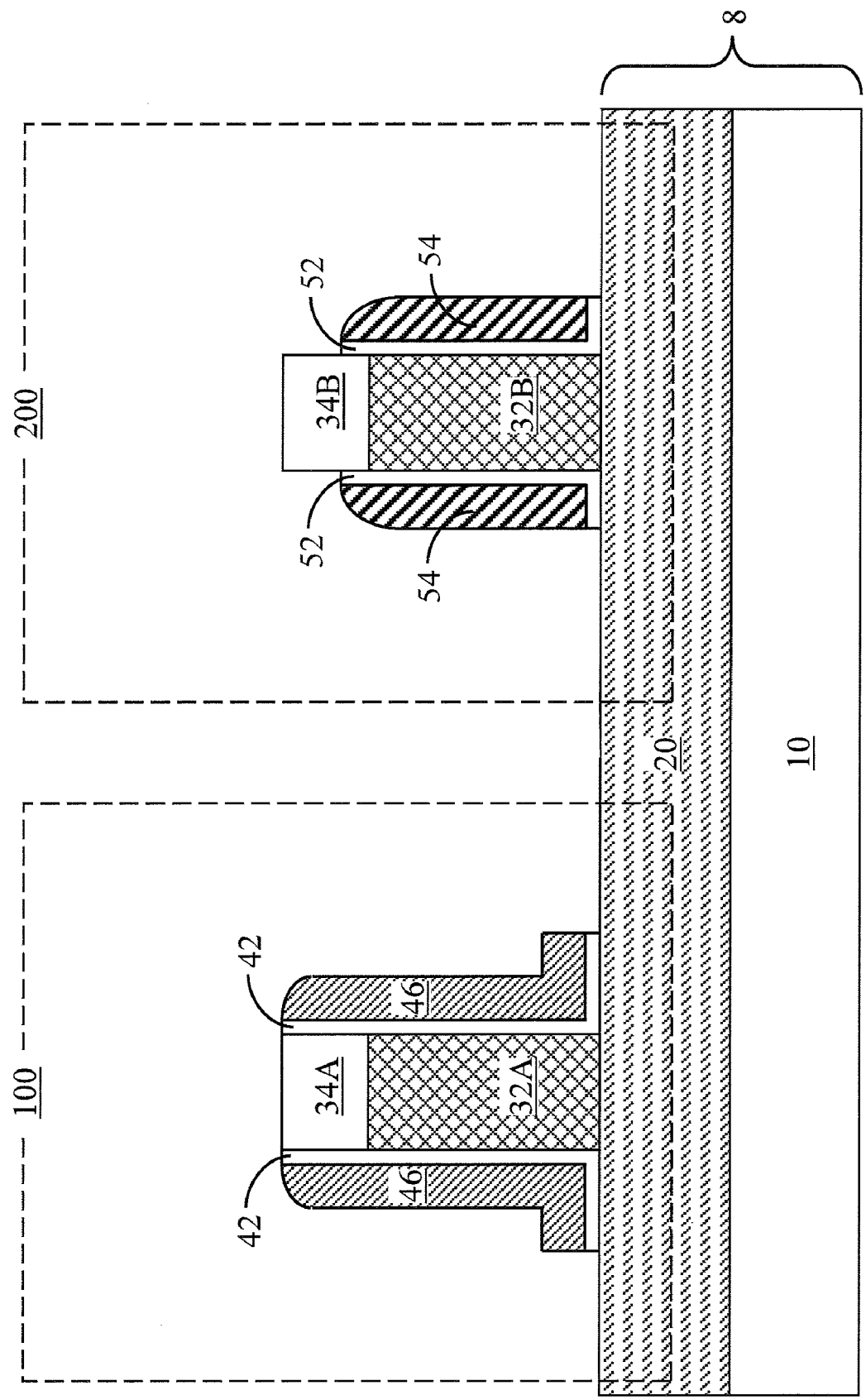
Figure 20B:
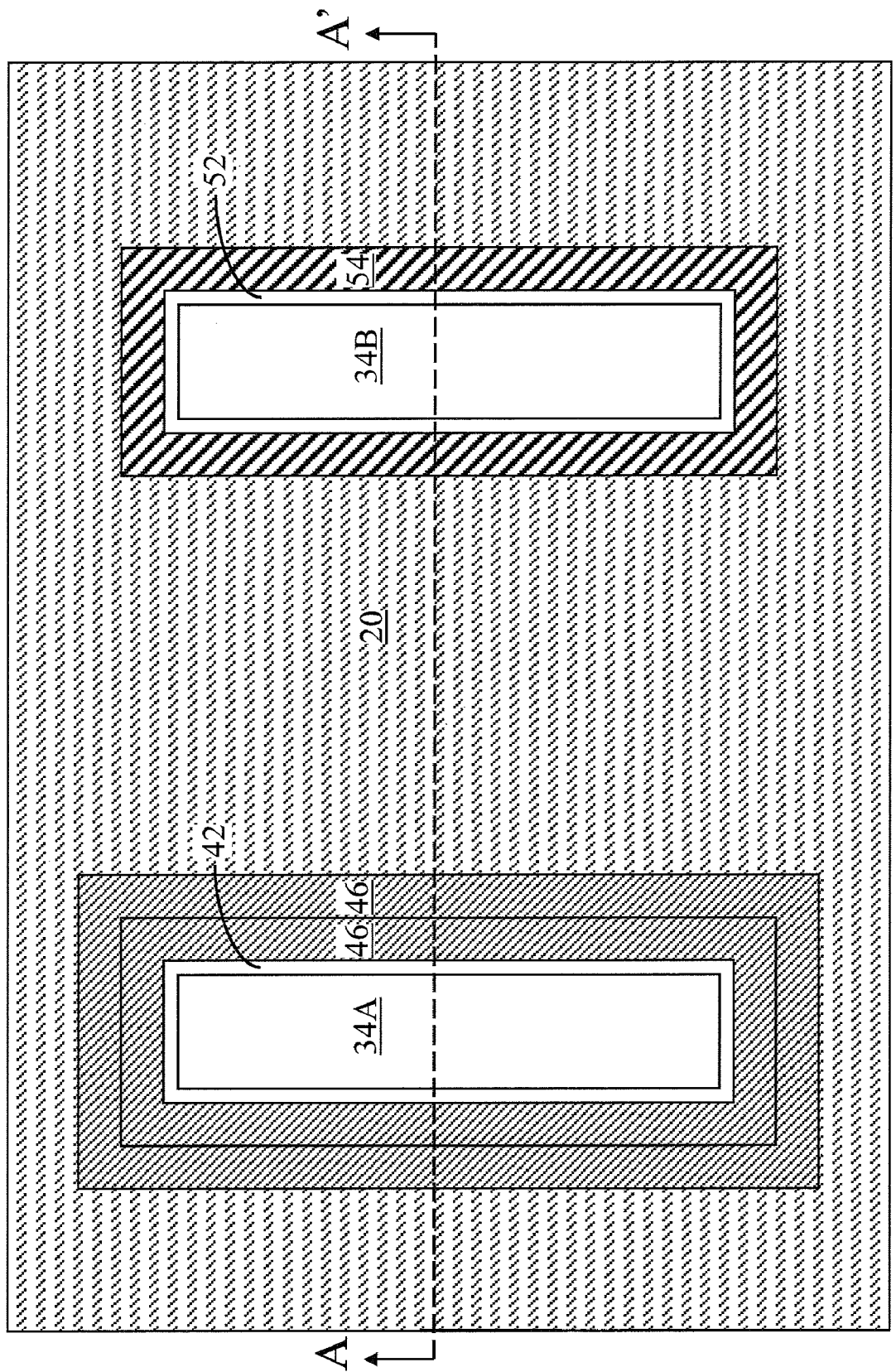

Referring to FIGS. 20A and 20B, any remaining exposed portions of the second high-k gate dielectric layer 51 are removed by an etch, which may be a substantially isotropic dry etch, wet etch, or a combination of both. A second high-k gate dielectric ring 52 is formed from a remaining portion of the second high-k gate dielectric layer 51 in the second device region 200. The second high-k gate dielectric ring 52 in the second device region 200 laterally abuts sidewalls of the second semiconductor fin 32B and sidewalls of the second fin cap 34B. Further, the second gate dielectric rings 52 vertically abuts the insulator layer 20. The second gate dielectric rings 52 has an L-shaped vertical cross-sectional area, and has a shape that is topologically homeomorphic to a torus, i.e., forms a ring that encircles the second semiconductor fin 32B.

The second metal gate ring 54 in the second device region 200 laterally abuts outer sidewalls of the second high-k gate dielectric ring 54, vertically abuts a top surface of a laterally protruding bottom portion of the second high-k gate dielectric ring 54, and has a shape that is topologically homeomorphic to a torus, i.e., forms another ring that encircles the second semiconductor fin 32B.

Figure 21A:
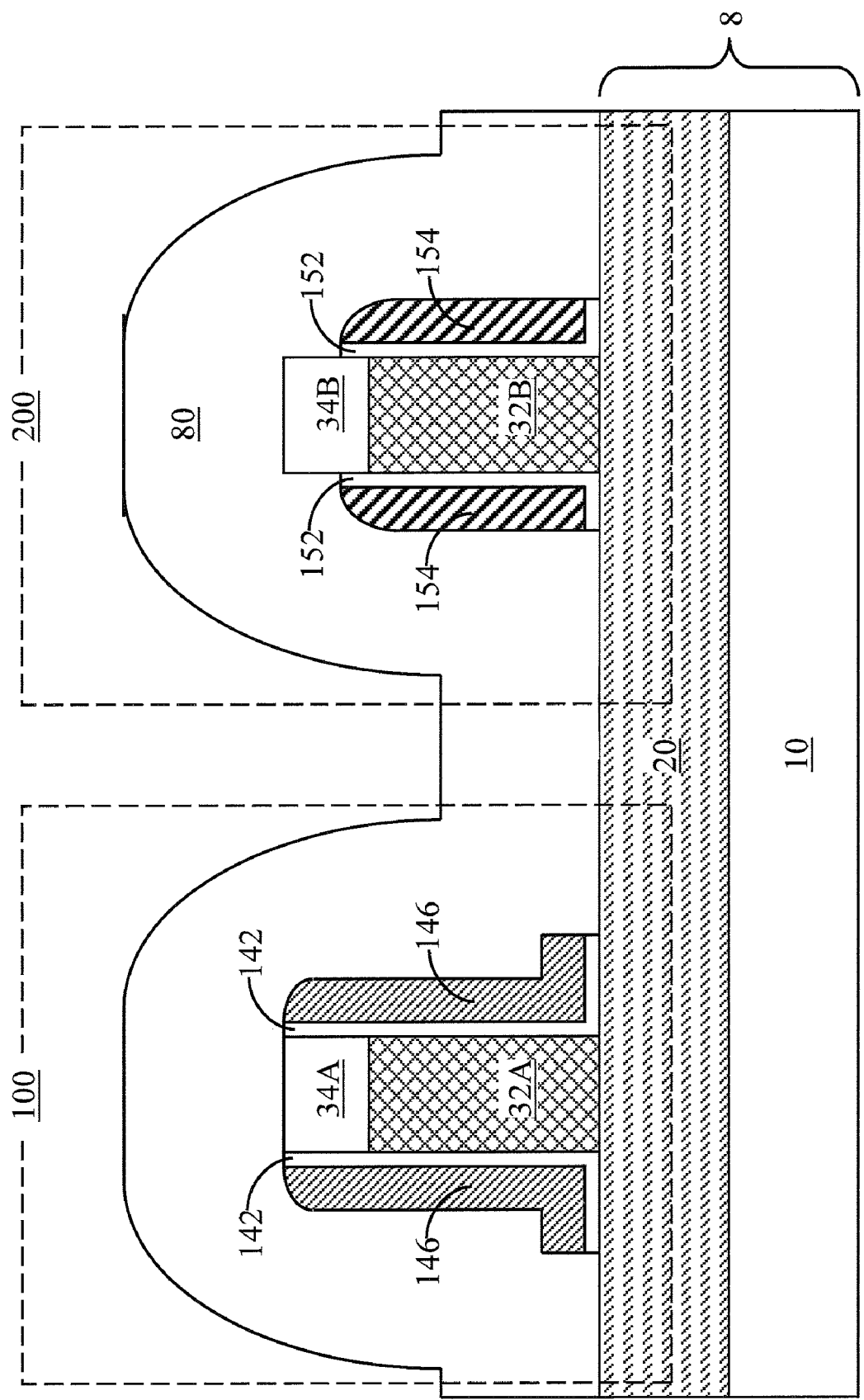
Figure 21B:
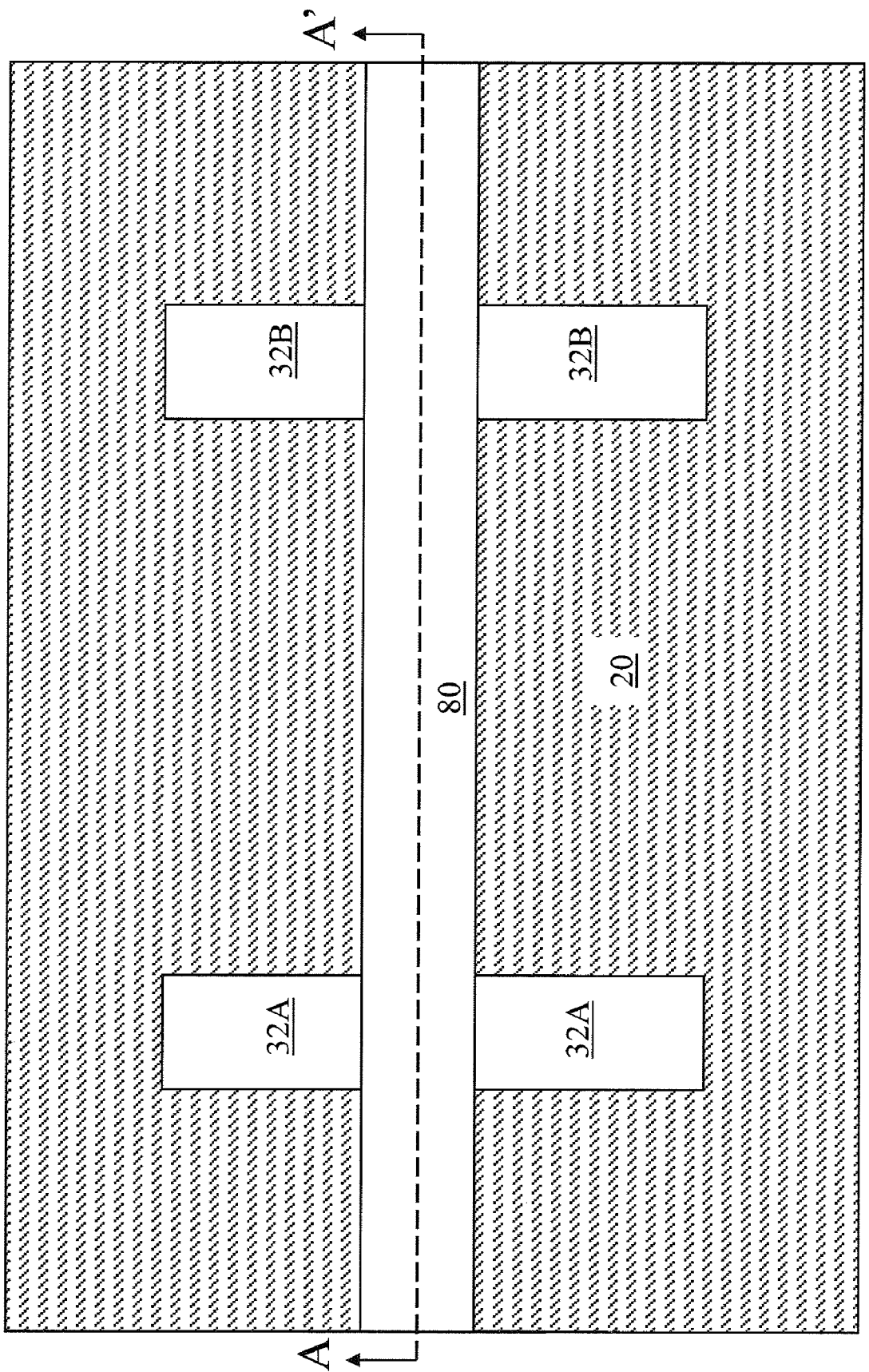

Referring to FIGS. 21A and 21B, a silicon containing layer (not shown) is deposited and lithographically patterned as in the first embodiment to form a silicon containing gate line 80. The composition of the silicon containing layer and the silicon containing gate line 80 may be the same as in the first embodiment. The silicon containing gate line 80 intersects the first and second semiconductor fins (32A, 32B) in a top-down view as in the first embodiment. Exposed portions of the first metal gate ring 44 (See FIG. 20A), the second metal gate ring 54 (See FIG. 20A), the first high-k gate dielectric ring 42 (See FIG. 20A), and the second high-k gate dielectric ring 52 (See FIG. 20A) are removed from outside the area covered by the silicon containing gate line 80 in the top-down view as in the first embodiment.

Two remaining disjoined portions of the first metal gate ring 46 constitute a first metal gate 146, which has an L-shaped vertical cross-sectional area. A second metal gate 154, a first high-k gate dielectric 142, and a second high-k gate dielectric 152 are formed as in the first embodiment. The rest of the processing sequence for forming a first finFET in the first device region 100 and a second finFET in the second device region 200 is the same as in the first embodiment. Preferably, the first finFET and the second finFET are of opposite conductivity types. The third exemplary semiconductor structure allows independent selection of the first high-k dielectric material and the second high-k dielectric material to optimized performance of the first and second finFETs. Also, the third exemplary semiconductor structure allows independent selection of the first conductive metallic material and the second conductive metallic material to optimized performance of the first and second finFETs. As in the first embodiment, the third exemplary further provides a gate wiring located between the first device region 100 and the second device region 200 and containing yet another portion of the silicon containing gate liner 80 which vertically abuts the insulator layer 20. High-k gate dielectric materials are not present in the gate wiring.

Figure 22A:
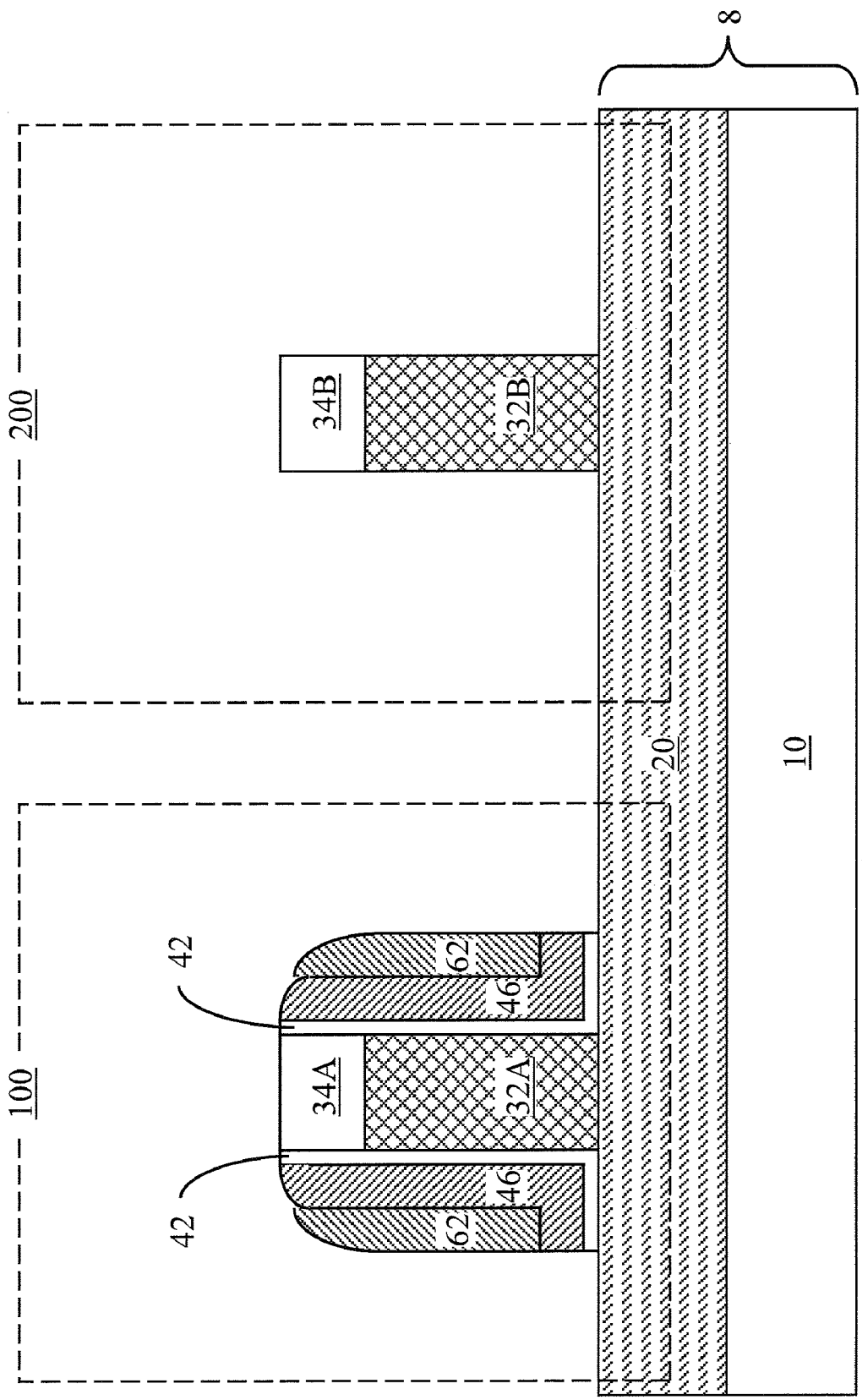
FIGS. 22A-27B are sequential views of a fourth exemplary semiconductor structure according to a fourth embodiment of the present invention. Figures with the same numeric label correspond to the same stage of manufacturing. Suffix conventions are the same as in FIGS. 1A-9B.
Figure 22B:
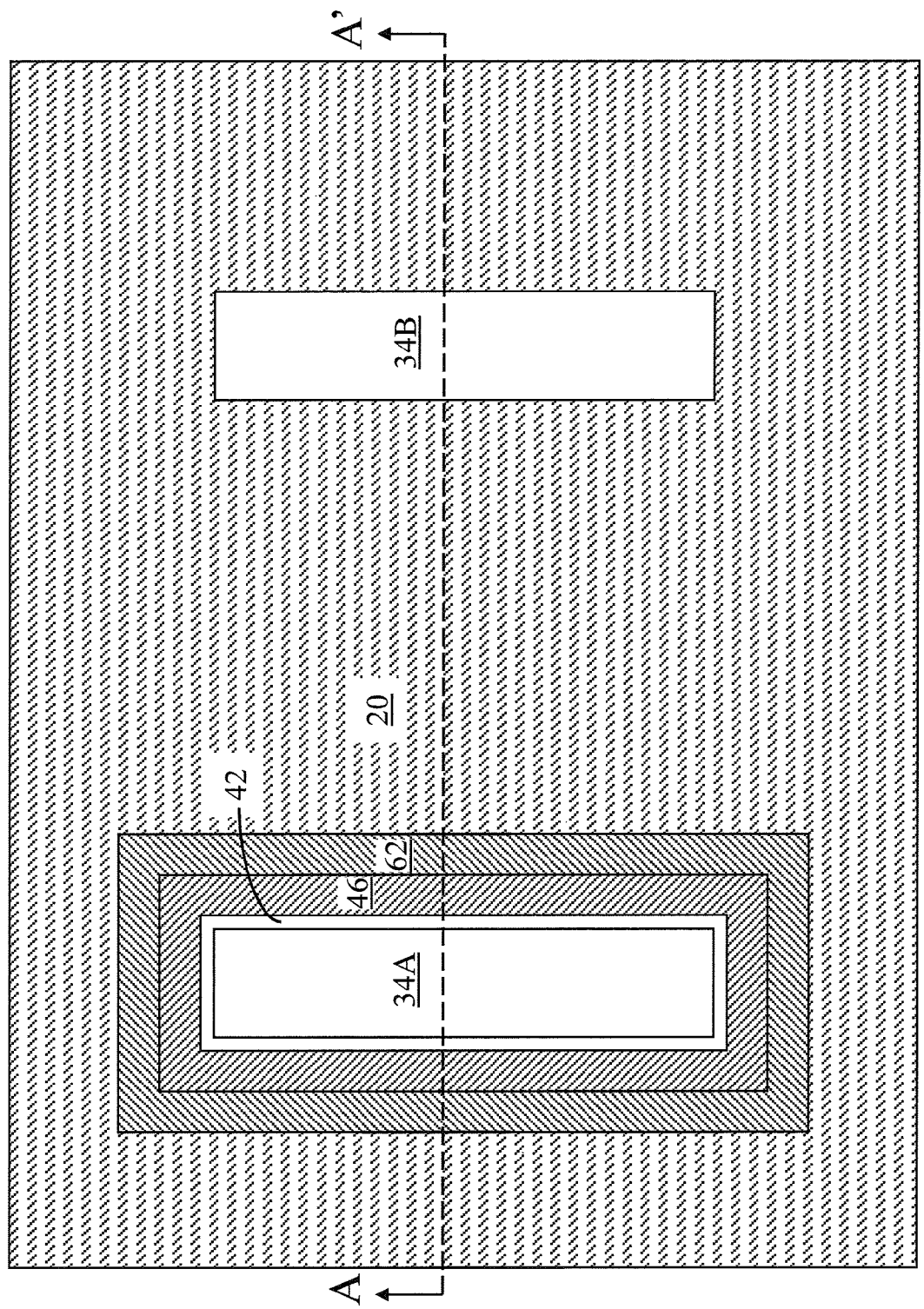

Referring to FIGS. 22A and 22B, a fourth exemplary semiconductor structure according to a fourth embodiment of the present invention is derived from the second semiconductor structure of FIGS. 12A and 12B by removing exposed portions of the first high-k gate dielectric layer 42 by an etch. The etch may be a substantially isotropic etch such as a chemical dry etch or a wet etch. Use of a reactive ion etch is also contemplated herein.

The etch forms a first high-k gate dielectric ring 42 from a remaining portion of the first high-k gate dielectric layer 41 in the first device region 100. The first high-k gate dielectric ring 42 laterally abuts sidewalls of the first semiconductor fin 32A and sidewalls of the first fin cap 34A. Further, the first gate dielectric ring 42 vertically abuts the insulator layer 20. The first gate dielectric ring 42 has an L-shaped vertical cross-sectional area, and has a shape that is topologically homeomorphic to a torus, i.e., forms a ring that encircles the first semiconductor fin 32A.

The first metal gate ring 46 laterally abuts outer sidewalls of one of the first high-k gate dielectric ring 42, vertically abuts a top surface of a laterally protruding bottom portion of the first high-k gate dielectric ring 42, has another L-shaped cross-sectional area, and has a shape that is topologically homeomorphic to a torus, i.e., forms another ring that encircles the first semiconductor fin 32A.

Figure 23A:
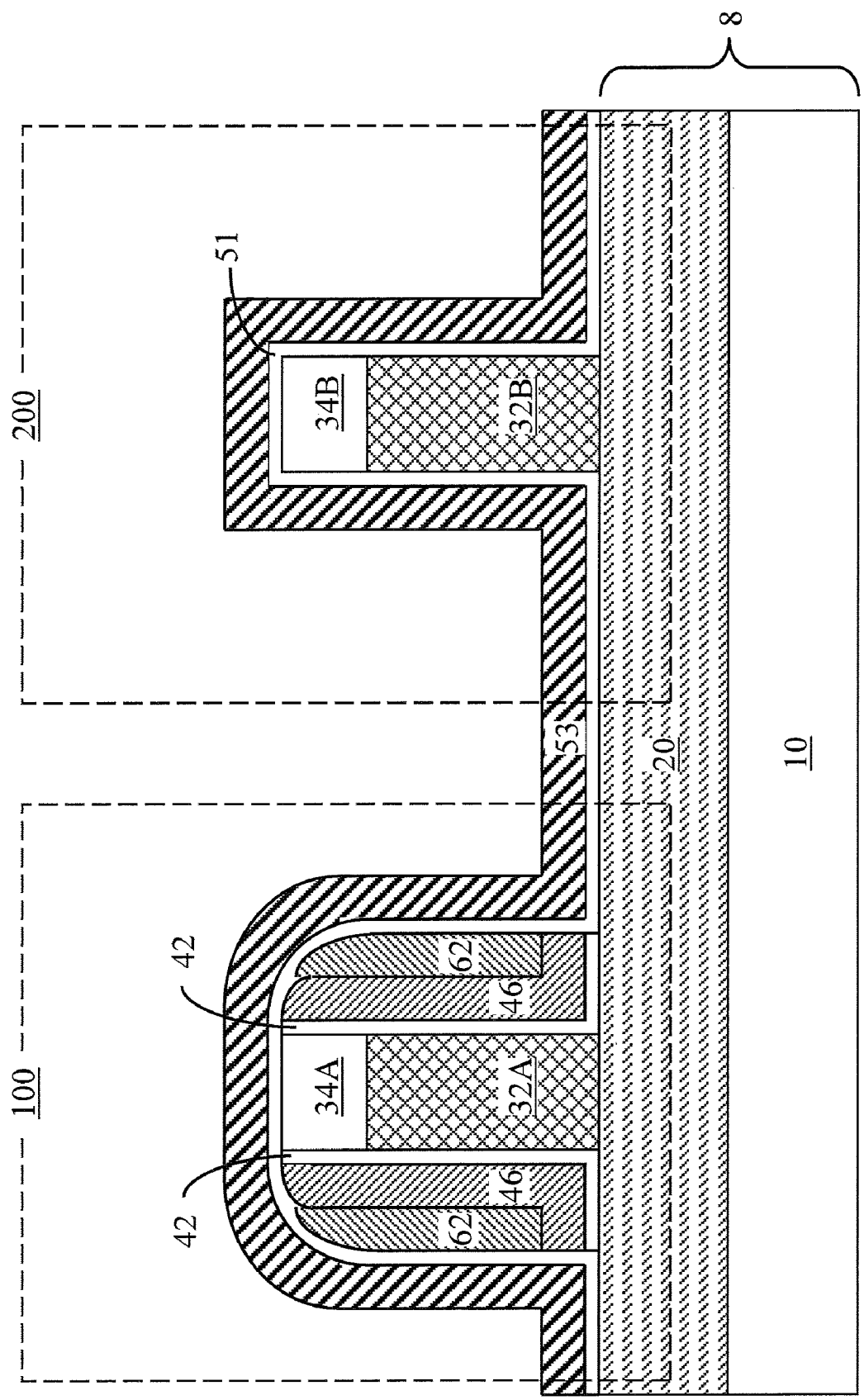
Figure 23B:
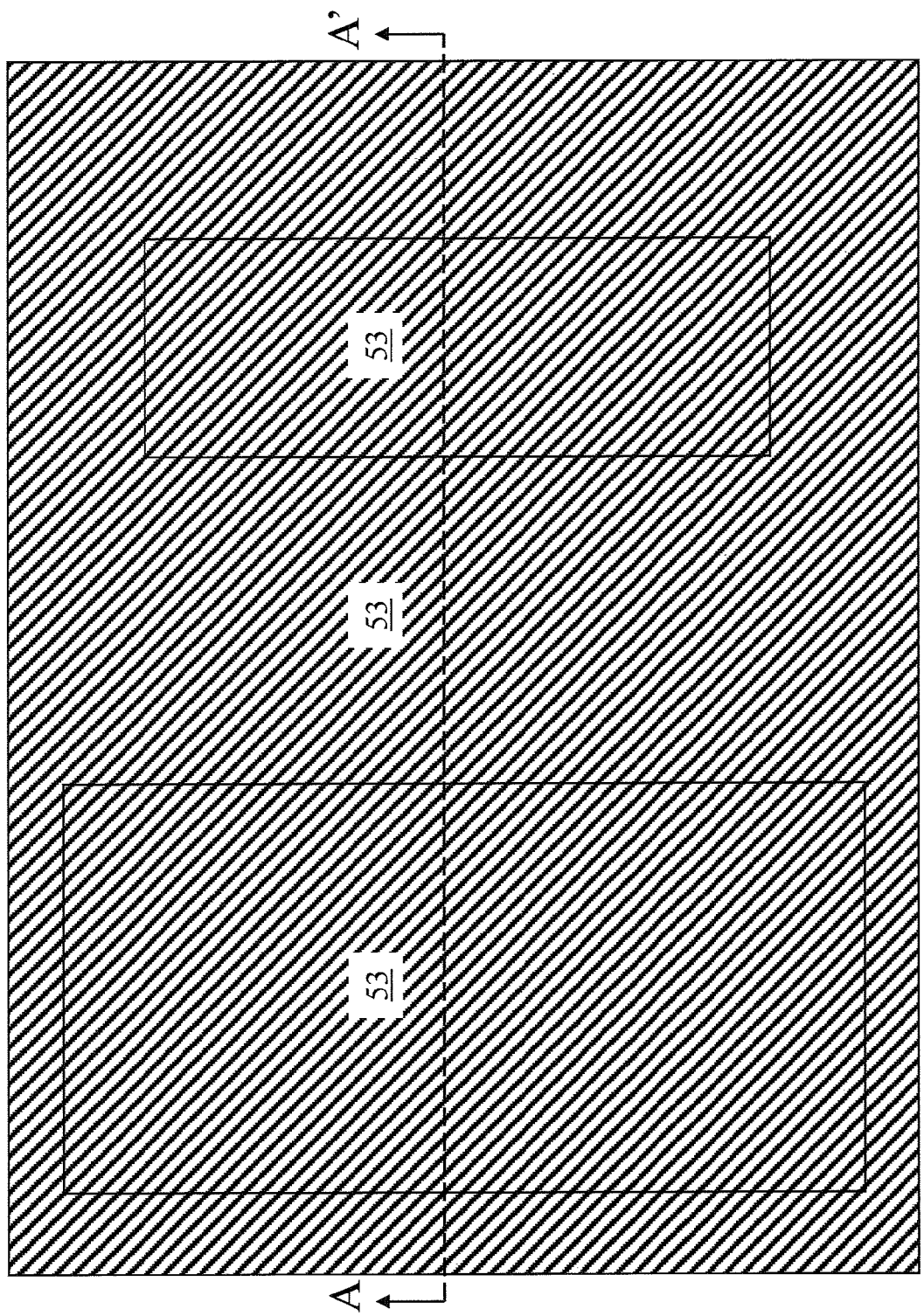

Referring to FIGS. 23A and 23B, a second high-k gate dielectric layer 51 is formed directly on sidewalls of the second semiconductor fin 32B, the second fin cap 34B, the first metal gate ring 46, the first fin spacer 62, a top surface of the first fin cap 34A, exposed portions of the first high-k gate dielectric ring 42, and the insulator layer 20. A second metal gate layer 53 is formed directly on the second high-k gate dielectric layer 51. The second high-k gate dielectric layer 51 and the second metal gate layer 53 have the same composition and thickness as in the first embodiment.

Figure 24A:
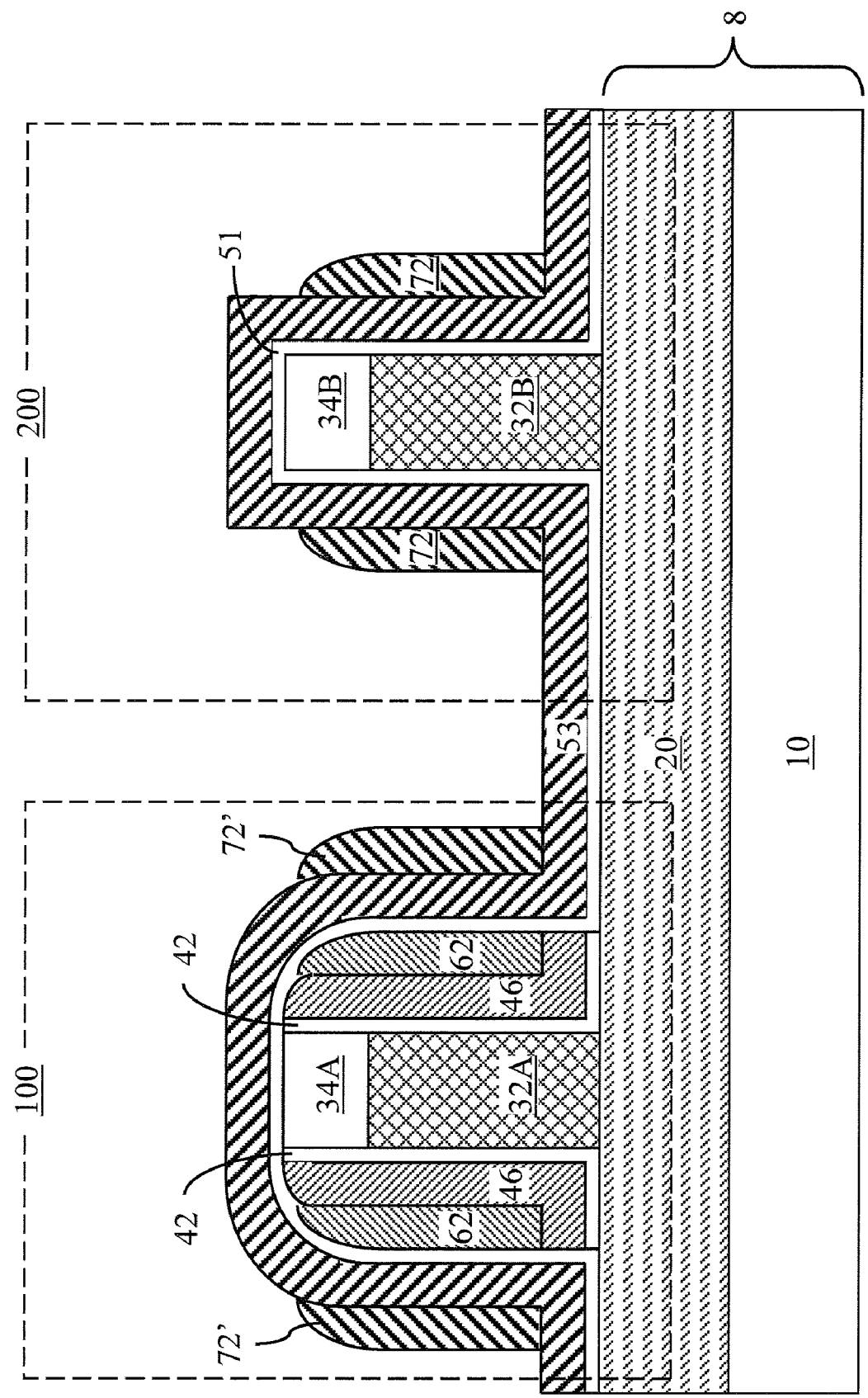
Figure 24B:
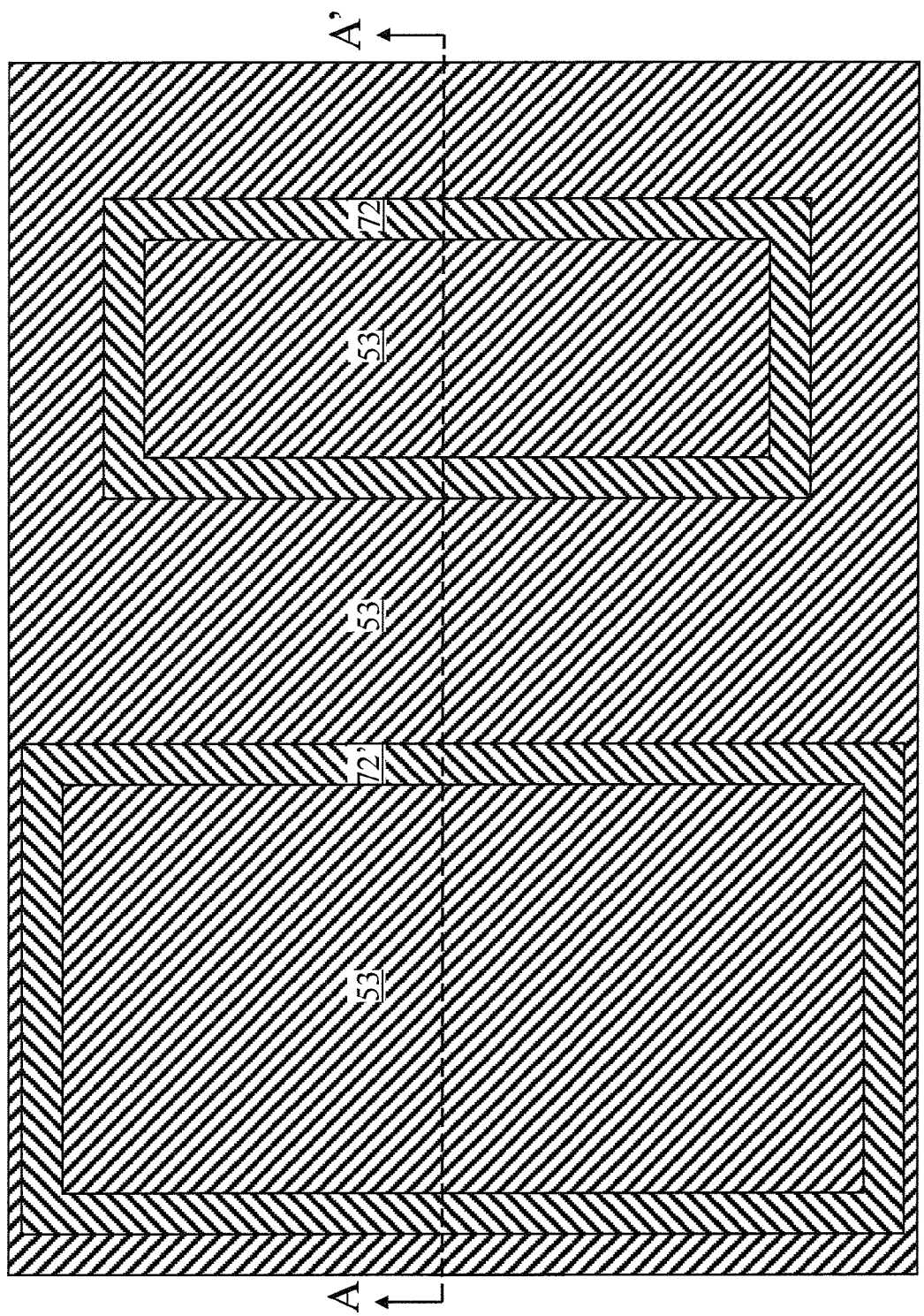

Referring to FIGS. 24A and 24B, a second fin spacer 72 is formed on outer sidewalls of the second metal gate layer 53 in the second device region 200, and another second fin spacer 72' is formed on outer sidewalls of the second metal gate layer 53 in the first device region 100 by a substantially conformal deposition of a layer followed by an anisotropic reactive ion etch. The second fin spacer 72 in the second device region 200 and the another second fin spacer 72' in the first device region 100 may comprise a conductive material, a semiconductor material, or a dielectric material as the first fin spacers 62 in the first embodiment. For example, the second fin spacers (72, 72') in the first and second device regions (100, 200) may comprise polysilicon, silicon oxide, or silicon nitride. Each of the second fin spacer 72 in the second device region 200 and the another second fin spacer 72' in the first device region 100 has a shape that is topologically homeomorphic to a torus, i.e., forms a ring that encircles one of the first semiconductor fin 32A and the second semiconductor fin 32B.

Figure 25A:
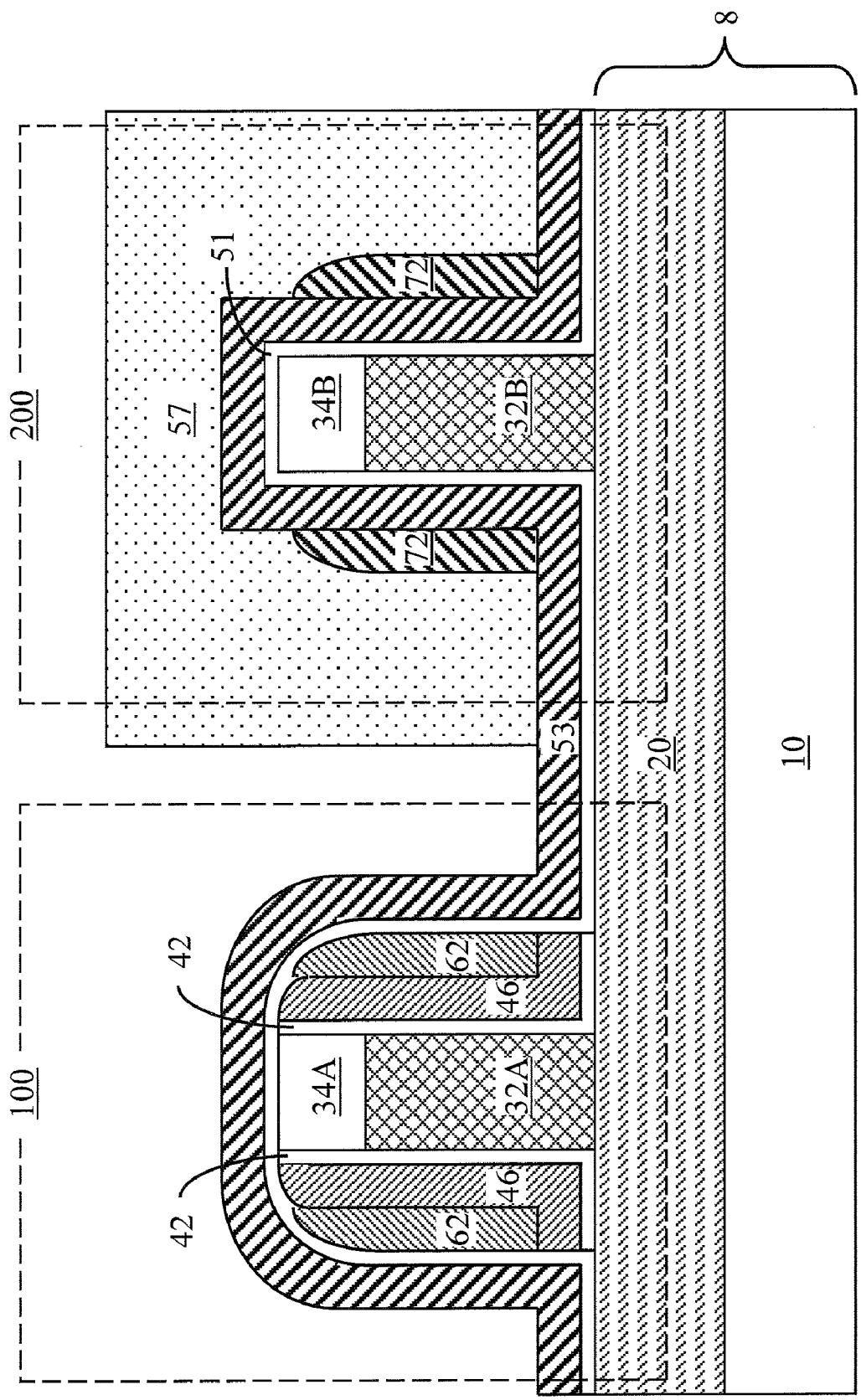
Figure 25B:
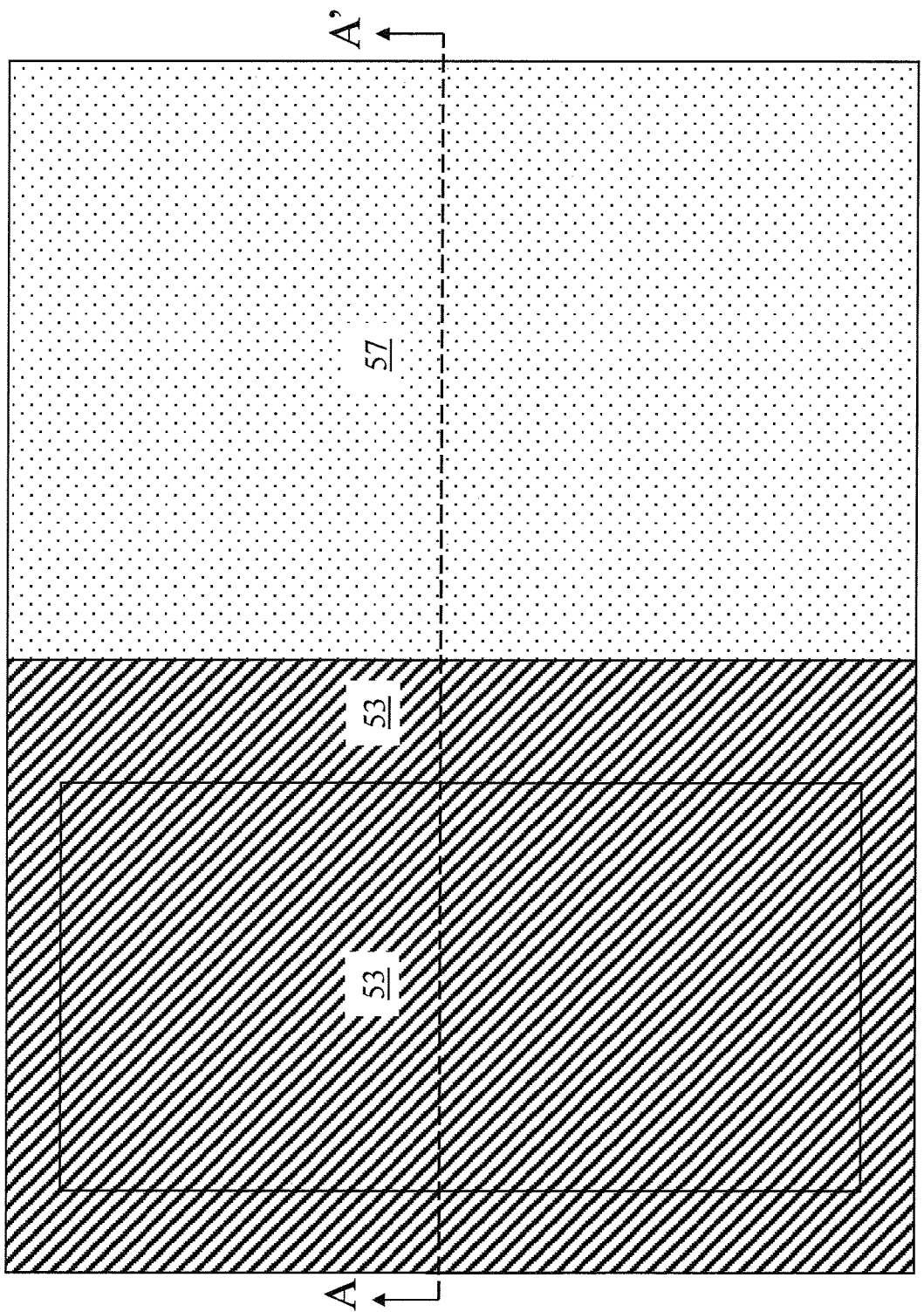

Referring to FIGS. 25A and 25B, a second photoresist 57 is applied and patterned to mask the second device region 200, while exposing the first device region 100 using lithographic techniques known in the art. The another second fin spacer 72' located in the first device region 100 is removed by an etch, which may be a substantially isotropic dry etch, wet etch, or a combination of both. Use of an anisotropic etch is also contemplated herein. The second photoresist 57 is subsequently removed.

Figure 26A:
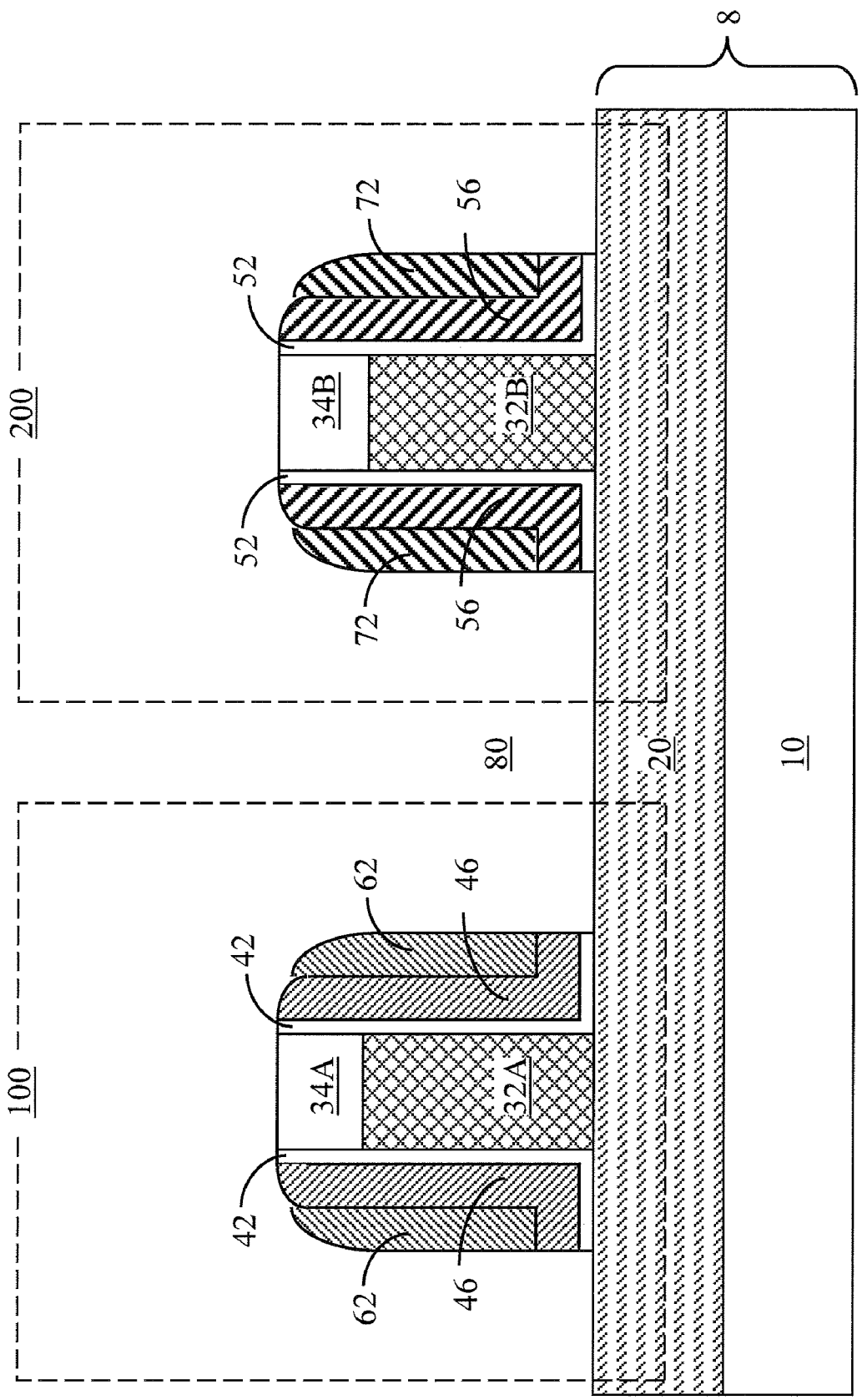
Figure 26B:
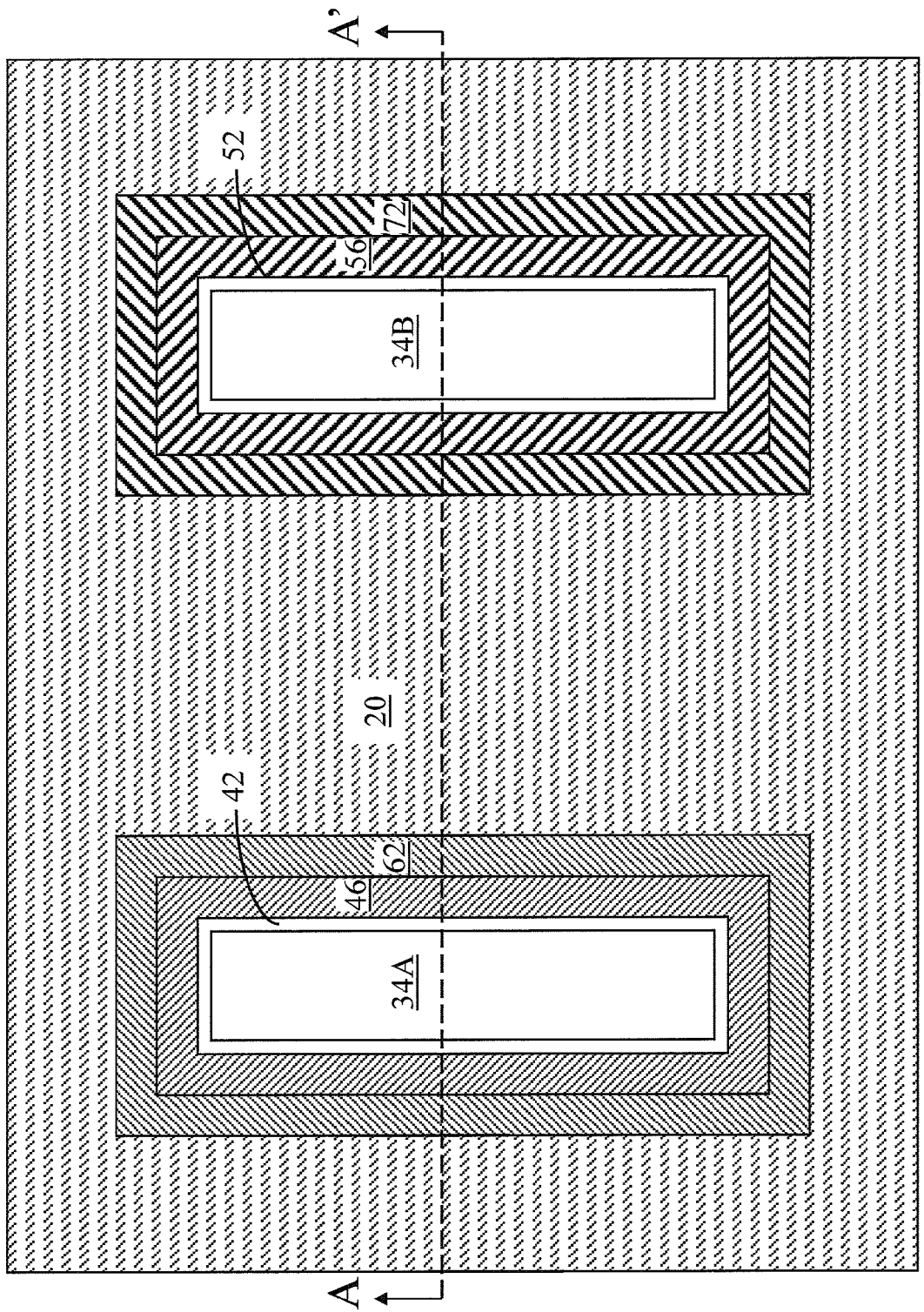

Referring to FIGS. 26A and 26B, exposed portions of the second metal gate layer 51 are removed by an etch. The etch may be a substantially isotropic etch such as a dry etch or a wet etch. The etch may, or may not, be selective to the second high-k gate dielectric layer 51. Use of an anisotropic reactive ion etch for removal of exposed portions of the second metal gate layer 51 is also contemplated herein. Exposed portions of the second high-k gate dielectric layer 51 is thereafter removed by another etch, which may be another substantially isotropic etch. Preferably, the etch employed to remove the second high-k gate dielectric layer 51 is selective to the underlying layers.

The two etches form a second high-k gate dielectric ring 52 from a remaining portion of the second high-k gate dielectric layer 51 in the second device region 200. The second high-k gate dielectric ring 52 laterally abuts sidewalls of the second semiconductor fin 32B and sidewalls of the second fin cap 34B. Further, the second gate dielectric ring 52 vertically abuts the insulator layer 20. The second gate dielectric ring 52 has an L-shaped vertical cross-sectional area, and has a shape that is topologically homeomorphic to a torus, i.e., forms a ring that encircles the second semiconductor fin 32B.

The second metal gate ring 56 laterally abuts outer sidewalls of the second high-k gate dielectric ring 52, vertically abuts a top surface of a laterally protruding bottom portion of the second high-k gate dielectric ring 52, has another L-shaped cross-sectional area, and has a shape that is topologically homeomorphic to a torus, i.e., forms another ring that encircles the second semiconductor fin 32B.

Figure 27A:
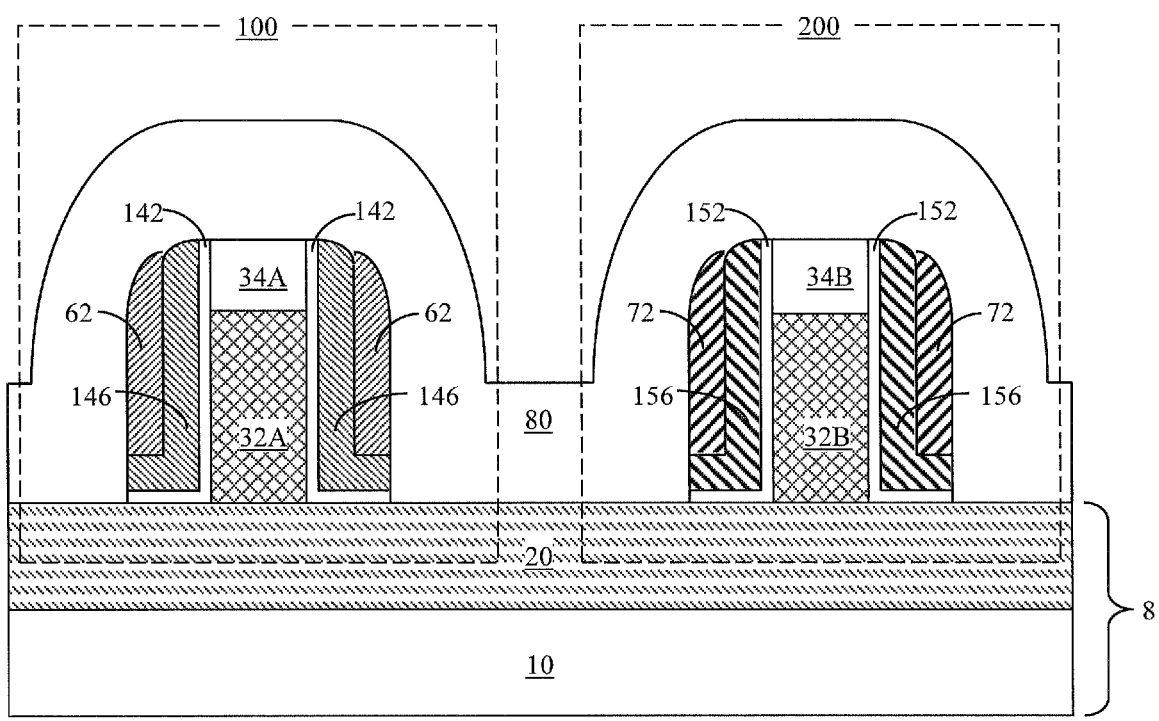
Figure 27B:
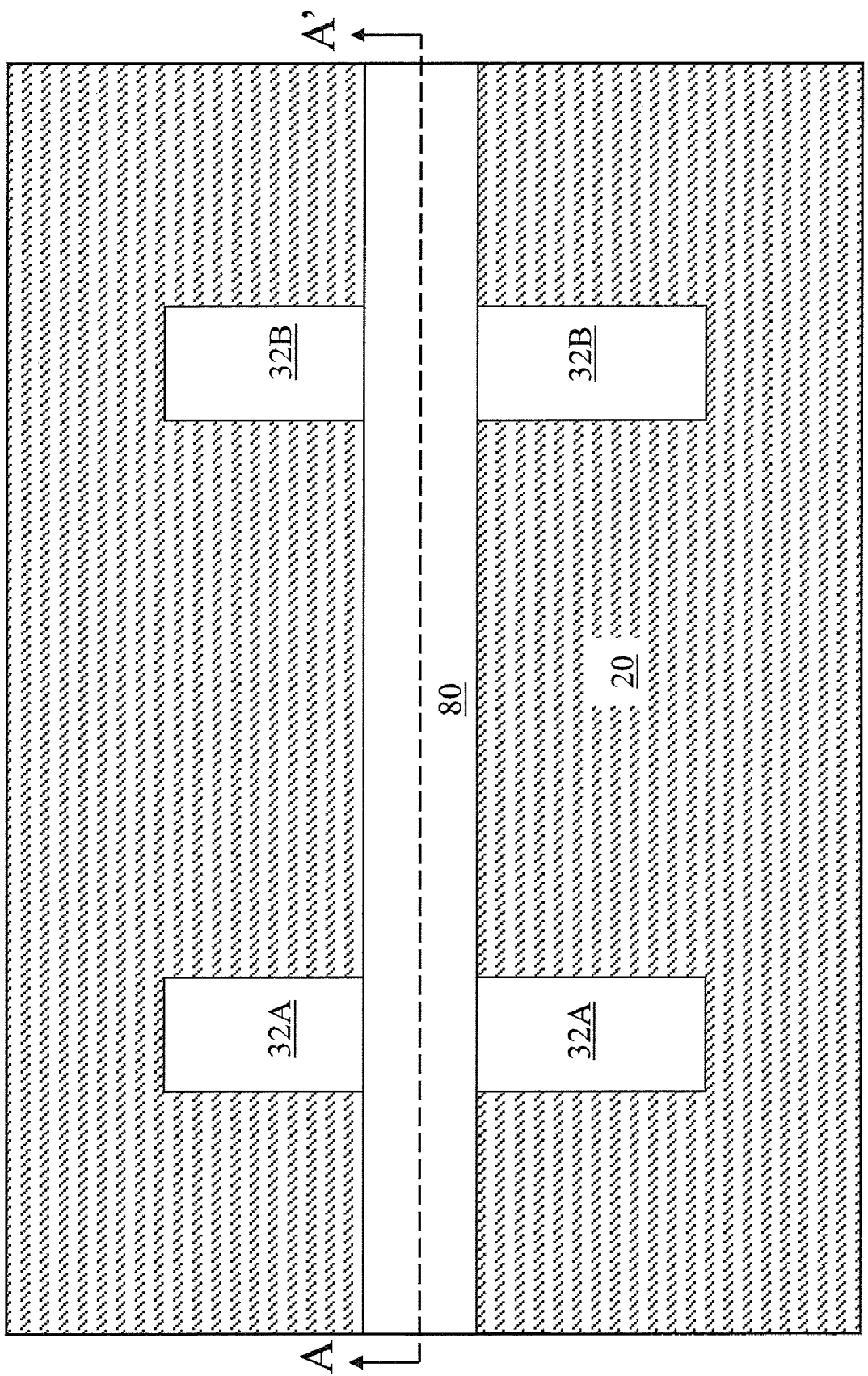

Referring to FIGS. 27A and 27B, a silicon containing layer (not shown) is deposited and lithographically patterned as in the first embodiment to form a silicon containing gate line 80. The composition of the silicon containing layer and the silicon containing gate line 80 may be the same as in the first embodiment. The silicon containing gate line 80 intersects the first and second semiconductor fins (32A, 32B) in a top-down view as in the first embodiment. Exposed portions of the first fin spacer 62, the second fin spacer 72, the first metal gate ring 46 (See FIG. 26A), the second metal gate ring 56 (See FIG. 26A), the first high-k gate dielectric ring 42 (See FIG. 26A), and the second high-k gate dielectric ring 52 (See FIG. 26A) are removed from outside the area covered by the silicon containing gate line 80 in the top-down view as in the first embodiment.

Two remaining disjoined portions of the first metal gate ring 46 constitute a first metal gate 146, which has an L-shaped vertical cross-sectional area. Likewise, two remaining disjoined portions of the second metal gate ring 56 constitute a second metal gate 156, which has an L-shaped vertical cross-sectional area. A first high-k gate dielectric 142, and a second high-k gate dielectric 152 are formed as in the first embodiment. The rest of the processing sequence for forming a first finFET in the first device region 100 and a second finFET in the second device region 200 is the same as in the first embodiment. Preferably, the first finFET and the second finFET are of opposite conductivity types. The fourth exemplary semiconductor structure allows independent selection of the first high-k dielectric material and the second high-k dielectric material to optimized performance of the first and second finFETs. Also, the fourth exemplary semiconductor structure allows independent selection of the first conductive metallic material and the second conductive metallic material to optimized performance of the first and second finFETs. As in the first embodiment, the fourth exemplary further provides a gate wiring located between the first device region 100 and the second device region 200 and containing yet another portion of the silicon containing gate liner 80 which vertically abuts the insulator layer 20. High-k gate dielectric materials are not present in the gate wiring.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   providing a first semiconductor fin and a second semiconductor fin on a substrate;
   forming a first high-k gate dielectric layer surrounding and laterally abutting said first semiconductor fin;
   forming a first high-k gate dielectric ring surrounding and laterally abutting said first semiconductor fin and another first high-k gate dielectric ring surrounding and laterally abutting said second semiconductor fin;
   forming a first metal gate ring surrounding and laterally abutting said first high-k gate dielectric layer and forming another first metal gate ring surrounding and laterally abutting said another first high-k gate dielectric ring;

removing said another first high-k gate ring and said another first metal gate ring, while protecting said first high-k gate dielectric ring and said first metal gate ring with a block mask;

forming a second metal gate layer on said first semiconductor fin and said second semiconductor fin; and forming a silicon containing layer directly on a portion of said second metal gate layer.

2. The method of claim 1, further comprising:

patterning said silicon containing layer so that a remaining portion of said silicon containing layer intersects said first and second semiconductor fins in a top-down view; and removing exposed portions of said second metal gate layer, said first high-k gate dielectric layer, and said first metal gate ring from outside the area covered by said remaining portion of said silicon containing layer.

3. The method of claim 2, further comprising forming a first metal gate comprising two remaining disjoined portions of said first metal gate ring underneath said remaining portion of said silicon containing layer, wherein a portion of said patterned silicon containing layer, a portion of said second metal gate layer, and said first metal gate collectively constitute a first gate electrode controlling a current flow in said first semiconductor fin, and wherein another portion of said patterned silicon containing layer and another portion of said second metal gate layer collectively constitute a second gate electrode controlling a current flow in said second semiconductor fin.

4. The method of claim 2, further comprising:

forming a first metal gate comprising two remaining disjoined portions of said first metal gate ring underneath said remaining portion of said silicon containing layer, wherein a portion of said patterned silicon containing layer and said first metal gate collectively constitute a first gate electrode controlling a current flow in said first semiconductor fin; and forming a second metal gate comprising two remaining disjoined portions of said second metal gate layer underneath said remaining portion of said silicon containing layer, wherein another portion of said patterned silicon containing layer and said second metal gate collectively constitute a second gate electrode controlling a current flow in said second semiconductor fin.

5. A method of forming a semiconductor structure comprising:

providing a first semiconductor fin and a second semiconductor fin on a substrate;

forming a first high-k gate dielectric layer surrounding and laterally abutting said first semiconductor fin;

forming a first metal gate ring surrounding and laterally abutting said first high-k gate dielectric layer;

forming a second metal gate layer on said first semiconductor fin and said second semiconductor fin;

forming a silicon containing layer directly on a portion of said second metal gate layer; and forming a second high-k gate dielectric layer directly on said second semiconductor fin and directly on said first metal gate prior to said forming of said second metal gate layer, wherein said second metal gate layer is formed directly on said second high-k gate dielectric layer.

6. The method of claim 5, further comprising:

forming a second high-k gate dielectric ring surrounding and laterally abutting said second semiconductor fin; and forming a second metal gate ring surrounding and laterally abutting said second high-k gate dielectric ring.

7. The method of claim 6, further comprising:

forming another second high-k gate dielectric ring surrounding and laterally abutting said first metal gate ring; and forming another second metal gate ring surrounding and laterally abutting said another second high-k gate dielectric ring;

removing said another second high-k gate ring and said another second metal gate ring, while protecting said second high-k gate dielectric ring and said second metal gate ring with a block mask.

8. The method of claim 1, further comprising:

forming a first metal gate layer directly on said first high-k gate dielectric layer; and etching said first high-k gate dielectric layer and forming a first high-k gate dielectric ring.

9. The method of claim 8, further comprising:

forming a first fin spacer surrounding and laterally abutting a portion of said first metal gate layer on said first semiconductor fin and another first fin spacer surrounding and laterally abutting another portion of said first metal gate layer on said second semiconductor fin prior to said forming a first metal gate ring; and removing said another fin spacer prior to said forming of said second metal gate layer.

10. The method of claim 8, further comprising:

forming a first fin spacer surrounding and laterally abutting a portion of said first metal gate layer on said first semiconductor fin and another first fin spacer surrounding and laterally abutting another portion of said first metal gate layer on said second semiconductor fin prior to said forming a first metal gate ring;

forming a second fin spacer surrounding and laterally abutting a portion of said second metal gate layer on said second semiconductor fin and another second fin spacer surrounding and laterally abutting another portion of said second metal gate layer on said first semiconductor fin after said forming of said second metal gate layer; and removing said another second fin spacer, while protecting said second fin spacer with a block mask.

11. The method of claim 8, wherein said first high-k gate dielectric ring has an L-shaped vertical cross-sectional area and has a shape that is topologically homeomorphic to a torus.

12. The method of claim 8, wherein said substrate comprises an insulator layer vertically abutting said first semiconductor fin and said second semiconductor fin, and wherein said first metal gate ring laterally abuts outer sidewalls of said first high-k gate dielectric ring, vertically abuts a top surface of a laterally protruding bottom portion of said first high-k gate dielectric ring, and has a shape that is topologically homeomorphic to a torus.

* * * * *